(12) United States Patent
Ode

(10) Patent No.: US 11,145,590 B2
(45) Date of Patent: Oct. 12, 2021

(54) SEMICONDUCTOR MEMORY DEVICE AND METHOD OF MANUFACTURING THE SAME

(71) Applicant: Kioxia Corporation, Tokyo (JP)

(72) Inventor: Hiroyuki Ode, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 16/810,010

(22) Filed: Mar. 5, 2020

(65) Prior Publication Data
US 2021/0043559 A1 Feb. 11, 2021

(30) Foreign Application Priority Data
Aug. 6, 2019 (JP) .............................. JP2019-144870

(51) Int. Cl.
| | |
|---|---|
| *H01L 23/522* | (2006.01) |
| *H01L 23/532* | (2006.01) |
| *H01L 25/065* | (2006.01) |
| *H01L 45/00* | (2006.01) |
| *H01L 27/24* | (2006.01) |
| *H01L 23/00* | (2006.01) |

(52) U.S. Cl.
CPC .... *H01L 23/5221* (2013.01); *H01L 23/53295* (2013.01); *H01L 24/45* (2013.01); *H01L 25/0655* (2013.01); *H01L 27/2481* (2013.01); *H01L 45/141* (2013.01); *H01L 45/16* (2013.01)

(58) Field of Classification Search
CPC . H01L 45/145–147; H01L 45/16–1691; G11C 11/5685; G11C 13/0007

USPC ......................................................... 257/773
See application file for complete search history.

(56) References Cited

U.S. PATENT DOCUMENTS

| | | | |
|---|---|---|---|
| 8,753,973 B2 | 6/2014 | Furuhashi | |
| 2003/0204832 A1 | 10/2003 | Matumoto | |
| 2008/0310211 A1* | 12/2008 | Toda | ..................... G11C 13/004 365/148 |
| 2017/0294377 A1 | 10/2017 | Dunga | |
| 2019/0140022 A1* | 5/2019 | Jeong | ....................... H01L 45/04 |
| 2019/0172502 A1* | 6/2019 | Jeong | ................... H01L 27/2427 |

FOREIGN PATENT DOCUMENTS

| | | |
|---|---|---|
| JP | H06-216249 A | 8/1994 |
| JP | 2003-324149 A | 11/2003 |
| JP | 2004-363118 A | 12/2004 |
| JP | 2011-18838 A | 1/2011 |

* cited by examiner

*Primary Examiner* — Jonathan Han
(74) *Attorney, Agent, or Firm* — Foley & Lardner LLP

(57) ABSTRACT

According to one embodiment, a semiconductor memory device includes: a substrate including a first area, a second area, and a third area, the second and the third areas being adjacent to the first area; a first insulating layer disposed in the first to the third areas; a first wiring disposed on a surface of the first insulating layer in the first area; a first memory cell disposed on the first wiring; a second wiring disposed on the first memory cell; and a contact connected to the second wiring in the second area. The surface of the first insulating layer includes: first surfaces disposed in at least one of the second area and the third area and arranged in the first direction; and second surfaces disposed between the first surfaces. The second surfaces are close to or far from the substrate compared with the first surfaces.

17 Claims, 86 Drawing Sheets

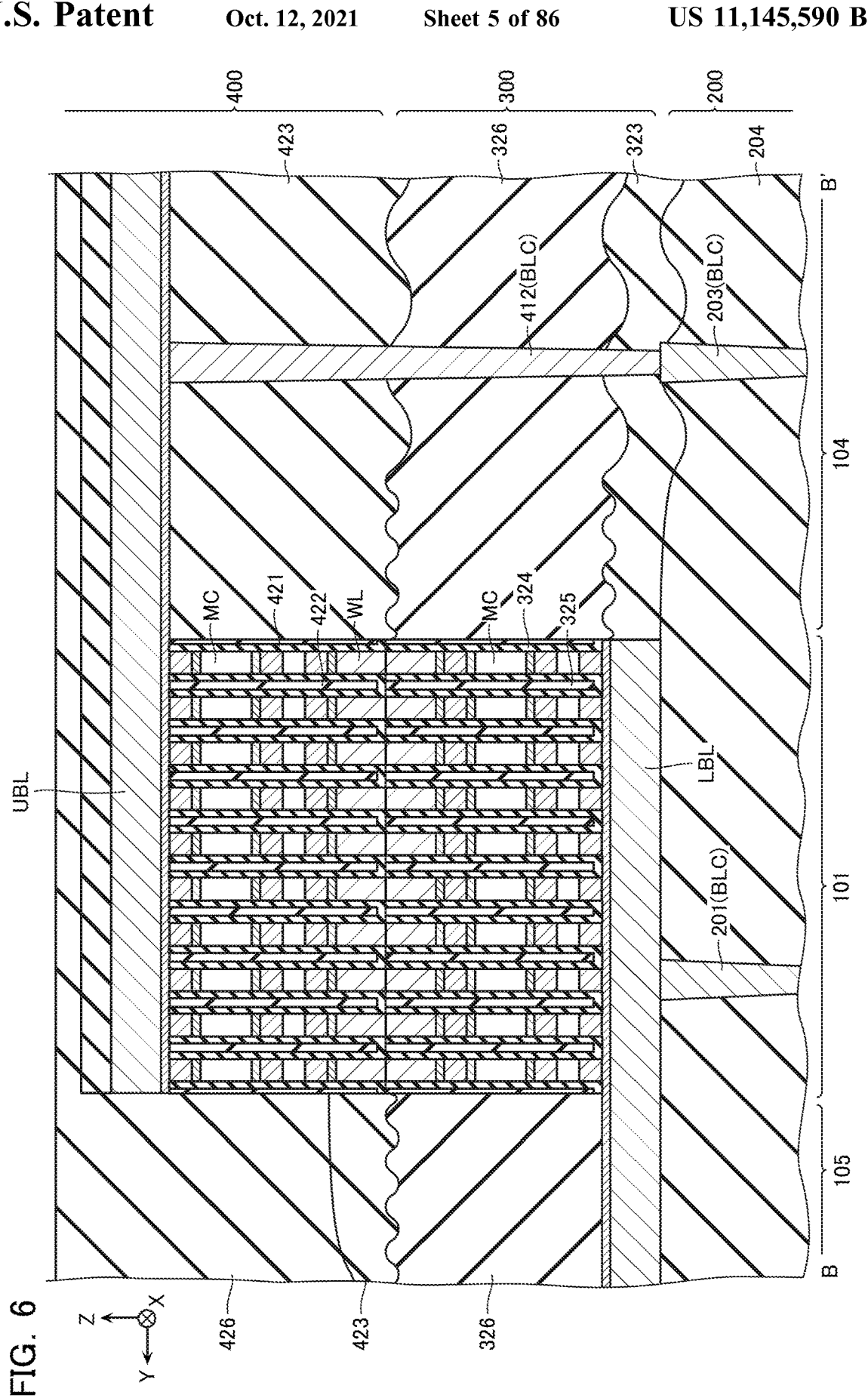

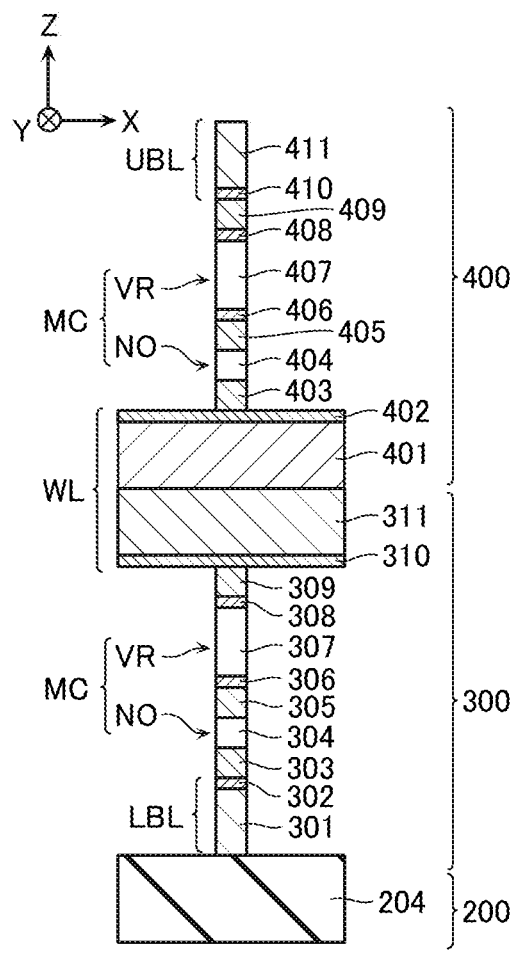
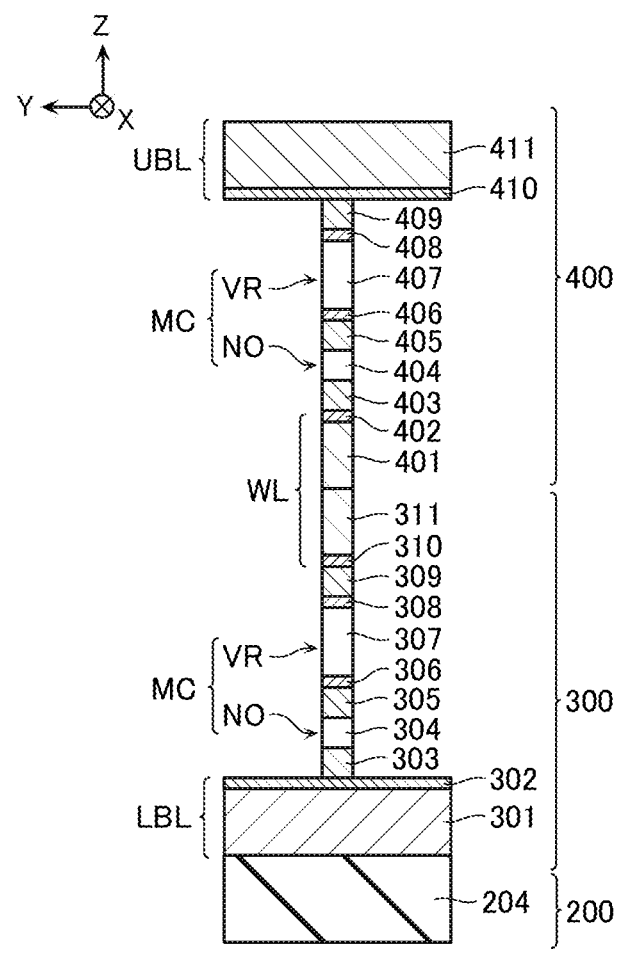

SEMICONDUCTOR MEMORY DEVICE AND METHOD OF MANUFACTURING THE SAME

CROSS-REFERENCE TO RELATED APPLICATIONS

This application is based upon and claims the benefit of Japanese Patent Application No. 2019-144870, filed on Aug. 6, 2019, the entire contents of which are incorporated herein by reference.

BACKGROUND

Field

Embodiments described herein relate generally to a semiconductor memory device and a method of manufacturing the same.

Description of the Related Art

There has been known a semiconductor memory device that includes first wirings, memory cells disposed on the first wirings, and second wirings connected to the memory cells.

BRIEF DESCRIPTION OF THE DRAWINGS

FIG. 6 is a schematic cross-sectional view taking the structure illustrated in FIG. 4 along the line B-B" and viewed in the arrow direction;

FIGS. 7A and 7B are schematic cross-sectional views corresponding to a part of FIG. 5 and FIG. 6;

DETAILED DESCRIPTION

Figure 1:
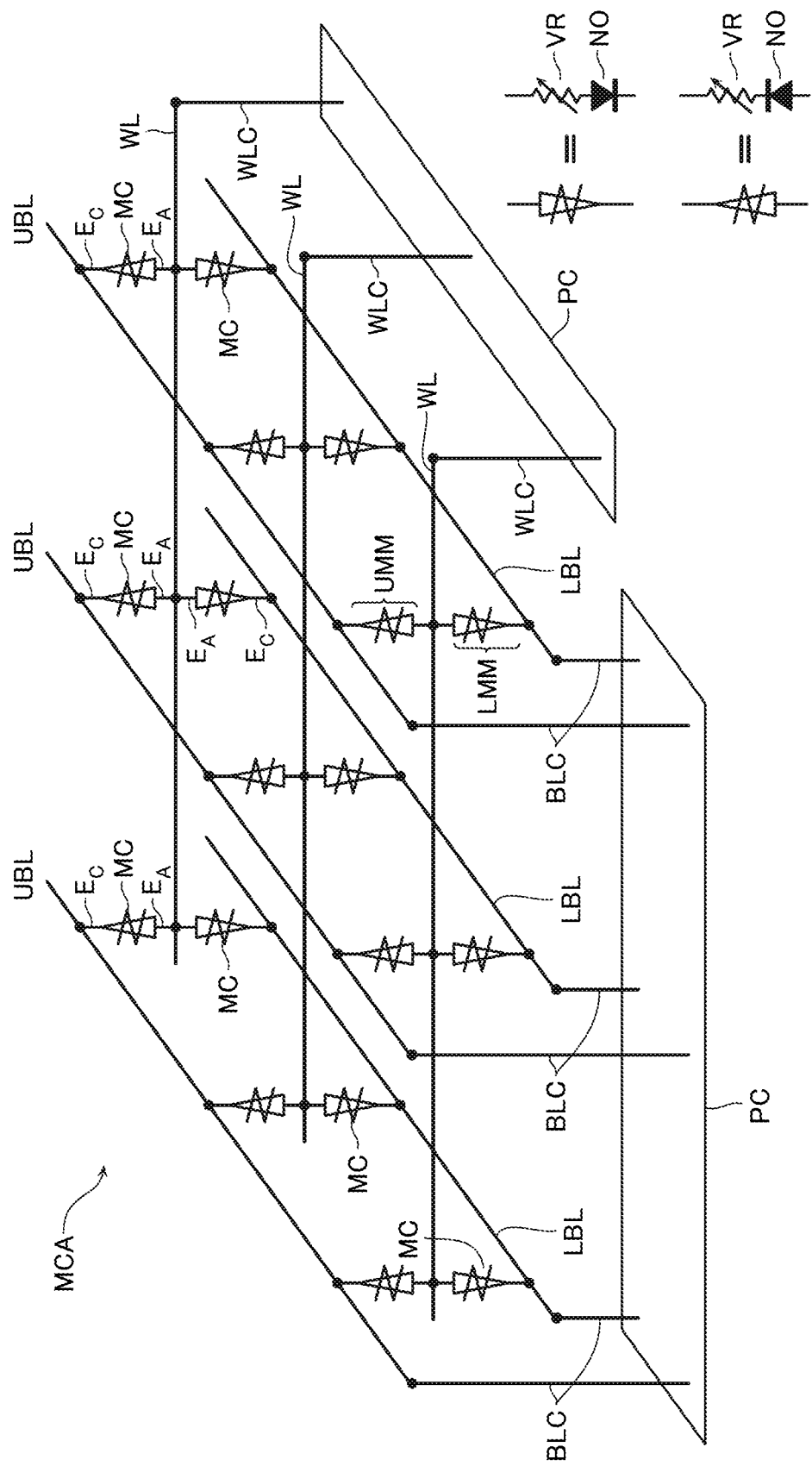
FIG. 1 is a schematic circuit diagram illustrating a configuration of a part of a semiconductor memory device according to a first embodiment.

A semiconductor memory device according to one embodiment includes a substrate, a first insulating layer, a first wiring, a first memory cell, a second wiring, and a contact. The substrate includes a first area, a second area, and a third area. The second area is adjacent to the first area in a first direction. The third area is adjacent to the first area in the first direction. The first insulating layer is disposed in the first area, the second area, and the third area. The first wiring is disposed on a surface of the first insulating layer in the first area. The first memory cell is disposed on the first wiring. The second wiring is disposed on the first memory cell and extends in the first direction. The contact is connected to the second wiring in the second area and extends in a second direction intersecting with the substrate. The surface of the first insulating layer includes: a plurality of first surfaces that are disposed in at least one of the second area and the third area and arranged in the first direction; and a plurality of second surfaces disposed between the plurality of first surfaces. The plurality of second surfaces are close to the substrate compared with the plurality of first surfaces or far from the substrate compared with the plurality of first surfaces.

A method of manufacturing semiconductor memory device according to one embodiment includes: forming a first insulating layer above a substrate including a first area, a second area, and a third area, the second area being adjacent to the first area in a first direction, the third area being adjacent to the first area in the first direction; forming a laminated body including a first conducting layer, a variable resistance layer, and a first electrode layer on a surface of the first insulating layer; dividing the laminated body in the first direction such that at least apart of the first conducting layer, the variable resistance layer, and the first electrode layer remain in the first area, the second area, and the third area; forming a second insulating layer in the first area, the second area, and the third area; removing a part of the second insulating layer by flattening process; protecting the first conducting layer, the variable resistance layer, the first electrode layer, and the second insulating layer formed in the first area, while removing the first conducting layer, the variable resistance layer, the first electrode layer, and the second insulating layer formed in the second area and the third area; forming a third insulating layer in the second area and the third area; and forming a second conducting layer on the first electrode layer.

Next, semiconductor memory devices according to embodiments will be described in detail with reference to the drawings. The following embodiments are merely examples, and will not be described for the purpose of limiting the present invention.

In this specification, a predetermined direction parallel to a surface of a substrate is referred to as an X direction, a direction parallel to the surface of the substrate and perpendicular to the X direction is referred to as a Y direction, and a direction perpendicular to the surface of the substrate is referred to as a Z direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may correspond to any of the X direction, the Y direction, and the Z direction or need not to correspond to these directions.

Expressions such as "above" and "below" in this specification are based on the substrate. For example, when the first direction intersects with the surface of the substrate, a direction away from the substrate along the first direction is referred to as above and a direction approaching the substrate along the first direction is referred to as below. A lower surface and a lower end of a certain configuration mean a surface and an end portion on the substrate side of this configuration. A top surface and an upper end of a certain configuration mean a surface and an end portion on a side, opposite to the substrate, of this configuration. A surface intersecting with the second direction or the third direction is referred to as a side surface or the like.

With reference to the drawings, circuit configurations of the semiconductor memory devices according to the embodiments will be described below. The following drawings are schematic, and for convenience of explanation, a part of a configuration is sometimes omitted.

First Embodiment

Figure 2:
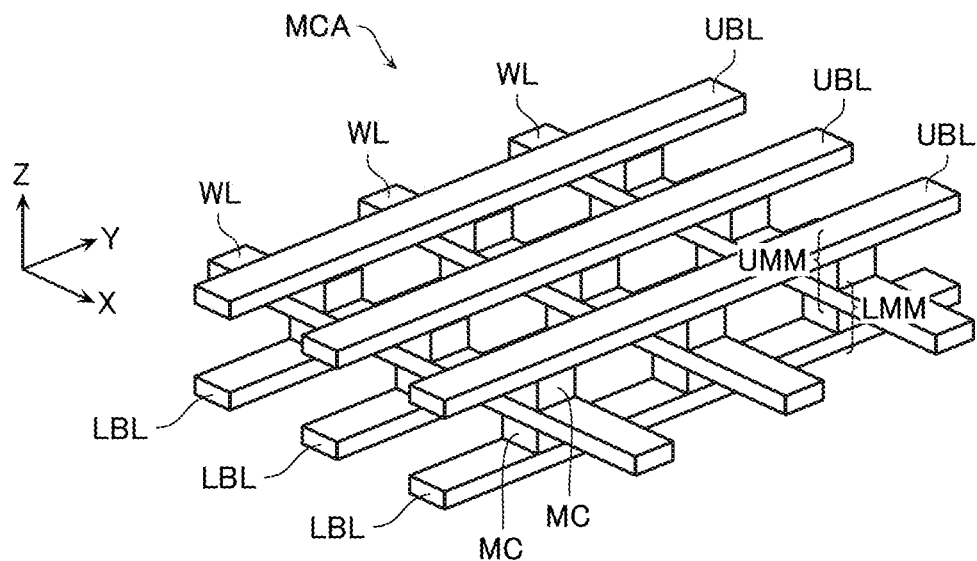
FIG. 2 is a schematic perspective view illustrating a configuration of a part of the semiconductor memory device.

First, a semiconductor memory device according to the first embodiment will be briefly described with reference to FIG. 1 and FIG. 2. FIG. 1 is a schematic circuit diagram illustrating a configuration of a part of the semiconductor memory device. FIG. 2 is a schematic perspective view illustrating a configuration of a part of the semiconductor memory device.

The semiconductor memory device according to the embodiment includes memory cell array MCA and a peripheral circuit PC controlling the memory cell array MCA.

As illustrated in FIG. 2, the memory cell array MCA includes, for example, a lower memory mat LMM and an upper memory mat UMM arranged in the Z direction. The lower memory mat LMM includes a plurality of lower bit lines LBL arranged in the X direction and extending in the Y direction, a plurality of word lines WL arranged in the Y direction and extending in the X direction, and a plurality of memory cells MC arranged in the X direction and the Y direction corresponding to the lower bit lines LBL and the word lines WL. The upper memory mat UMM includes a plurality of upper bit lines UBL arranged in the X direction and extending in the Y direction, the plurality of word lines WL arranged in the Y direction and extending in the X direction, and the plurality of memory cells MC arranged in the X direction and the Y direction corresponding to the upper bit lines UBL and the word lines WL. In the example illustrated in the drawing, the lower memory mat LMM and the upper memory mat UMM share the word lines WL. In the example of FIG. 1, a cathode $E_C$ of the memory cell MC is connected to the lower bit line LBL or the upper bit line UBL. Additionally, an anode $E_A$ of the memory cell MC is connected to the word line WL. The memory cell MC includes a variable resistance element VR and a nonlinear element NO.

The peripheral circuit PC is connected to the lower bit lines LBL and the upper bit lines UBL via bit line contacts BLC. The peripheral circuit PC includes, for example, a step down circuit that steps down, for example, a power supply voltage and outputs the power supply voltage to a voltage supply line, a selection circuit that electrically conducts the lower bit line LBL and the upper bit line UBL and the word line WL corresponding to a selected address and the corresponding voltage supply line, a sense amplifier circuit that outputs data of 0 or 1 according to a voltage or a current of the lower bit line LBL and the upper bit line UBL, and a sequencer that controls the circuits.

Next, with reference to FIG. 3 to FIG. 9, the configuration of the semiconductor memory device according to the embodiment will be described in more detail.

Figure 3:
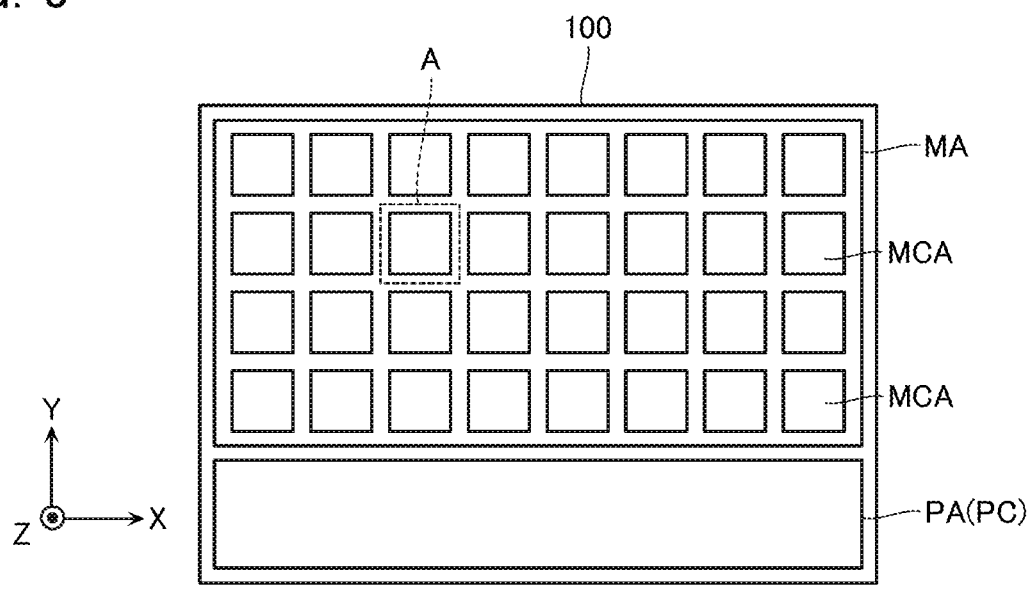
FIG. 3 is a schematic plan view illustrating a configuration of a part of the semiconductor memory device.

FIG. 3 is a schematic plan view illustrating the configuration of the semiconductor memory device according to the embodiment. The semiconductor memory device according to the embodiment includes a substrate 100. The substrate 100 includes a memory area MA and a peripheral area PA. The memory area MA includes the plurality of memory cell arrays MCA arranged in the X direction and the Y direction in a matrix. The peripheral circuit PC is disposed in the peripheral area PA.

Figure 4:
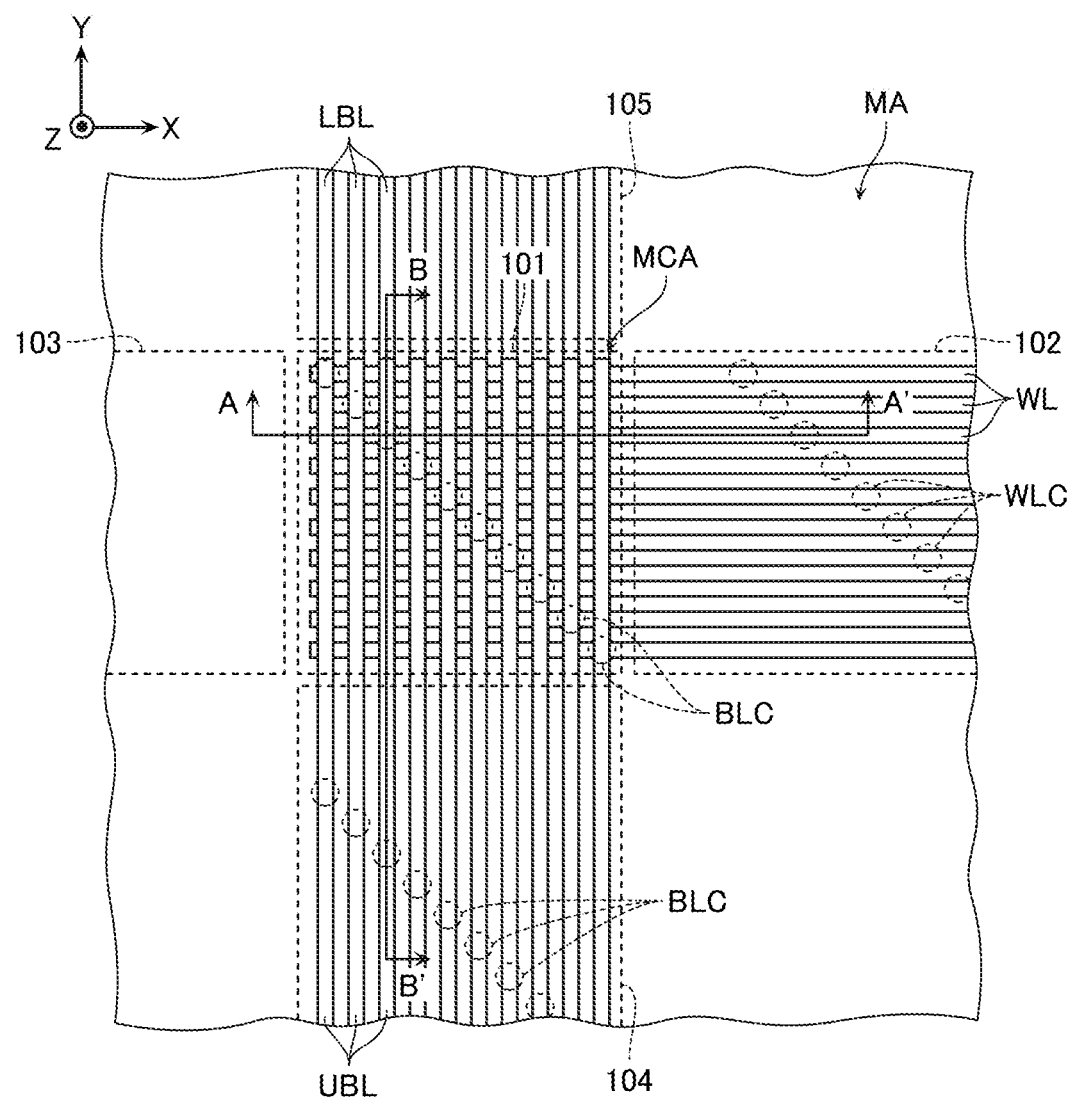
FIG. 4 is a schematic enlarged view of a part indicated by A in FIG. 3.

FIG. 4 is a schematic enlarged view of a part indicated by A in FIG. 3. The memory area MA includes an area 101 where the memory cell arrays MCA are disposed, an area 102 and an area 103 adjacent to the area 101 in the X direction, and an area 104 and an area 105 adjacent to the area 101 in the Y direction. The area 101 includes the memory cell arrays MCA and the bit line contacts BLC connected to the lower bit lines LBL. The area 102 includes a part of the word lines WL and word line contacts WLC connected to the word lines WL. The area 104 includes a part of the upper bit lines UBL and the bit line contacts BLC connected to the upper bit lines UBL. The area 105 includes a part of the lower bit lines LBL.

Figure 5:
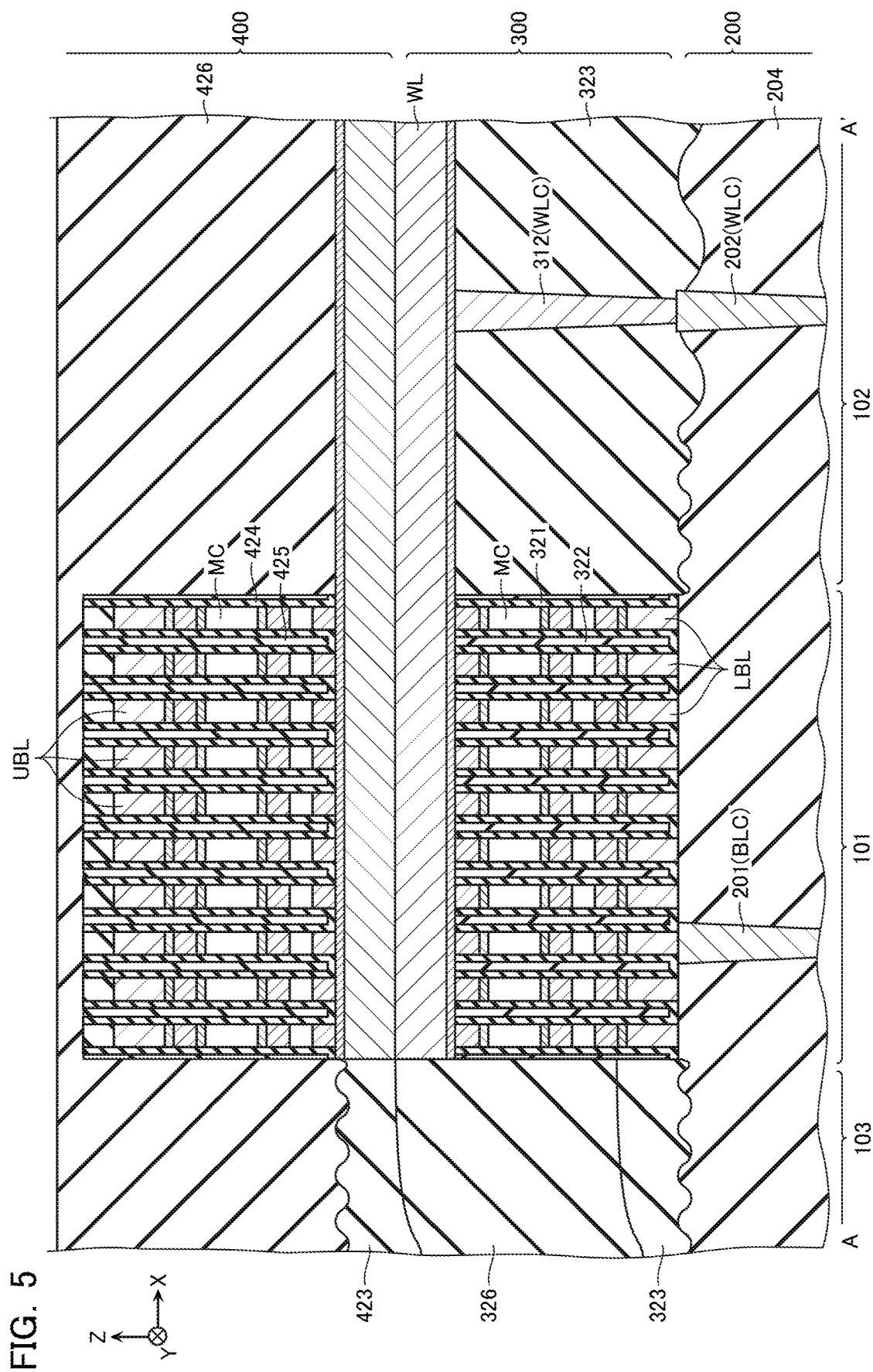
FIG. 5 is a schematic cross-sectional view taking the structure illustrated in FIG. 4 along the line A-A" and viewed in the arrow direction.

FIG. 5 is a schematic cross-sectional view taking the structure illustrated in FIG. 4 along the line A-A" and viewed in the arrow direction. FIG. 6 is a schematic cross-sectional view taking the structure illustrated in FIG. 4 along the line B-B' and viewed in the arrow direction. FIGS. 7A and 7B are schematic cross-sectional views corresponding to a part of FIG. 5 and FIG. 6.

As illustrated in FIG. 5, the semiconductor memory device according to the embodiment includes a wiring layer 200, a memory layer 300 disposed on the wiring layer 200, and a memory layer 400 disposed on the memory layer 300.

The wiring layer 200 includes a contact wiring 201, a contact wiring 202, a contact wiring 203 (FIG. 6), and an insulating layer 204 disposed between the wirings.

The contact wiring 201 (FIG. 5) extends in the Z direction and functions as the bit line contact BLC connected to the lower bit line LBL. The contact wiring 201 includes, for example, a laminated film of titanium nitride (TiN) and tungsten (W).

The contact wiring 202 extends in the Z direction and functions as a part of the word line contact WLC connected to the word line WL. The contact wiring 202 includes, for example, a laminated film of titanium nitride (TiN) and tungsten (W).

The contact wiring 203 (FIG. 6) extends in the Z direction and functions as a part of the bit line contact BLC connected to the upper bit line UBL. The contact wiring 203 includes, for example, a laminated film of titanium nitride (TiN) and tungsten (W).

The insulating layer 204 contains, for example, silicon oxide ($SiO_2$).

For example, as illustrated in FIGS. 7A and 7B, the memory layer 300 in the area 101 includes a conducting layer 301, a barrier conducting layer 302, an electrode layer 303, a chalcogen layer 304, an electrode layer 305, a barrier conducting layer 306, a chalcogen layer 307, a barrier conducting layer 308, an electrode layer 309, a barrier conducting layer 310, and a conducting layer 311. For example, as illustrated in FIG. 5, the memory layer 300 includes a contact wiring 312.

For example, as illustrated in FIGS. 7A and 7B, the conducting layer 301 is disposed on a top surface of the insulating layer 204. The conducting layer 301 extends in the Y direction and functions as a part of the lower bit line LBL. The conducting layer 301 contains, for example, tungsten (W).

The barrier conducting layer 302 is disposed on a top surface of the conducting layer 301. The barrier conducting layer 302 extends in the Y direction and functions as a part of the lower bit line LBL. The barrier conducting layer 302 contains, for example, tungsten nitride (WN).

The electrode layer 303 is disposed on a top surface of the barrier conducting layer 302. The electrode layer 303 functions as the cathode $E_C$ of the memory cell MC. The electrode layer 303 contains, for example, a carbon nitride (CN).

The chalcogen layer 304 is disposed on a top surface of the electrode layer 303. The chalcogen layer 304 functions as the nonlinear element NO. For example, in a case where a voltage lower than a predetermined threshold is applied to the chalcogen layer 304, the chalcogen layer 304 is in a high resistance state. When the voltage applied to the chalcogen layer 304 reaches the predetermined threshold, the chalcogen layer 304 enters a low resistance state and a current flowing through the chalcogen layer 304 increases by a plurality of digits. When the voltage applied to the chalcogen layer 304 falls below the predetermined voltage for a constant period, the chalcogen layer 304 enters the high resistance state again.

The chalcogen layer 304 contains, for example, at least one or more kinds of chalcogen. The chalcogen layer 304 may contain, for example, a chalcogenide, which is a compound containing a chalcogen. Additionally, the chalcogen layer 304 may contain at least one kind of element selected from the group consisting of B, Al, Ga, In, C, Si, Ge, Sn, As, P, and Sb.

Note that the chalcogen here means one other than oxygen (O) among elements belonging to Group 16 of the periodic table. The chalcogen contains, for example, sulfur (S), selenium (Se), and tellurium (Te).

The electrode layer 305 is disposed on a top surface of the chalcogen layer 304. The electrode layer 305 functions as an electrode connected to the variable resistance element VR and the nonlinear element NO. The electrode layer 305 contains, for example, carbon (C).

The barrier conducting layer 306 is disposed on a top surface of the electrode layer 305. The barrier conducting layer 306 contains, for example, tungsten nitride (WN).

The chalcogen layer 307 is disposed on a top surface of the barrier conducting layer 306. The chalcogen layer 307 functions as the variable resistance element VR. The chalcogen layer 307 includes, for example, a crystalline region and a phase change region. The phase change region is disposed on the cathode side compared with the crystalline region. By heating at a melting temperature or more and rapid cooling, the phase change region enters an amorphous state (reset state: high resistance state). Moreover, by heating at a temperature lower than a melting temperature and higher than a crystallization temperature and gentle cooling, the phase change region enters a crystalline state (set state: low resistance state).

The chalcogen layer 307 contains, for example, at least one or more kinds of chalcogen. The chalcogen layer 307 may contain, for example, a chalcogenide, which is a compound containing a chalcogen. The chalcogen layer 307 may be, for example, GeSbTe, GeTe, SbTe, and SiTe. The chalcogen layer 307 may contain at least one kind of element selected from germanium (Ge), antimony (Sb), and tellurium (Te).

The barrier conducting layer 308 is disposed on a top surface of the chalcogen layer 307. The barrier conducting layer 308 contains, for example, tungsten nitride (WN).

The electrode layer 309 is disposed on a top surface of the barrier conducting layer 308. The electrode layer 309 functions as the anode $E_A$ of the memory cell MC. The electrode layer 309 contains, for example, carbon (C).

The barrier conducting layer 310 is disposed on a top surface of the electrode layer 309. The barrier conducting layer 310 extends in the X direction and functions as a part of the word line WL. The barrier conducting layer 310 contains, for example, tungsten nitride (WN).

The conducting layer 311 is disposed on a top surface of the barrier conducting layer 310. The conducting layer 311 extends in the X direction and functions as a part of the word line WL. The conducting layer 311 contains, for example, tungsten (W).

For example, as illustrated in FIG. 5, the contact wiring 312 extends in the Z direction and is connected to a lower surface of the barrier conducting layer 310 and a top surface of the contact wiring 202. The contact wiring 312 functions as a part of the word line contact WLC connected to the word line WL. The contact wiring 312 contains, for example, tungsten (W).

Note that, for example, as illustrated in FIG. 5, on side surfaces in the X direction of the configurations of the memory layer 300 in the area 101, barrier insulating layers 321 and insulating layers 322 disposed between these configurations are disposed. Additionally, in the memory layer 300 in the area 102, an insulating layer 323 is disposed at a height position corresponding to the lower bit line LBL and the memory cell MC. In the memory layer 300 in the area 103, the insulating layer 323 is disposed at a height position corresponding to the lower bit line LBL and an insulating layer 326 is disposed at a height position corresponding to the memory cell MC and the word line WL. The barrier insulating layer 321 contains, for example, silicon nitride (SiN). The insulating layer 322, the insulating layer 323, and the insulating layer 326 contain, for example, silicon oxide (SiO$_2$).

For example, as illustrated in FIG. 6, on side surfaces in the Y direction of the configurations of the memory layer 300 in the area 101, barrier insulating layers 324 and insulating layers 325 disposed between these configurations are disposed. In the memory layer 300 in the area 104, the insulating layer 323 is disposed at a height position corresponding to the lower bit line LBL, and the insulating layer 326 is disposed at a height position corresponding to the memory cell MC and the word line WL. In the memory layer 300 in the area 105, the insulating layer 326 is disposed at a height position corresponding to the memory cell MC and the word line WL. The barrier insulating layer 324 contains, for example, silicon nitride (SiN). The insulating layer 325 contains, for example, silicon oxide (SiO$_2$).

For example, as illustrated in FIGS. 7A and 7B, the memory layer 400 in the area 101 includes a conducting layer 401, a barrier conducting layer 402, an electrode layer 403, a chalcogen layer 404, an electrode layer 405, a barrier conducting layer 406, a chalcogen layer 407, a barrier conducting layer 408, an electrode layer 409, a barrier conducting layer 410, and a conducting layer 411. For example, as illustrated in FIG. 6, the memory layer 400 includes a contact wiring 412.

For example, as illustrated in FIGS. 7A and 7B, the conducting layer 401 is disposed on a top surface of the conducting layer 311. The conducting layer 401 extends in the X direction and functions as a part of the word line WL. The conducting layer 401 contains, for example, tungsten (W).

The barrier conducting layer 402 is disposed on a top surface of the conducting layer 401. The barrier conducting layer 402 extends in the X direction and functions as a part of the word line WL. The barrier conducting layer 402 contains, for example, tungsten nitride (WN).

The electrode layer 403 is disposed on a top surface of the barrier conducting layer 402. The electrode layer 403 functions as the anode $E_A$ of the memory cell MC. The electrode layer 403 contains, for example, carbon nitride (CN).

The chalcogen layer 404 is disposed on a top surface of the electrode layer 403. Similarly to the chalcogen layer 304, the chalcogen layer 404 functions as the nonlinear element NO. The chalcogen layer 404 contains, for example, a material similar to that of the chalcogen layer 304.

The electrode layer 405 is disposed on a top surface of the chalcogen layer 404. The electrode layer 405 functions as an electrode connected to the variable resistance element VR and the nonlinear element NO. The electrode layer 405 contains, for example, carbon (C).

The barrier conducting layer 406 is disposed on a top surface of the electrode layer 405. The barrier conducting layer 406 contains, for example, tungsten nitride (WN).

The chalcogen layer 407 is disposed on a top surface of the barrier conducting layer 406. Similarly to the chalcogen layer 307, the chalcogen layer 407 functions as the variable resistance element VR. The chalcogen layer 407 contains, for example, a material similar to that of the chalcogen layer 307.

The barrier conducting layer 408 is disposed on a top surface of the chalcogen layer 407. The barrier conducting layer 408 contains, for example, tungsten nitride (WN).

The electrode layer 409 is disposed on a top surface of the barrier conducting layer 408. The electrode layer 409 functions as the cathode $E_C$ of the memory cell MC. The electrode layer 409 contains, for example, carbon (C).

The barrier conducting layer 410 is disposed on a top surface of the electrode layer 409. The barrier conducting layer 410 extends in the Y direction and functions as a part of the upper bit line UBL. The barrier conducting layer 410 contains, for example, tungsten nitride (WN).

The conducting layer 411 is disposed on a top surface of the barrier conducting layer 410. The conducting layer 411 extends in the Y direction and functions as a part of the upper bit line UBL. The conducting layer 411 contains, for example, tungsten (W).

For example, as illustrated in FIG. 6, the contact wiring 412 extends in the Z direction and is connected to a lower surface of the barrier conducting layer 410 and a top surface of the contact wiring 203. The contact wiring 412 functions as a part of the bit line contact BLC connected to the upper bit line UBL. The contact wiring 412 contains, for example, tungsten (W).

Note that, for example, as illustrated in FIG. 6, on side surfaces in the Y direction of the configurations of the memory layer 400 in the area 101, barrier insulating layers 421 and insulating layers 422 disposed between these configurations are disposed. Furthermore, in the memory layer 400 in the area 104, an insulating layer 423 is disposed at a height position corresponding to the word line WL and the memory cell MC. In the memory layer 400 in the area 105, the insulating layer 423 is disposed at a height position corresponding to the word line WL and an insulating layer 426 is disposed at a height position corresponding to the memory cell MC and the upper bit line UBL. The barrier insulating layer 421 contains, for example, silicon nitride (SiN). The insulating layer 422, the insulating layer 423, and the insulating layer 426 contain, for example, silicon oxide ($SiO_2$).

Moreover, for example, as illustrated in FIG. 5, on side surfaces in the X direction of the configurations of the memory layer 400 in the area 101, barrier insulating layers 424 and insulating layers 425 disposed between these configurations are disposed. In the memory layer 400 in the area 102, the insulating layer 426 is disposed at a height position corresponding to the memory cell MC and the upper bit line UBL. Further, in the memory layer 400 in the area 103, the insulating layer 423 is disposed at a height position corresponding to the word line WL and the insulating layer 426 is disposed at a height position corresponding to the memory cell MC and the upper bit line UBL. The barrier insulating layer 424 contains, for example, silicon nitride (SiN). The insulating layer 425 contains, for example, silicon oxide ($SiO_2$).

Figure 8:
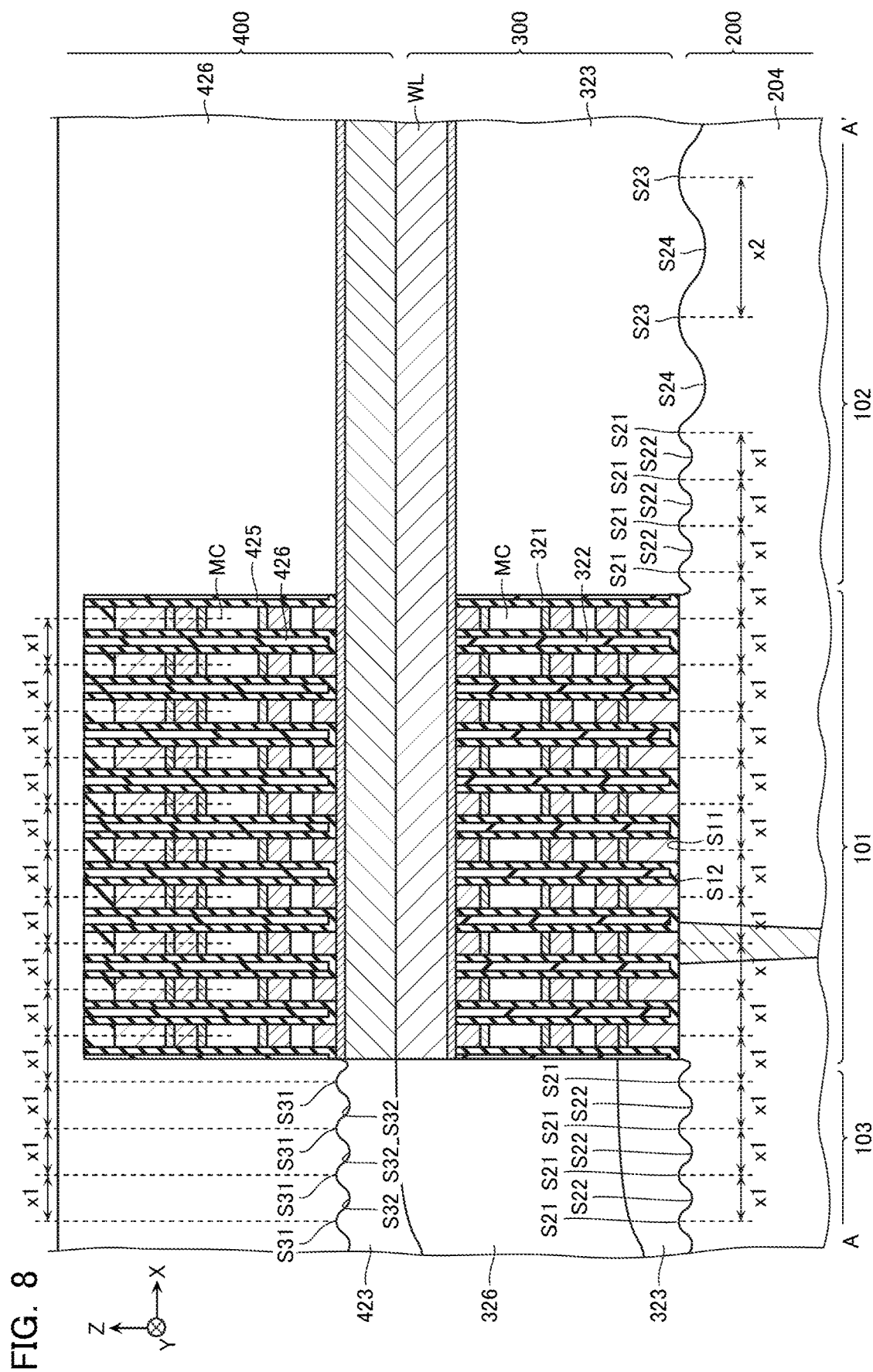
FIG. 8 is a schematic cross-sectional view corresponding to FIG. 5.
Figure 9:
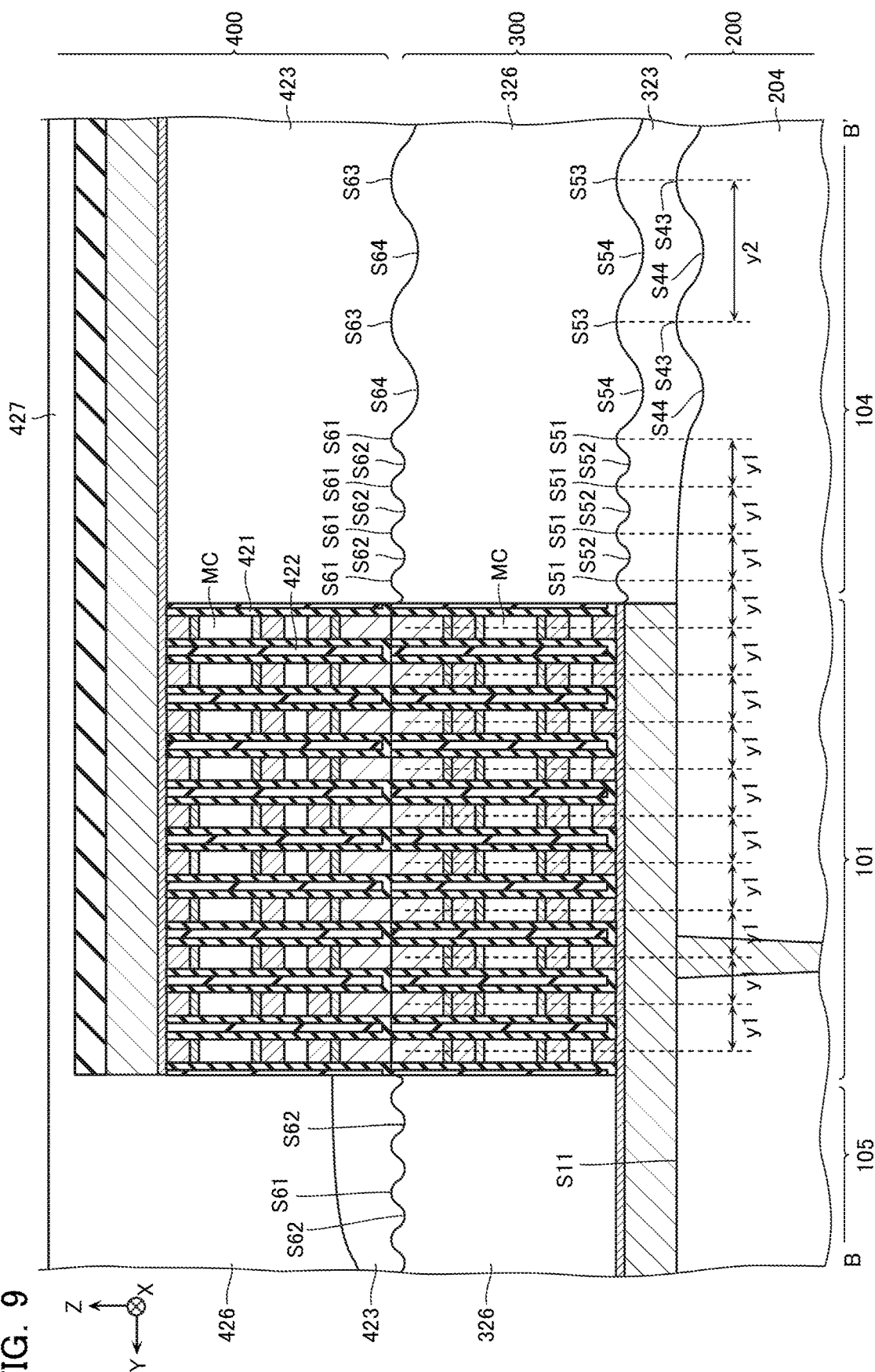
FIG. 9 is a schematic cross-sectional view corresponding to FIG. 6.

FIG. 8 is a schematic cross-sectional view corresponding to FIG. 5. FIG. 9 is a schematic cross-sectional view corresponding to FIG. 6. Note that, for convenience of explanation, FIG. 8 and FIG. 9 omit a part of a configuration.

As illustrated in FIG. 8, in the area 101, the plurality of memory cells MC are arranged in the X direction at a pitch x1. Additionally, on a top surface of the insulating layer 204, a plurality of surfaces S11 where the conducting layer 301 is disposed and a plurality of surfaces S12 disposed between these surfaces S11 are disposed. The surfaces S11 are arranged in the X direction corresponding to the conducting layers 301 and extend in the Y direction. The surface S12 may be disposed at a height position same as that of the surface S11 or may be disposed downward with respect to the surface S11. Note that, in the illustrated example, the surfaces S11 are arranged in the X direction at the pitch x1.

In the area 102, on the top surface of the insulating layer 204, a plurality of protruding surfaces S21 and a plurality of recessed surfaces S22 disposed between the plurality of surfaces S21 are disposed. Additionally, in the area 102, on the top surface of the insulating layer 204, a plurality of protruding surfaces S23 and a plurality of recessed surfaces S24 disposed between the plurality of surfaces S23 are disposed. The recessed surface S22 and surface S24 are disposed downward with respect to the protruding surface S21 and surface S23. The plurality of surfaces S21 and surfaces S22 are closer to the area 101 compared with the plurality of surfaces S23 and surfaces S24. The surfaces S21 are arranged in the X direction at the pitch x1 together with the surfaces S11. The surfaces S22 are arranged in the X direction at the pitch x1 together with the surfaces S12. The surfaces S23 are arranged in the X direction at a pitch x2 larger than the pitch x1. The surfaces S24 are arranged in the X direction at the pitch x2.

In the area 103, on the top surface of the insulating layer 204, the plurality of protruding surfaces S21 and the plurality of recessed surfaces S22 disposed between the plurality of surfaces S21 are disposed. Additionally, although the illustration is omitted, in the area 103, on the top surface of the insulating layer 204, the plurality of protruding surfaces S23 and the plurality of recessed surfaces S24 disposed between the plurality of surfaces S23 are disposed.

In the area 103, on a top surface of the insulating layer 423, a plurality of protruding surfaces S31 and a plurality of recessed surfaces S32 disposed between the plurality of surfaces S31 are disposed. The plurality of surfaces S31 and surfaces S32 are formed similarly to the plurality of surfaces S21 and surfaces S22, which are disposed on the top surface of the insulating layer 204. The surfaces S31 are arranged in the X direction at the pitch x1 together with the plurality of memory cells MC. Additionally, although the illustration is omitted, in the area 103, on the top surface of the insulating layer 423, a plurality of protruding surfaces and a plurality of recessed surfaces disposed between the plurality of protruding surfaces are disposed. The plurality of surfaces are formed similarly to the plurality of surfaces S23 and surfaces S24, which are disposed on the top surface of the insulating layer 204.

As illustrated in FIG. 9, in the area 101, the plurality of memory cells MC are arranged in the Y direction at a pitch y1.

In the area 104, on the top surface of the insulating layer 204, a plurality of protruding surfaces S43 and a plurality of recessed surfaces S44 disposed between the plurality of surfaces S43 are disposed. The recessed surfaces S44 are disposed downward with respect to the protruding surfaces S43. The surfaces S43 are arranged in the Y direction at a pitch y2 larger than the pitch y1. The surfaces S44 are arranged in the Y direction at the pitch y2.

In the area 104, on a top surface of the insulating layer 323, a plurality of protruding surfaces S51 and a plurality of recessed surfaces S52 disposed between the plurality of surfaces S51 are disposed. Additionally, in the area 104, on the top surface of the insulating layer 323, a plurality of protruding surfaces S53 and a plurality of recessed surfaces S54 disposed between the plurality of surfaces S53 are disposed. The recessed surfaces S52 and surfaces S54 are disposed downward with respect to the protruding surface S51 and surfaces S53. The plurality of surfaces S51 and surfaces S52 are closer to the area 101 compared with the plurality of surfaces S53 and surfaces S54. The surfaces S51 are arranged in the Y direction at the pitch y1 together with the plurality of memory cells MC. The surfaces S52 are arranged in the Y direction at the pitch y1. The surfaces S53 are arranged in the Y direction at the pitch y2. The surfaces S54 are arranged in the Y direction at the pitch y2.

Moreover, in the area 104, on a top surface of the insulating layer 326, a plurality of protruding surfaces S61 and a plurality of recessed surfaces S62 disposed between the plurality of surfaces S61 are disposed. In the area 104, on the top surface of the insulating layer 326, a plurality of protruding surfaces S63 and a plurality of recessed surfaces S64 disposed between the plurality of surfaces S63 are disposed. The recessed surfaces S62 and surfaces S64 are disposed downward with respect to the protruding surfaces S61 and surfaces S63. The plurality of surfaces S61 and surfaces S62 are closer to the area 101 compared with the plurality of surfaces S63 and surfaces S64. The surfaces S61 are arranged in the Y direction at the pitch y1 together with the plurality of memory cells MC. The surfaces S62 are arranged in the Y direction at the pitch y1. The surfaces S63 are arranged in the Y direction at the pitch y2. The surfaces S64 are arranged in the Y direction at the pitch y2.

In the area 105, on the top surface of the insulating layer 326, the plurality of protruding surfaces S61 and the plurality of recessed surfaces S62 disposed between the plurality of surfaces S61 are disposed. The surfaces S61 are arranged in the Y direction at the pitch y1 together with the plurality of memory cells MC. Additionally, although the illustration is omitted, in the area 105, on the top surface of the insulating layer 326, the plurality of protruding surfaces S63 and the plurality of recessed surfaces S64 disposed between the plurality of surfaces S63 are disposed.

[Manufacturing Method]

Next, with reference to FIG. 10 to FIG. 75, a method of manufacturing the semiconductor memory device according to the embodiment will be described. FIG. 10, FIG. 12, FIG. 16, FIG. 21, FIG. 24, FIG. 31, FIG. 33, FIG. 38, FIG. 41, FIG. 47, FIG. 49, FIG. 50, FIG. 54, FIG. 57, FIG. 58, FIG. 64, FIG. 66, FIG. 70, FIG. 71, FIG. 73, and FIG. 74 are schematic plan views corresponding to FIG. 4. FIG. 11, FIG. 13 to FIG. 15, FIG. 17, FIG. 19, FIG. 20, FIG. 22, FIG. 25, FIG. 27 to FIG. 29, FIG. 30, FIG. 34, FIG. 39, FIG. 42, FIG. 55, FIG. 62, FIG. 65, and FIG. 67 to FIG. 69 are schematic cross-sectional views corresponding to FIG. 5. FIG. 18, FIG. 23, FIG. 26, FIG. 32, FIG. 35, FIG. 36, FIG. 37, FIG. 40, FIG. 43 to FIG. 46, FIG. 48, FIG. 51 to FIG. 53, FIG. 56, FIG. 59 to FIG. 61, FIG. 63, FIG. 72, and FIG. 75 are schematic cross-sectional views corresponding to FIG. 6. Note that, for convenience of explanation, there may be a case where FIG. 10 to FIG. 75 omit a part of the configuration.

To manufacture the semiconductor memory device according to the embodiment, for example, the peripheral circuit PC (FIG. 3) is formed on a semiconductor wafer. Next, for example, the wiring layer 200 (FIG. 5) to connect the peripheral circuit PC to the memory cell array MCA and the like are formed.

Figure 11:
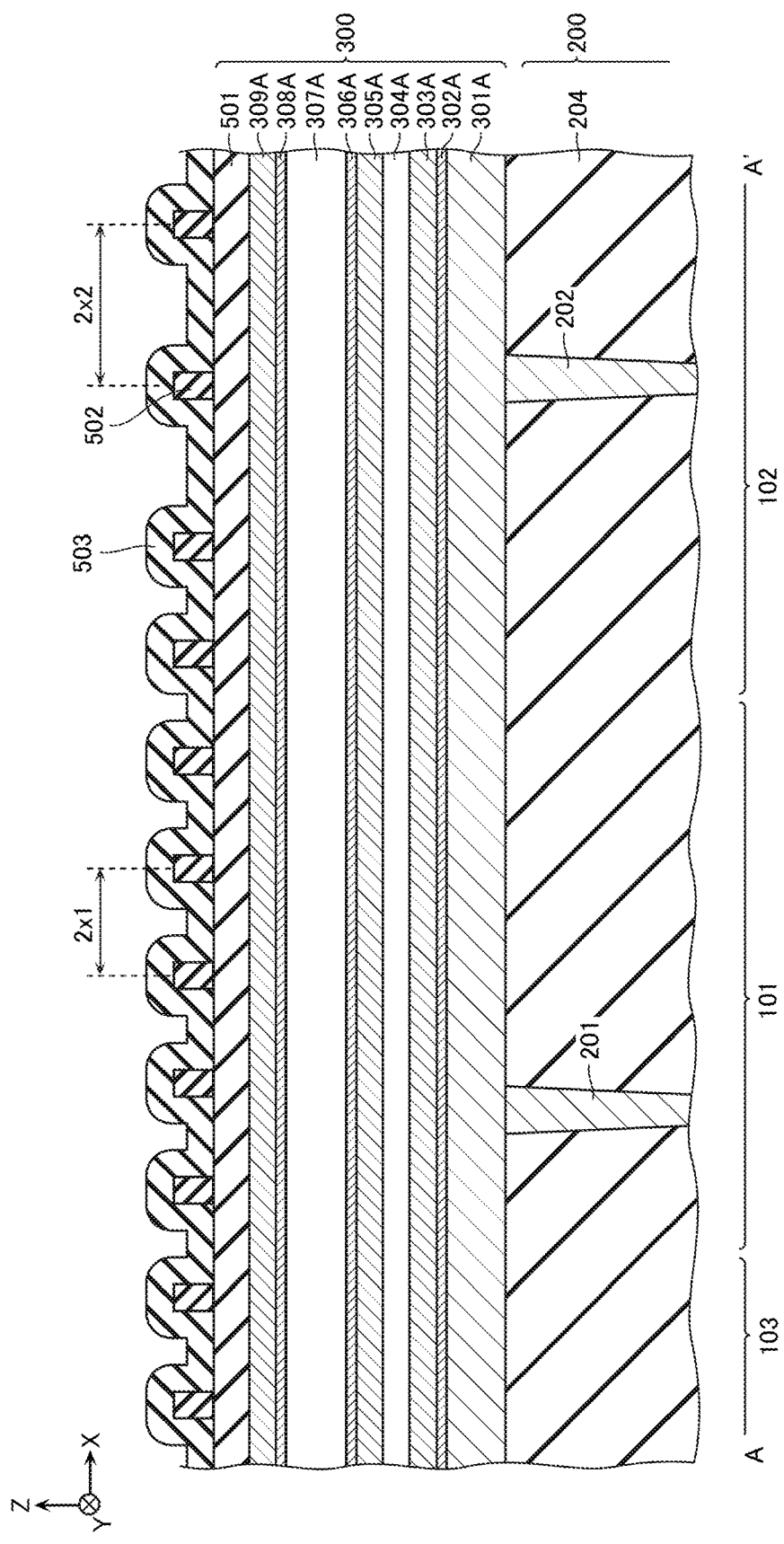
FIG. 11 is a schematic view illustrating the manufacturing method.

Next, for example, as illustrated in FIG. 11, on the top surface of the insulating layer 204, a laminated body including a conducting layer 301A forming the conducting layer 301, a barrier conducting layer 302A forming the barrier conducting layer 302, an electrode layer 303A forming the electrode layer 303, a chalcogen layer 304A forming the chalcogen layer 304, an electrode layer 305A forming the electrode layer 305, a barrier conducting layer 306A forming the barrier conducting layer 306, a chalcogen layer 307A (variable resistance layer) forming the chalcogen layer 307, a barrier conducting layer 308A forming the barrier conducting layer 308, an electrode layer 309A forming the electrode layer 309, and a hard mask layer 501, such as silicon nitride (SiN), is formed. The process is performed by, for example, Physical Vapor Deposition (PVD), such as sputtering.

Figure 10:
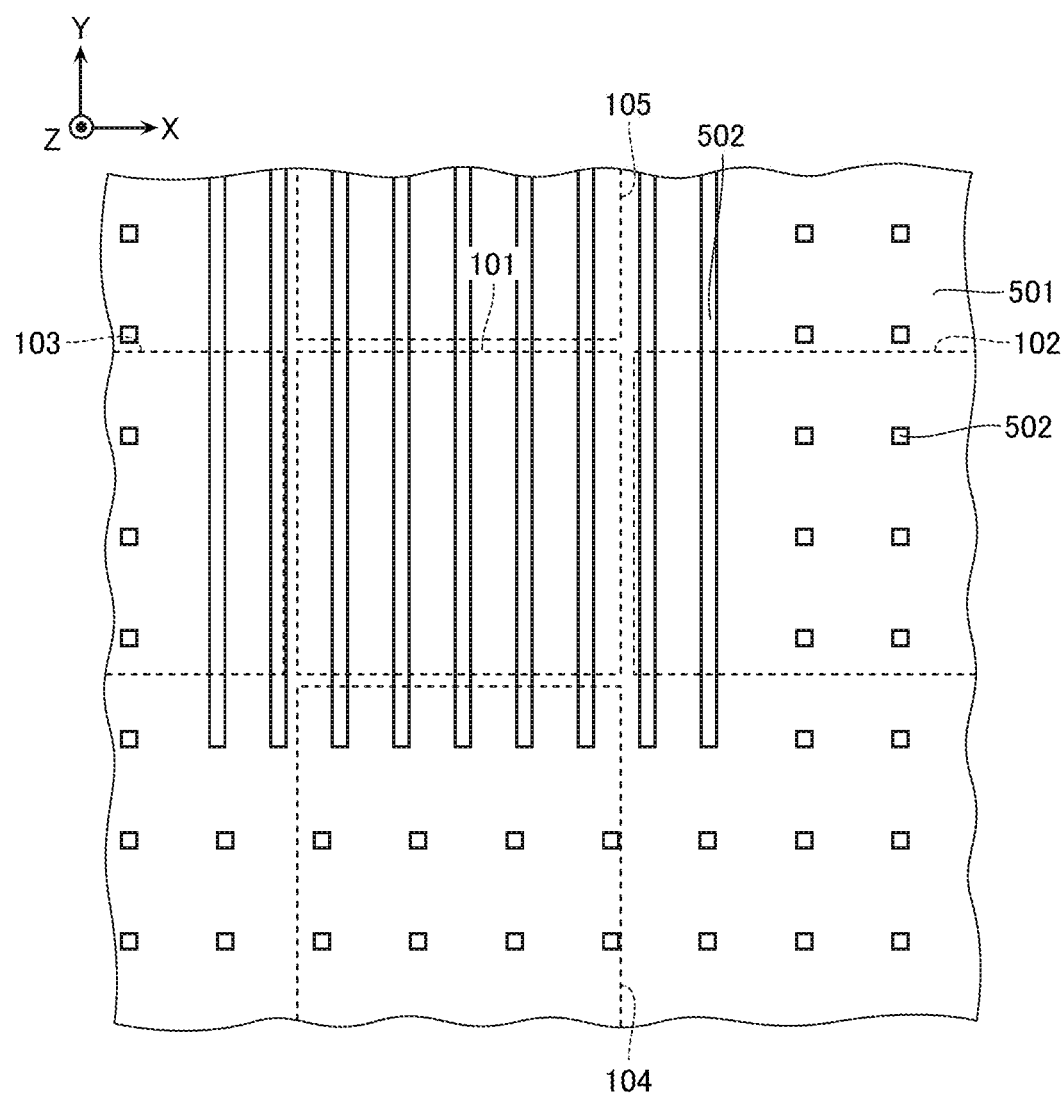
FIG. 10 is a schematic view illustrating a method of manufacturing the semiconductor memory device according to the first embodiment.

Next, for example, as illustrated in FIG. 10 and FIG. 11, on a top surface of the hard mask layer 501, core materials 502, such as carbon (C), are formed. The core materials 502, for example, extend in the Y direction and are arranged in the X direction at a pitch 2x1 in the area 101 and the area 105 and near the area 101 and the area 105 (a part of the area 102, a part of the area 103, and a part of the area 104). For example, the core materials 502 are arranged in the X direction at a pitch 2x2 and arranged in the Y direction at predetermined pitch in areas away from the area 101 and the area 105 (a part of the area 102, a part of the area 103, and a part of the area 104).

Next, for example, as illustrated in FIG. 11, a hard mask layer 503, such as silicon oxide ($SiO_2$), is formed on a top surface of the hard mask layer 501, side surfaces of the core materials 502, and the top surfaces of the core materials 502. The process is performed by, for example, CVD using a gas, such as TEOS.

Figure 12:
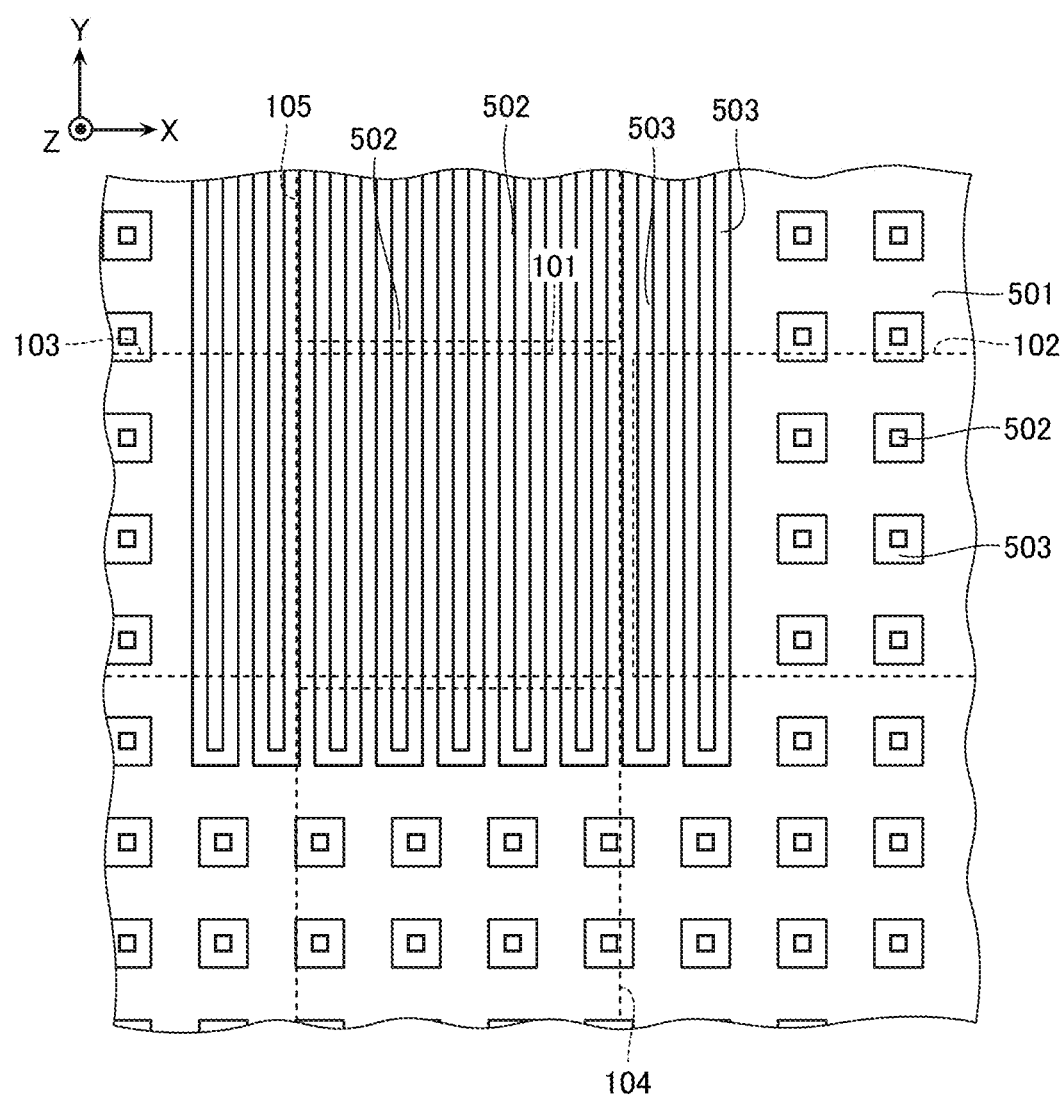
FIG. 12 is a schematic view illustrating the manufacturing method.
Figure 13:
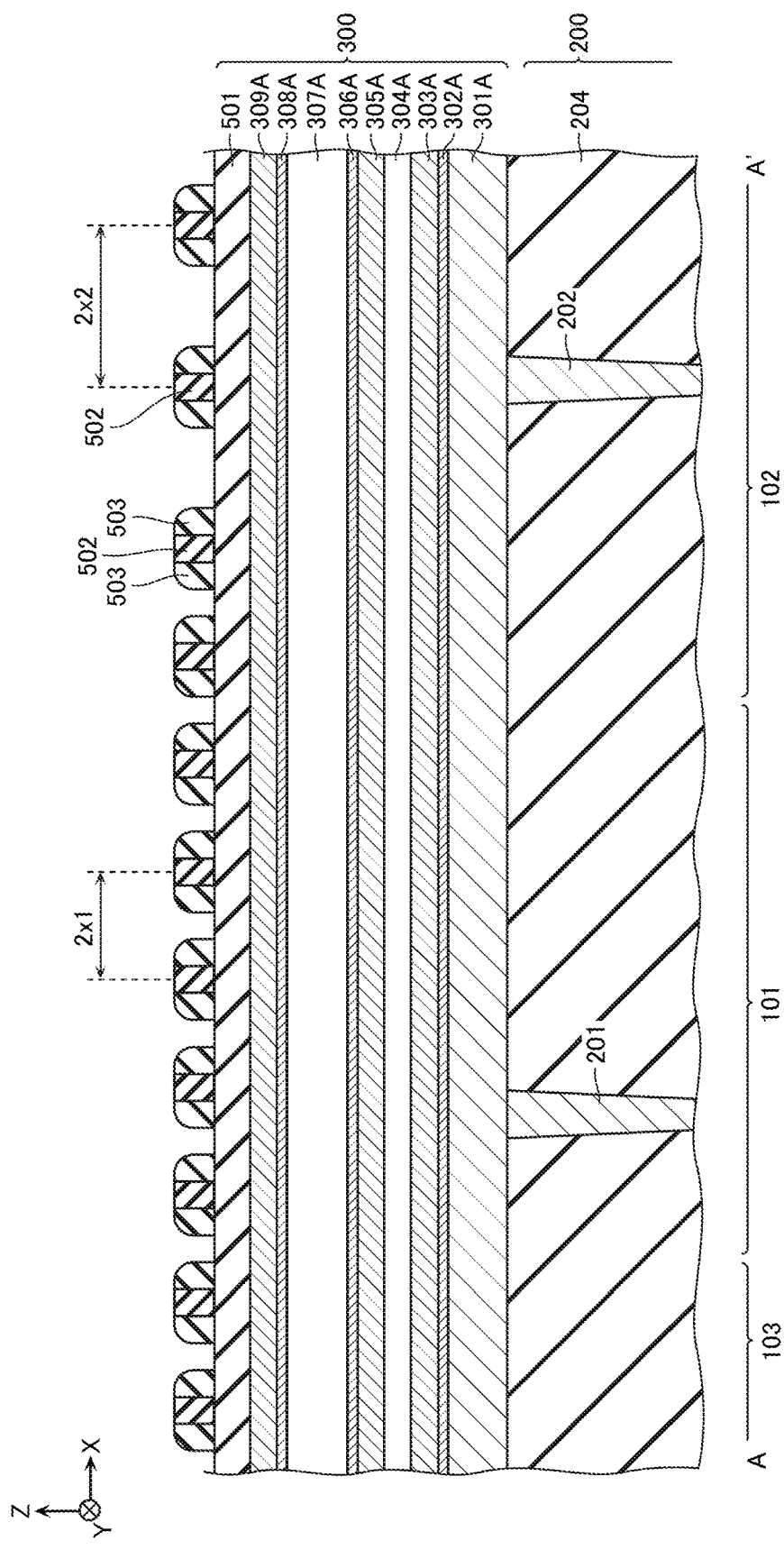
FIG. 13 is a schematic view illustrating the manufacturing method.

Next, for example, as illustrated in FIG. 12 and FIG. 13, in the hard mask layer 503, the parts formed on the hard mask layer 501 and the top surfaces of the core materials 502 are removed while the parts formed on the side surfaces of the core materials 502 remain.

Figure 14:
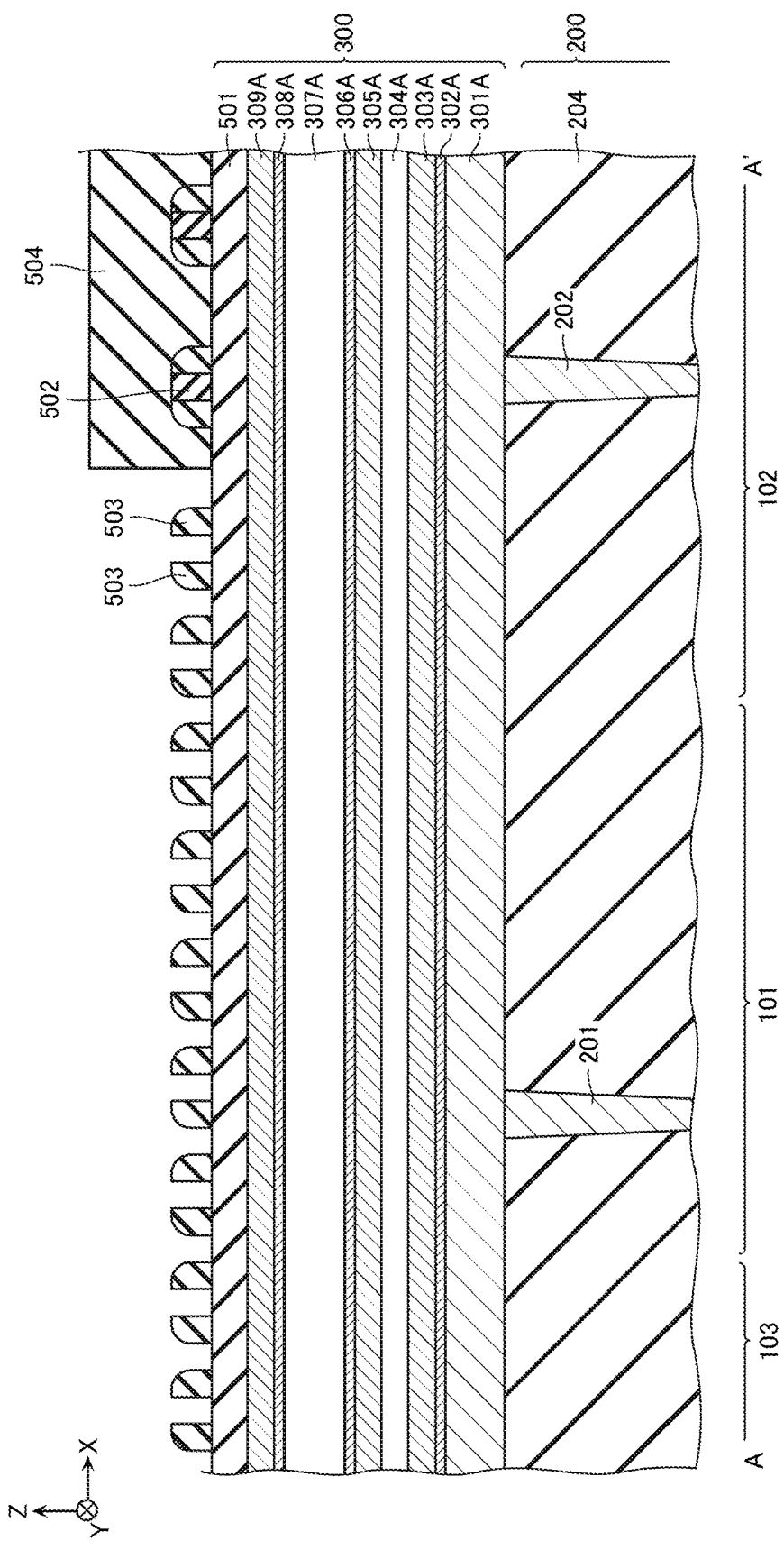
FIG. 14 is a schematic view illustrating the manufacturing method.

Next, for example, as illustrated in FIG. 14, a mask material 504 that covers a part of the core materials 502 disposed in an area away from the area 101 and the area 105 is formed. Among the core materials 502, ones not protected by the mask material 504 are removed. The core materials 502 are removed by, for example, asking. Afterwards, the mask material 504 is removed.

Figure 15:
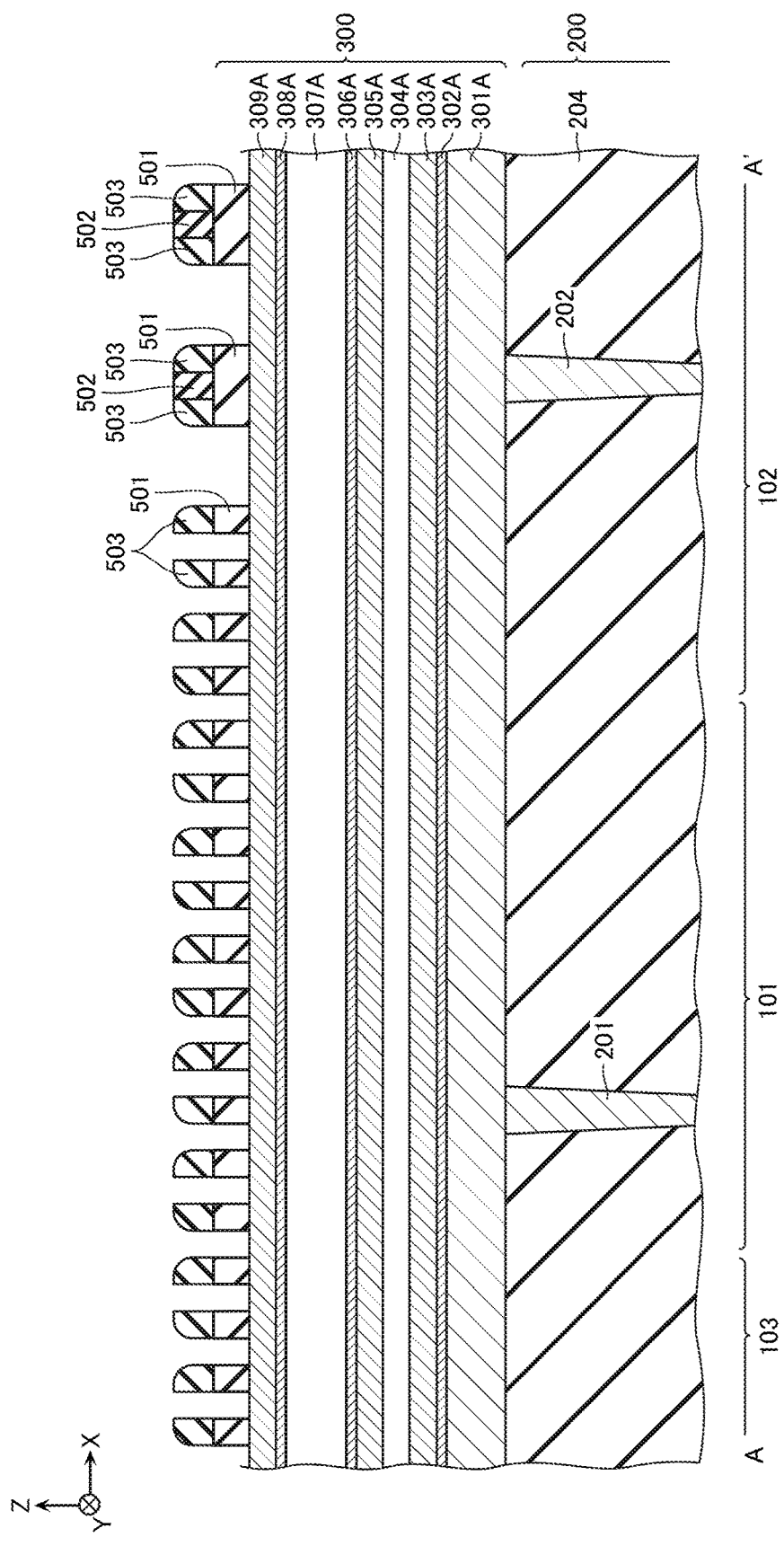
FIG. 15 is a schematic view illustrating the manufacturing method.

Next, for example, as illustrated in FIG. 15, a part of the hard mask layer 501 is removed. The process is performed by, for example, anisotropic etching, such as Reactive Ion Etching (RIE), that uses the core materials 502 and the hard mask layers 503 as masks. The process divides the hard mask layer 501 in the X direction in the area 101 and the area 105 and near the area 101 and the area 105, thus forming a line and space pattern. Additionally, in the area away from the area 101 and the area 105, the hard mask layer 501 is divided in the X direction and the Y direction, thus forming an island-shaped pattern in which the hard mask layers 501 are arranged in a matrix.

Figure 16:
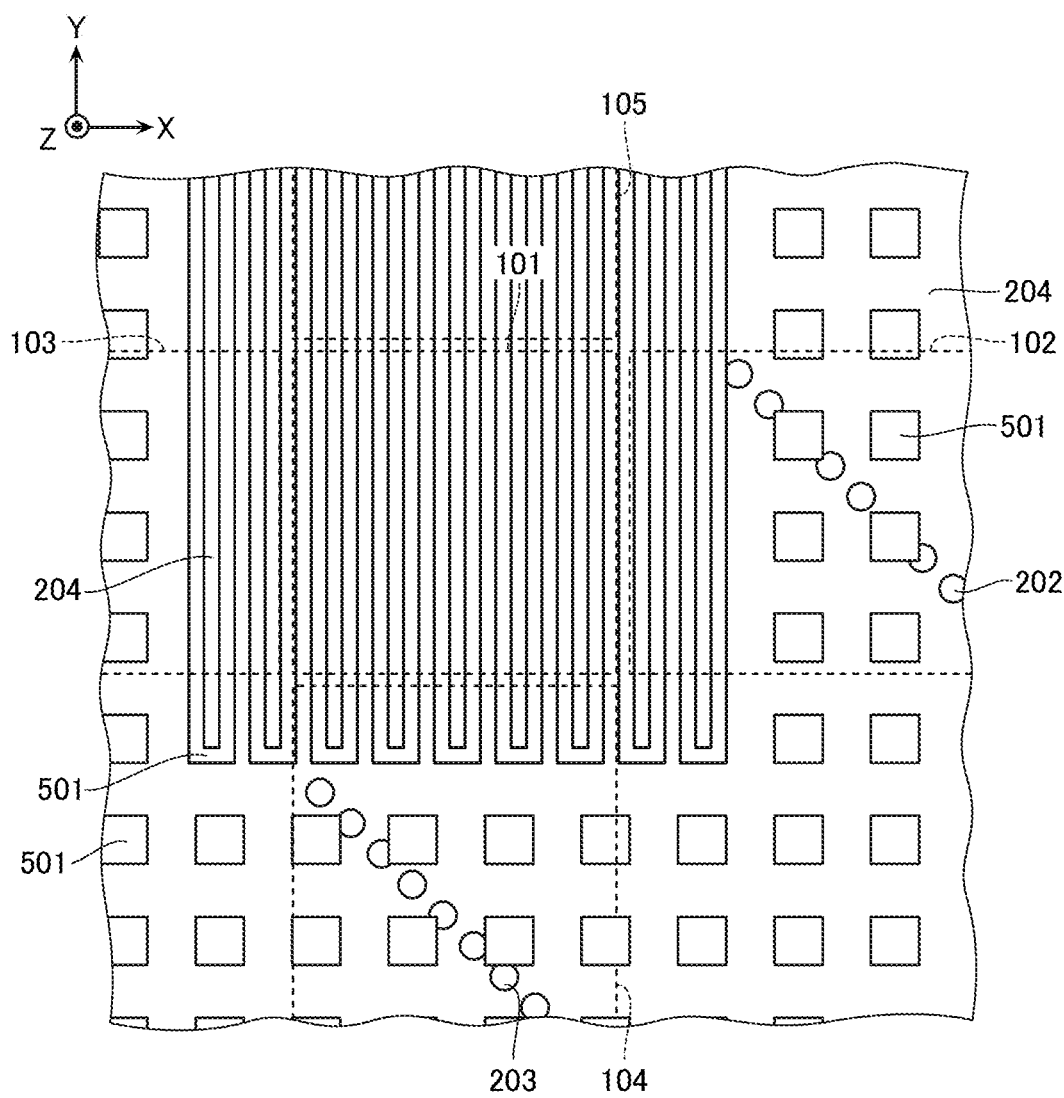
FIG. 16 is a schematic view illustrating the manufacturing method.
Figure 17:
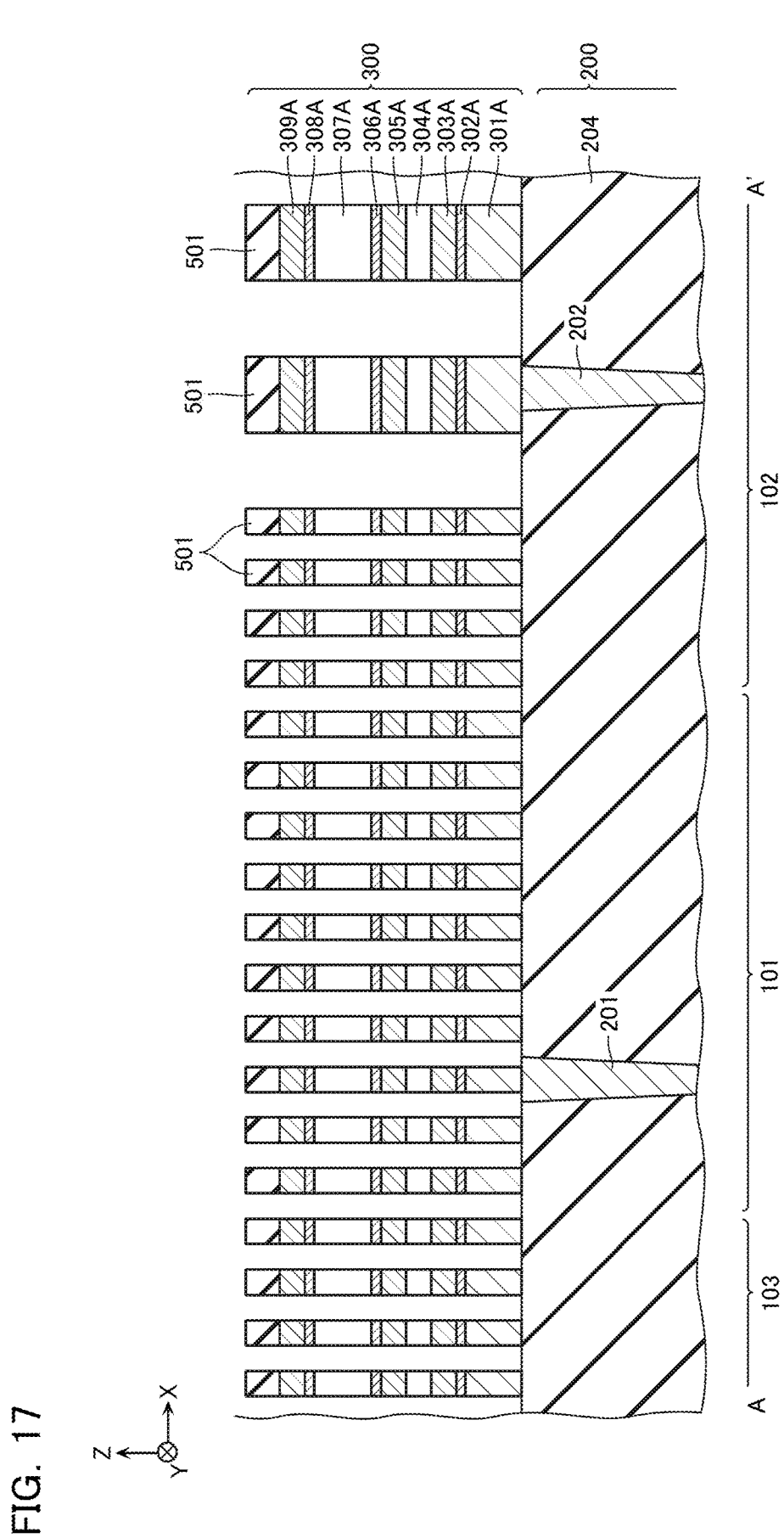
FIG. 17 is a schematic view illustrating the manufacturing method.
Figure 18:
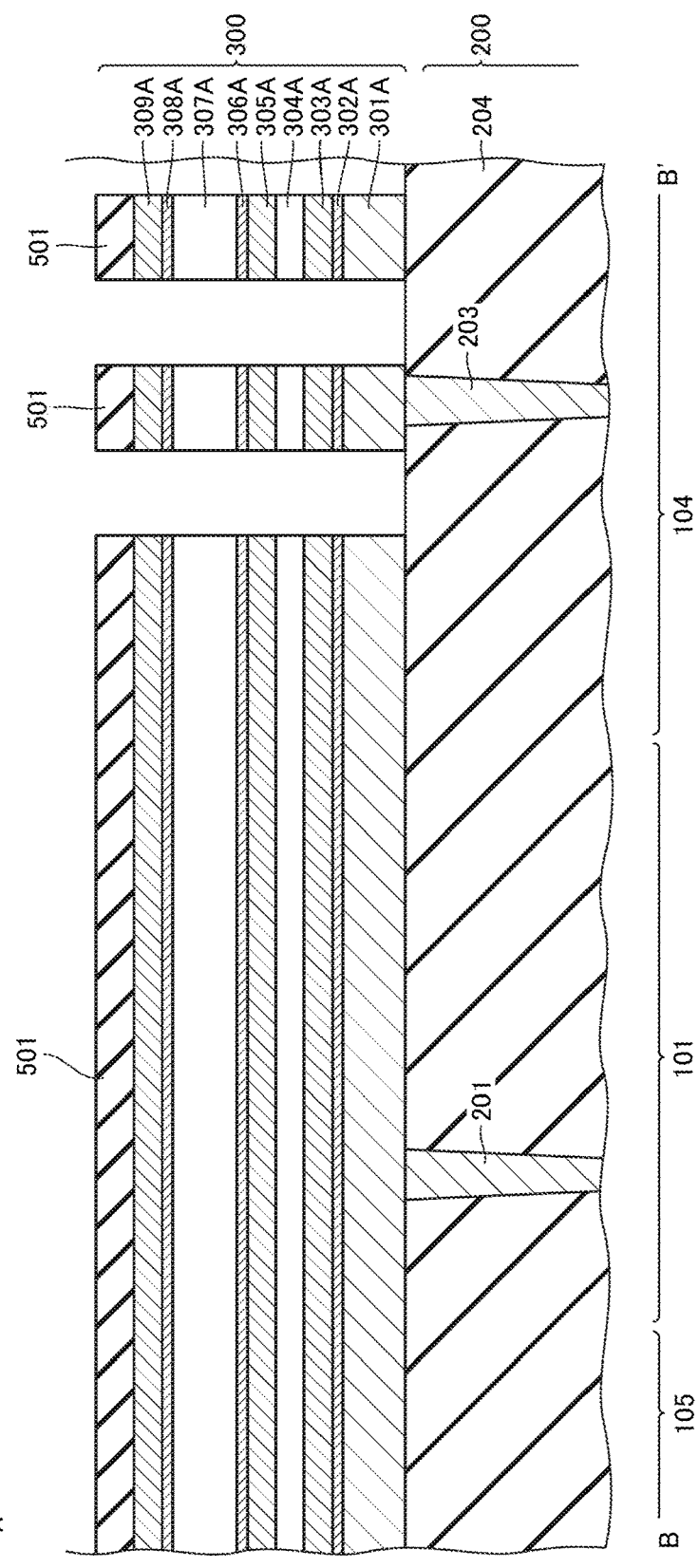
FIG. 18 is a schematic view illustrating the manufacturing method.

Next, for example, as illustrated in FIG. 16 to FIG. 18, a part of the conducting layer 301A, the barrier conducting layer 302A, the electrode layer 303A, the chalcogen layer 304A, the electrode layer 305A, the barrier conducting layer 306A, the chalcogen layer 307A, the barrier conducting layer 308A, and the electrode layer 309A are removed. The process is performed by, for example, anisotropic etching, such as RIE, that uses the hard mask layers 501, the core materials 502, and the hard mask layers 503 as masks. The process divides these layers in the X direction and the Y direction along the pattern formed on the hard mask layer 501. Note that the process removes the core materials 502 and the hard mask layers 503 and at least a part of the hard mask layers 501 remain.

Figure 19:
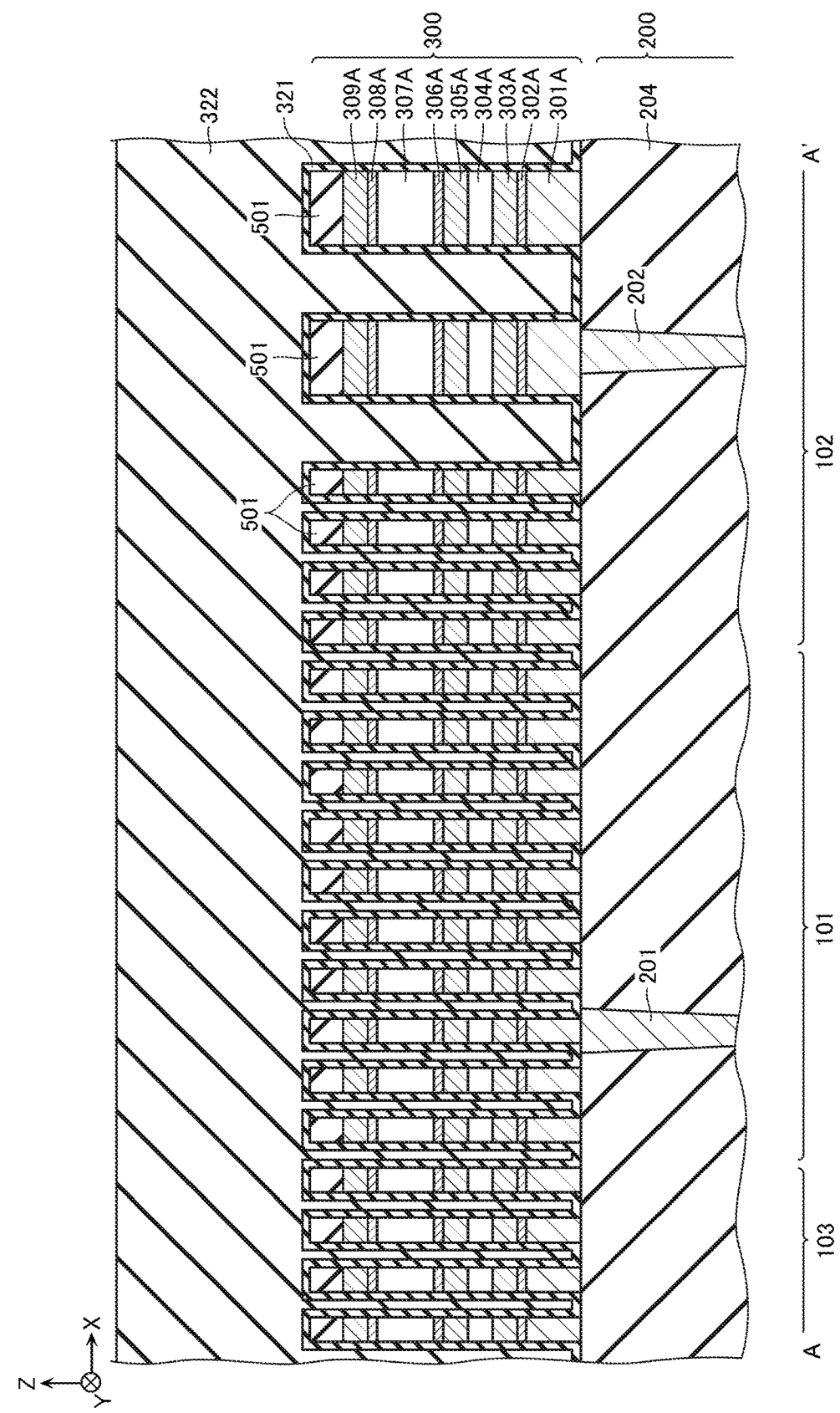
FIG. 19 is a schematic view illustrating the manufacturing method.

Next, for example, as illustrated in FIG. 19, the barrier insulating layer 321 is formed on the top surface of the insulating layer 204, the top surfaces of the hard mask layers 501, and side surfaces in the X direction of the conducting layers 301A, the barrier conducting layers 302A, the electrode layers 303A, the chalcogen layers 304A, the electrode layers 305A, the barrier conducting layers 306A, the chalcogen layers 307A, the barrier conducting layers 308A, and the electrode layers 309A. Additionally, the insulating layer 322 is formed. The insulating layer 322 is formed by, for example, applying a polysilazane or the like on the wafer by means, such as spin coat, and performing a heat treatment or the like.

Figure 20:
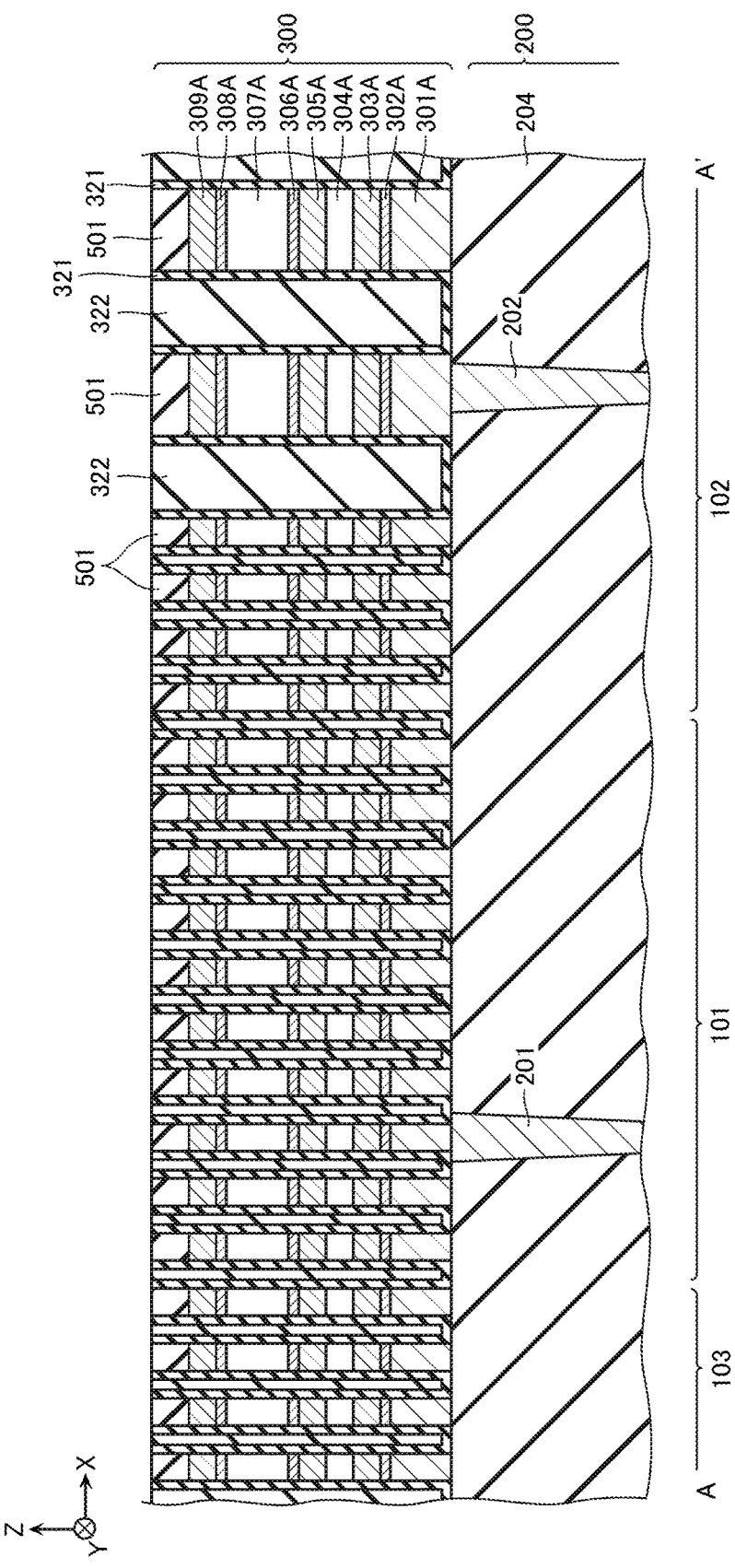
FIG. 20 is a schematic view illustrating the manufacturing method.

Next, for example, as illustrated in FIG. 20, a part of the insulating layer 322 is removed to expose the top surfaces of the hard mask layers 501. The process is performed by, for example, flattening process, such as Chemical Mechanical Polishing (CMP) using the hard mask layers 501 as stoppers.

Figure 21:
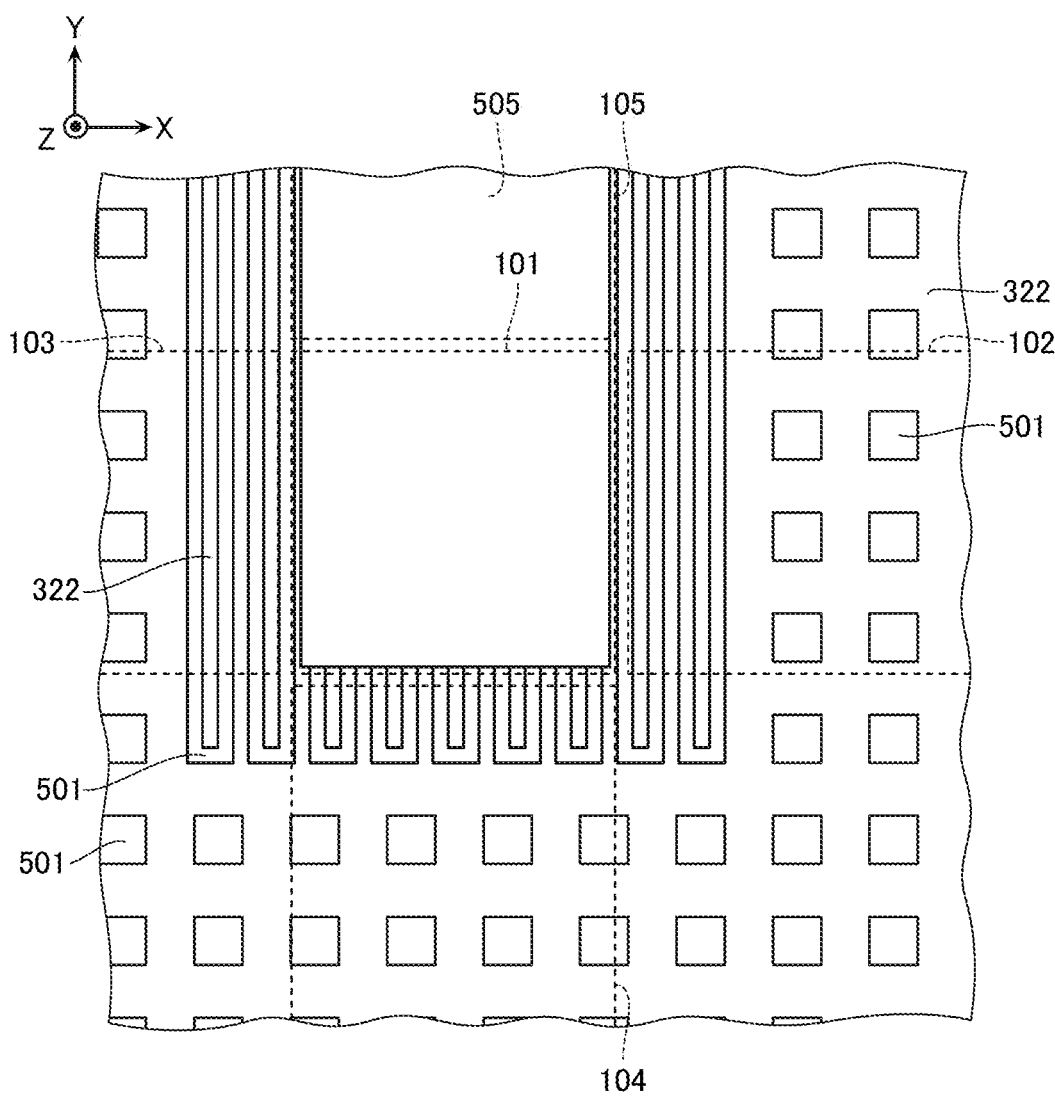
FIG. 21 is a schematic view illustrating the manufacturing method.
Figure 22:
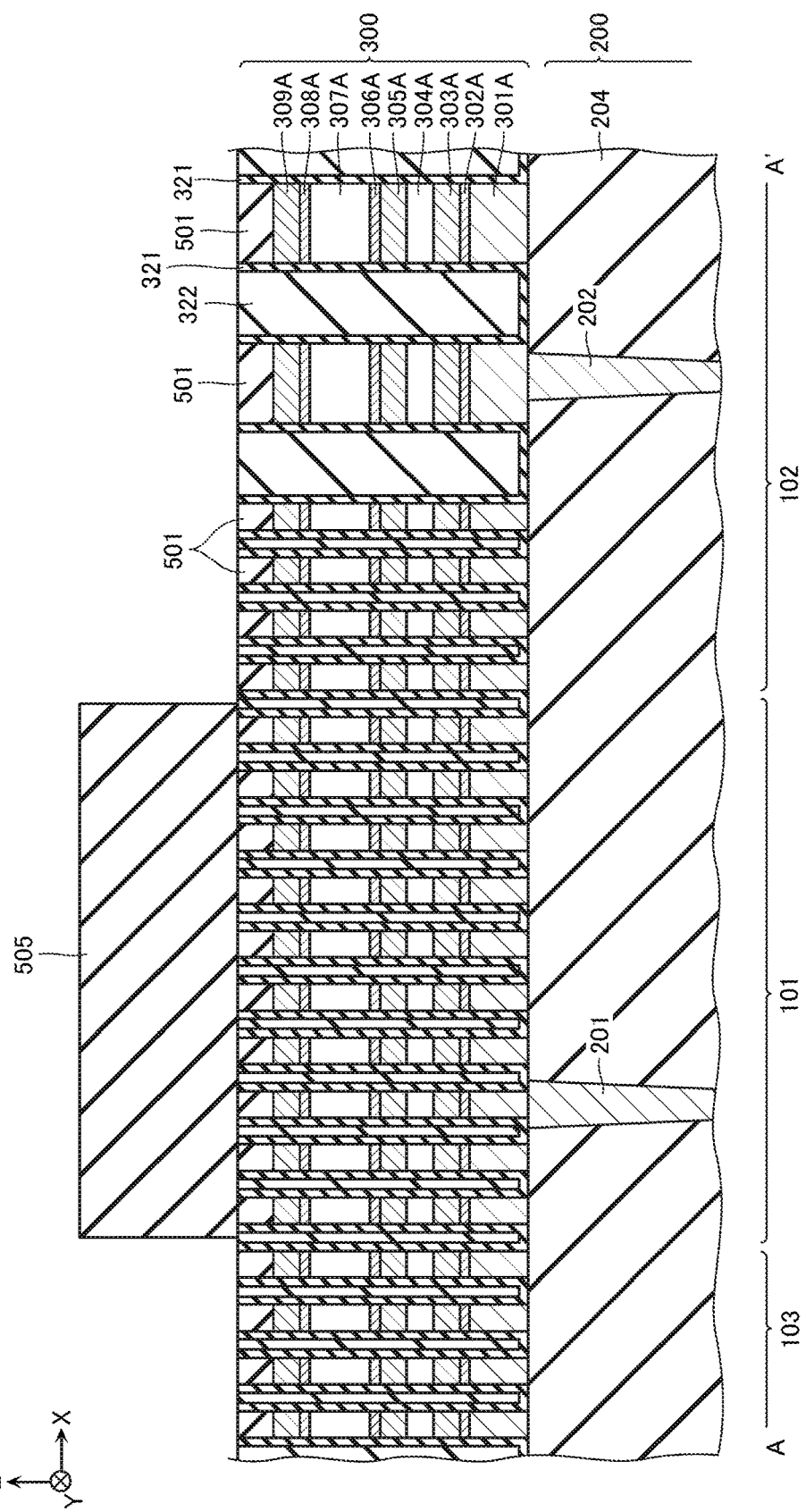
FIG. 22 is a schematic view illustrating the manufacturing method.
Figure 23:
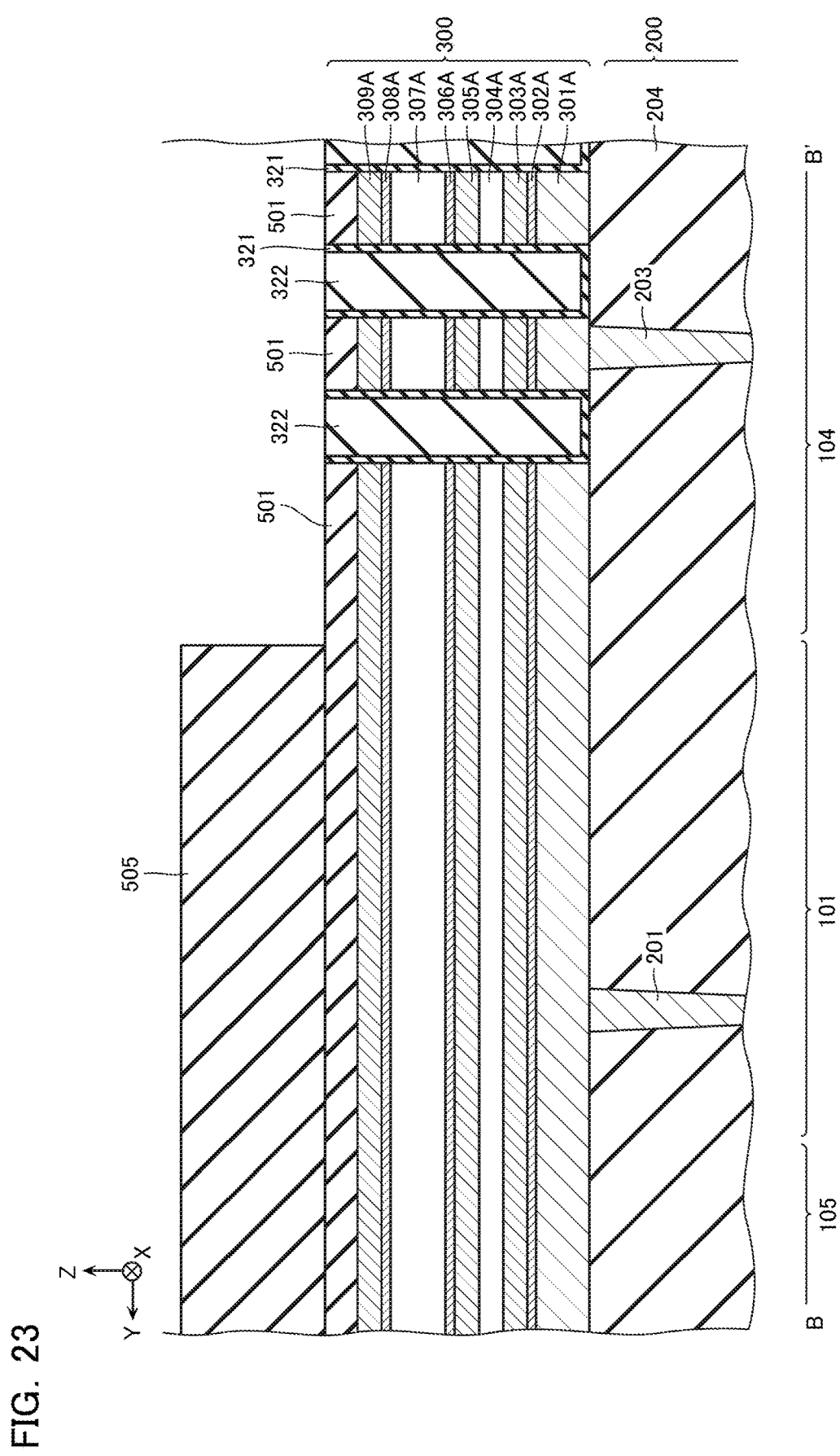
FIG. 23 is a schematic view illustrating the manufacturing method.

Next, for example, as illustrated in FIG. 21 to FIG. 23, a mask material 505 that covers the area 101 and the area 105 is formed.

Figure 24:
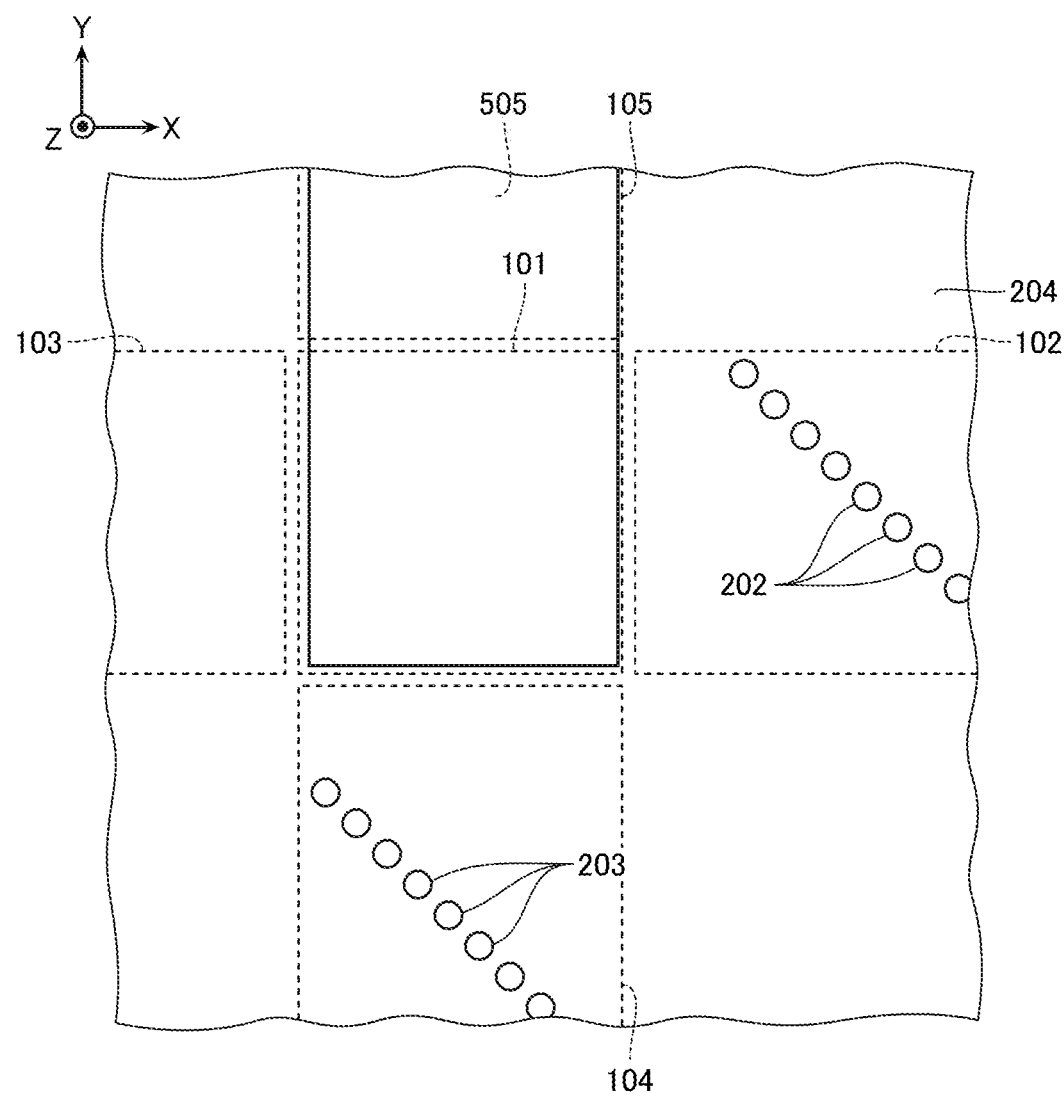
FIG. 24 is a schematic view illustrating the manufacturing method.
Figure 25:
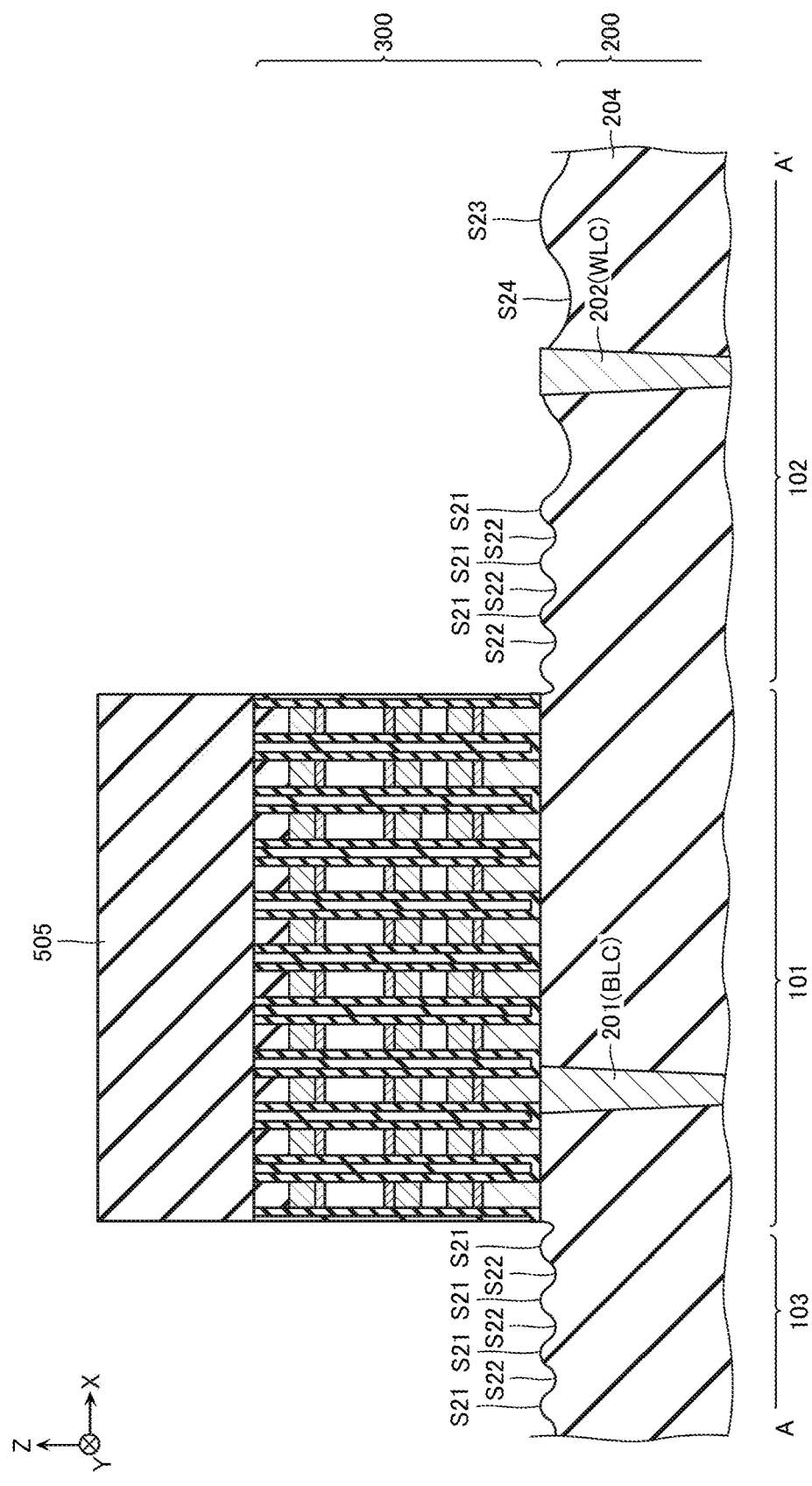
FIG. 25 is a schematic view illustrating the manufacturing method.
Figure 26:
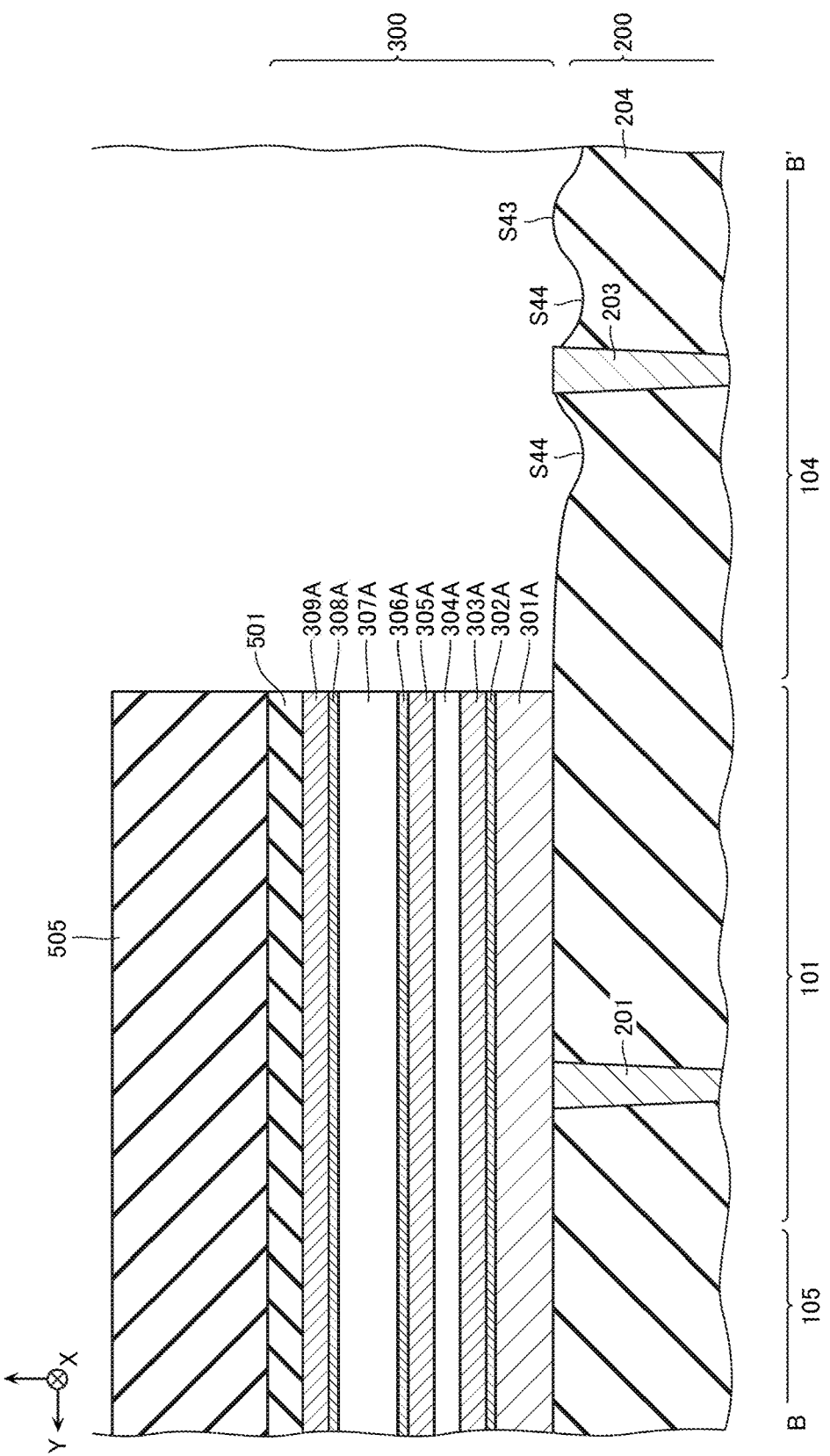
FIG. 26 is a schematic view illustrating the manufacturing method.

Next, for example, as illustrated in FIG. 24 to FIG. 26, the configuration formed on the insulating layer 204 in the area 102, the area 103, and the area 104 is removed. The process is performed by, for example, anisotropic etching, such as RIE, that uses the mask material 505 as a mask. Note that an etching rate differs between a structure including the hard mask layers 501 and the like and the insulating layers 322 in some cases. In this case, for example, as illustrated in FIG. 25, the protruding surfaces S21 and the recessed surfaces S22 are formed on the top surface of the insulating layer 204 in near the area 101 and the area 105 (a position corresponding to the line and space pattern) in some cases. Additionally, the protruding surfaces S23, the recessed surfaces S24, the protruding surfaces S43, and the recessed surfaces S44 are formed on the top surface of the insulating layer 204 in an area away from the area 101 and the area 105 (a position corresponding to the island-shaped pattern) in some cases. Afterwards, the mask material 505 is removed.

Figure 27:
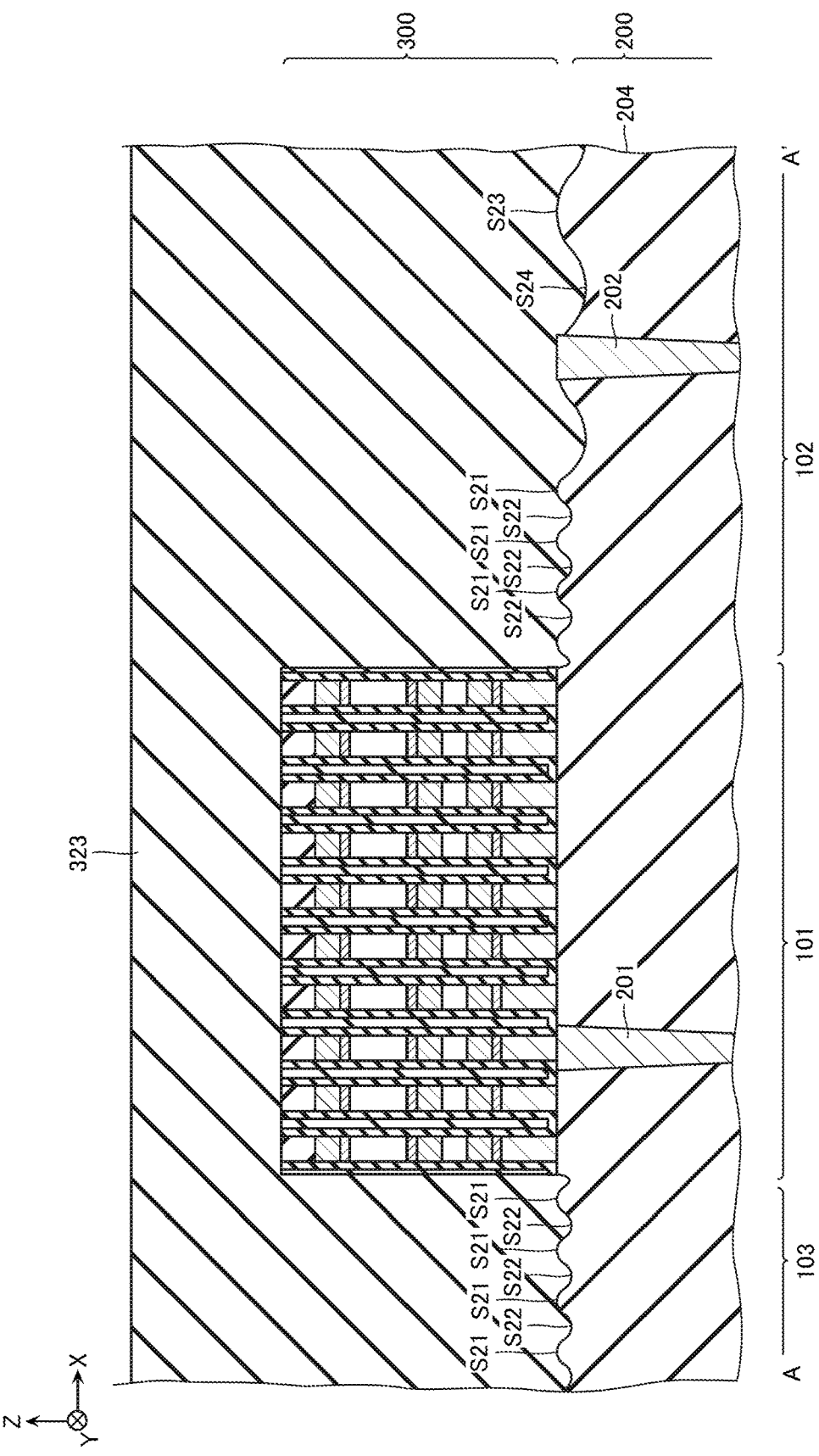
FIG. 27 is a schematic view illustrating the manufacturing method.

Next, for example, as illustrated in FIG. 27, the insulating layer 323 is formed. The process is performed by, for example, CVD using a gas, such as TEOS.

Figure 28:
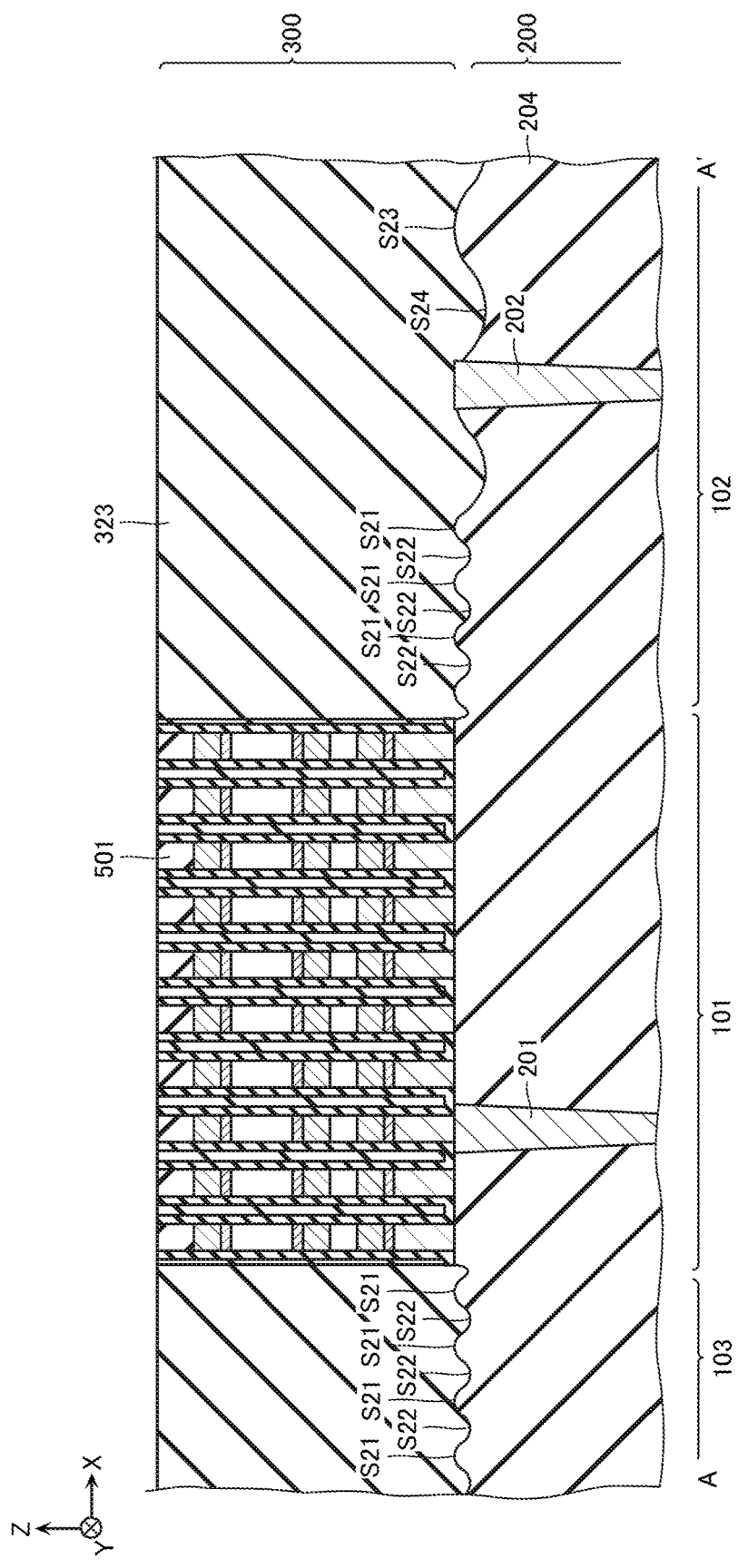
FIG. 28 is a schematic view illustrating the manufacturing method.

Next, for example, as illustrated in FIG. 28, a part of the insulating layer 323 is removed to expose the top surfaces of the hard mask layers 501. The process is, for example, performed by flattening process, such as CMP, using the hard mask layers 501 as stoppers.

Figure 29:
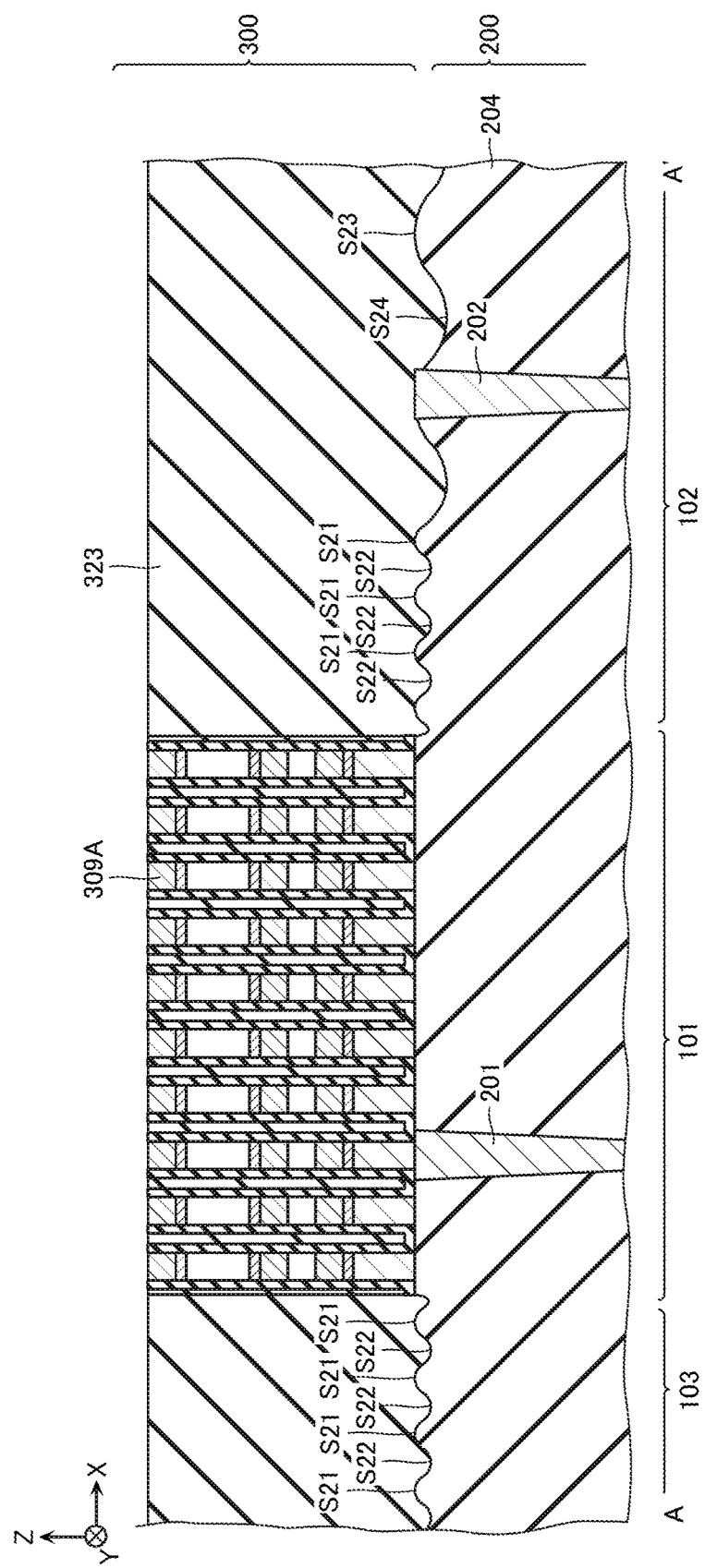
FIG. 29 is a schematic view illustrating the manufacturing method.
Figure 30:
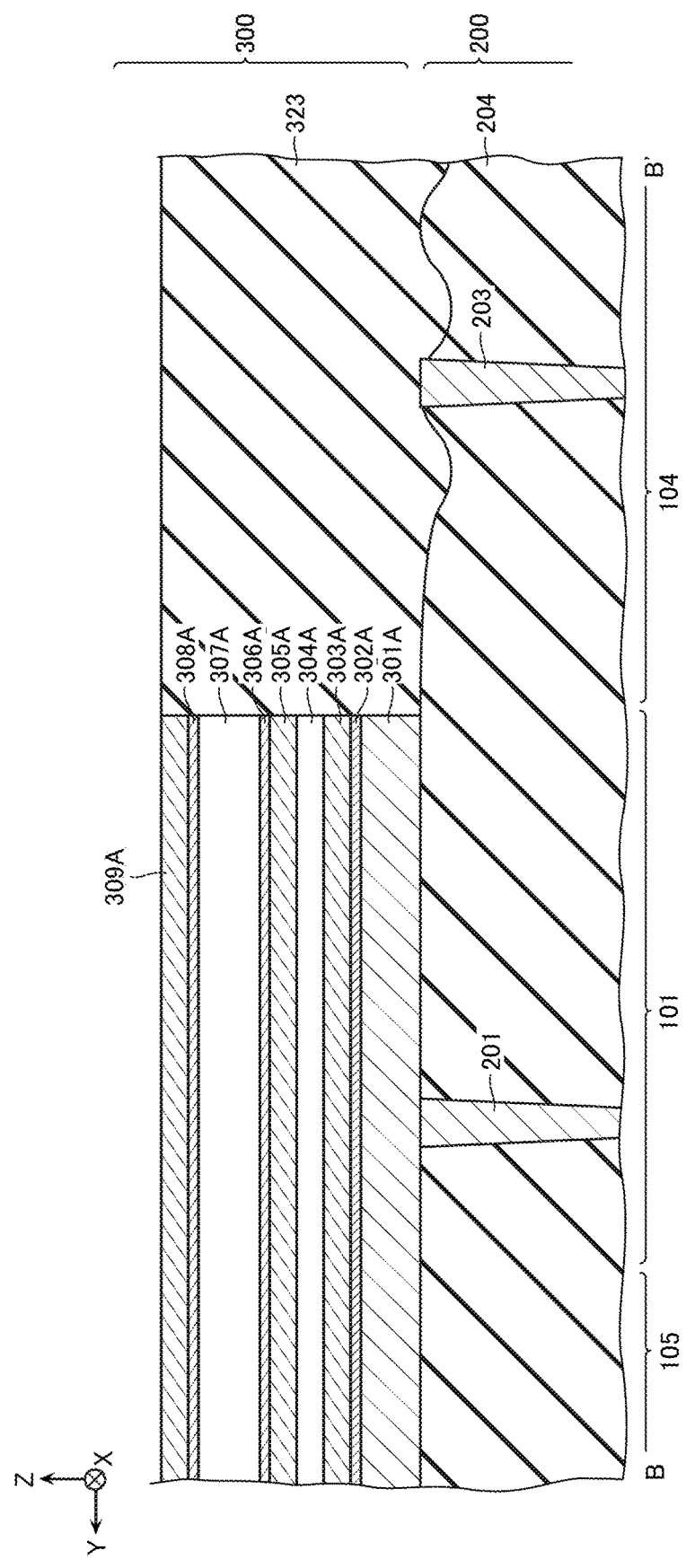
FIG. 30 is a schematic view illustrating the manufacturing method.

Next, for example, as illustrated in FIG. 29 and FIG. 30, the hard mask layers 501 and a part of the insulating layer 323 are removed to expose top surface of the electrode layer 309A. The process is performed by, for example, CMP or wet etching. After the process, for example, the contact wiring 312 (FIG. 5) may be formed.

Figure 32:
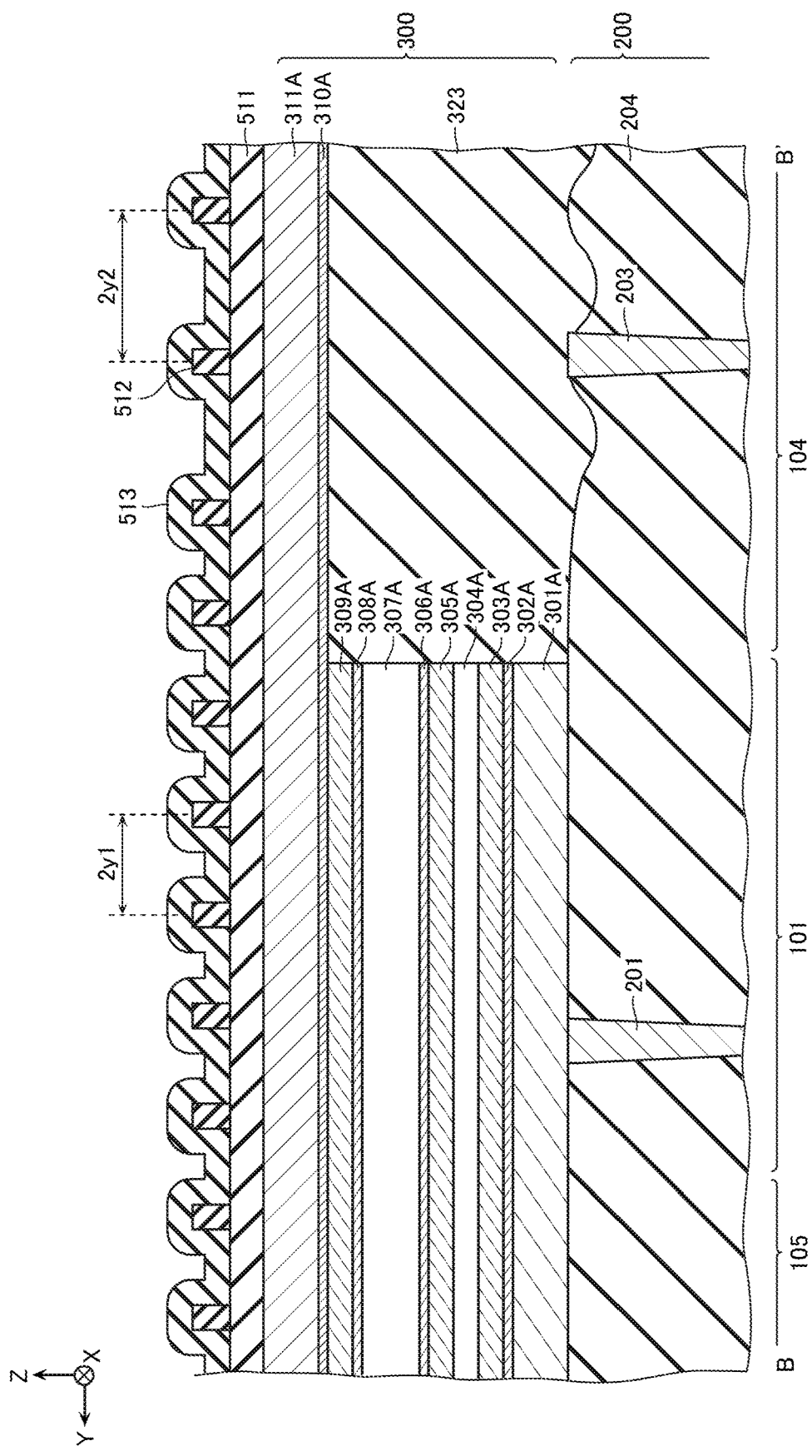
FIG. 32 is a schematic view illustrating the manufacturing method.

Next, for example, as illustrated in FIG. 32, on top surfaces of the electrode layer 309A and the insulating layer 323, a laminated body including a barrier conducting layer 310A forming the barrier conducting layer 310, a conducting layer 311A forming the conducting layer 311, and a hard mask layer 511, such as silicon nitride (SiN) is formed. The process is performed by, for example, PVD, such as sputtering.

Figure 31:
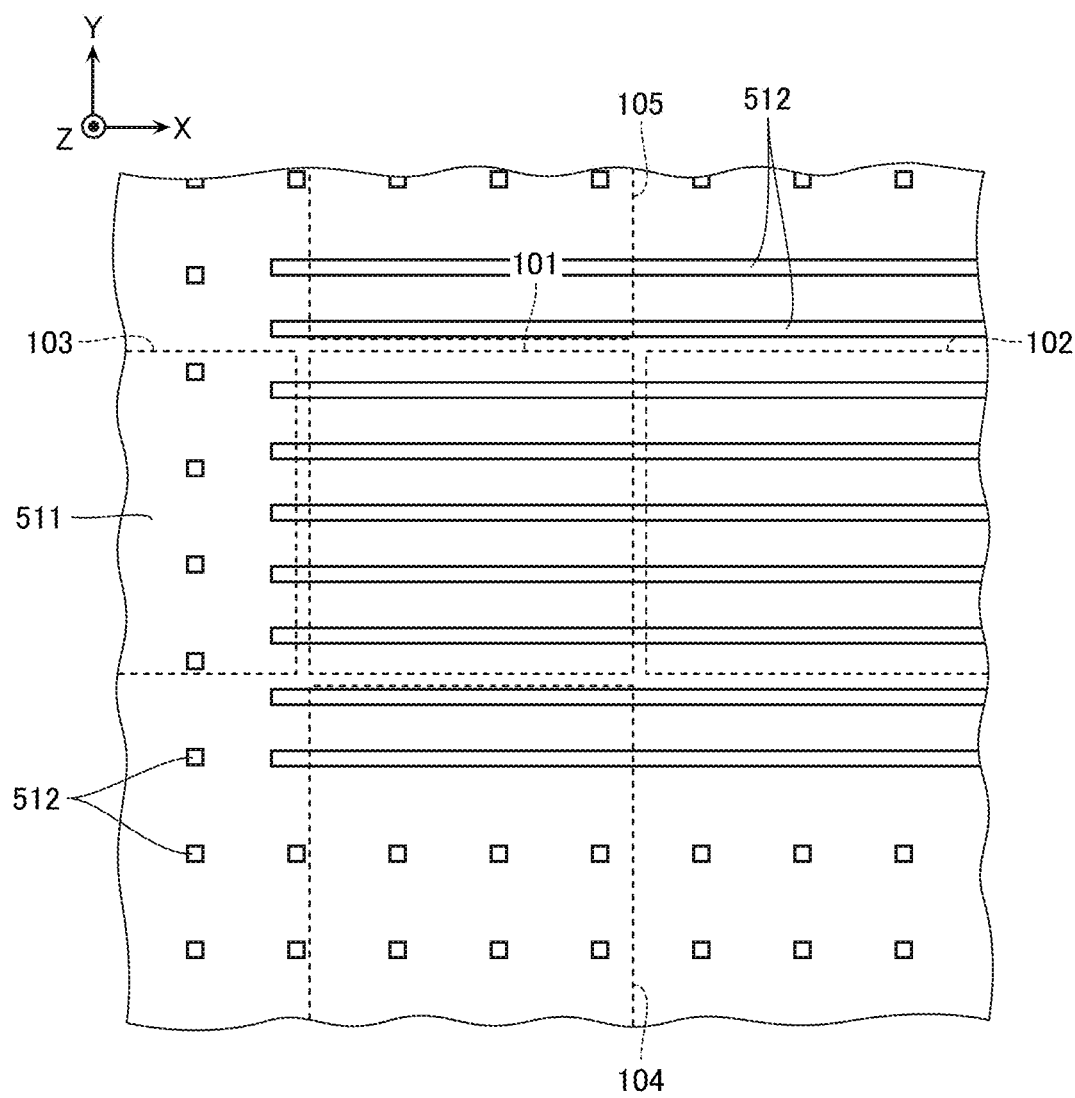
FIG. 31 is a schematic view illustrating the manufacturing method.

Next, for example, as illustrated in FIG. 31 and FIG. 32, the core materials 512, such as carbon (C), are formed on the top surface of the hard mask layer 511. The core materials 512, for example, extend in the X direction and arranged in the Y direction at a pitch $2y1$ in the area 101 and the area 102 and near the area 101 and the area 102 (a part of the area 103, a part of the area 104, and a part of the area 105). The core materials 512, for example, are arranged in the Y direction at a pitch $2y2$ and arranged in the X direction at predetermined pitch in areas away from the area 101 and the area 102 (a part of the area 103, a part of the area 104, and a part of the area 105).

Next, for example, as illustrated in FIG. 32, a hard mask layer 513, such as silicon oxide ($SiO_2$), is formed on the top surface of the hard mask layer 511, the side surfaces of the core materials 512, and the top surfaces of the core materials 512. The process is performed by, for example, CVD using a gas, such as TEOS.

Figure 33:
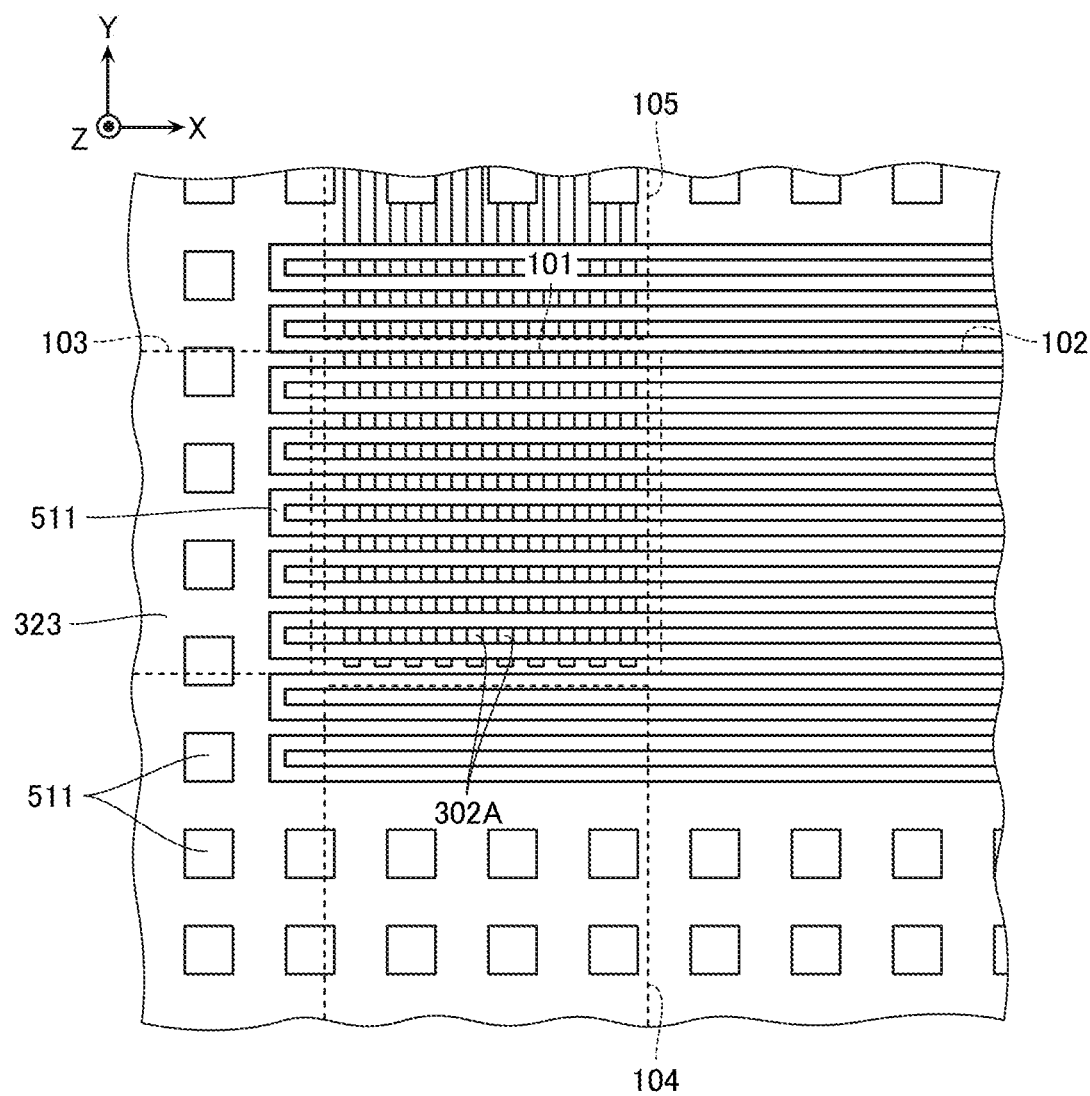
FIG. 33 is a schematic view illustrating the manufacturing method.
Figure 34:
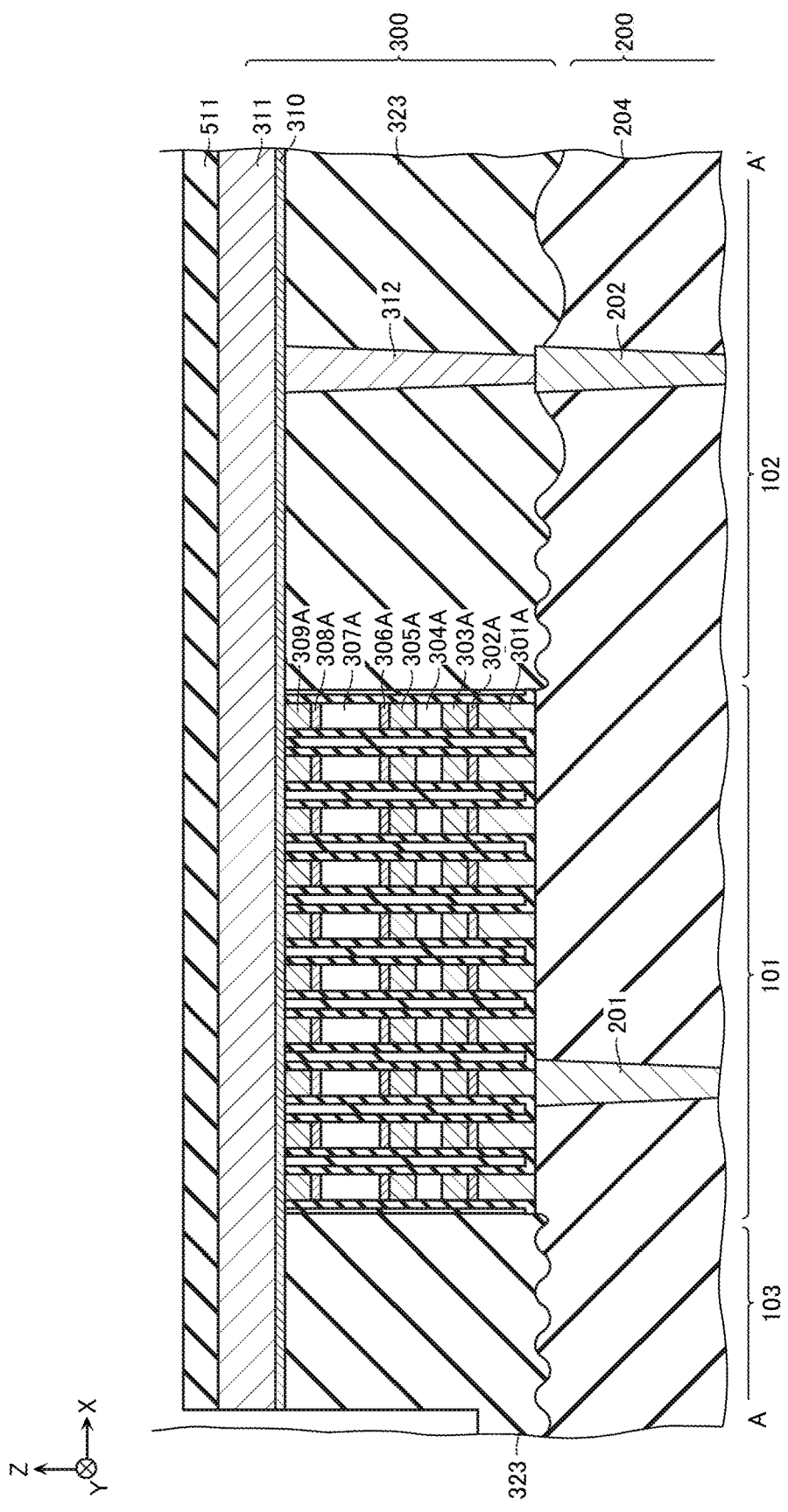
FIG. 34 is a schematic view illustrating the manufacturing method.
Figure 35:
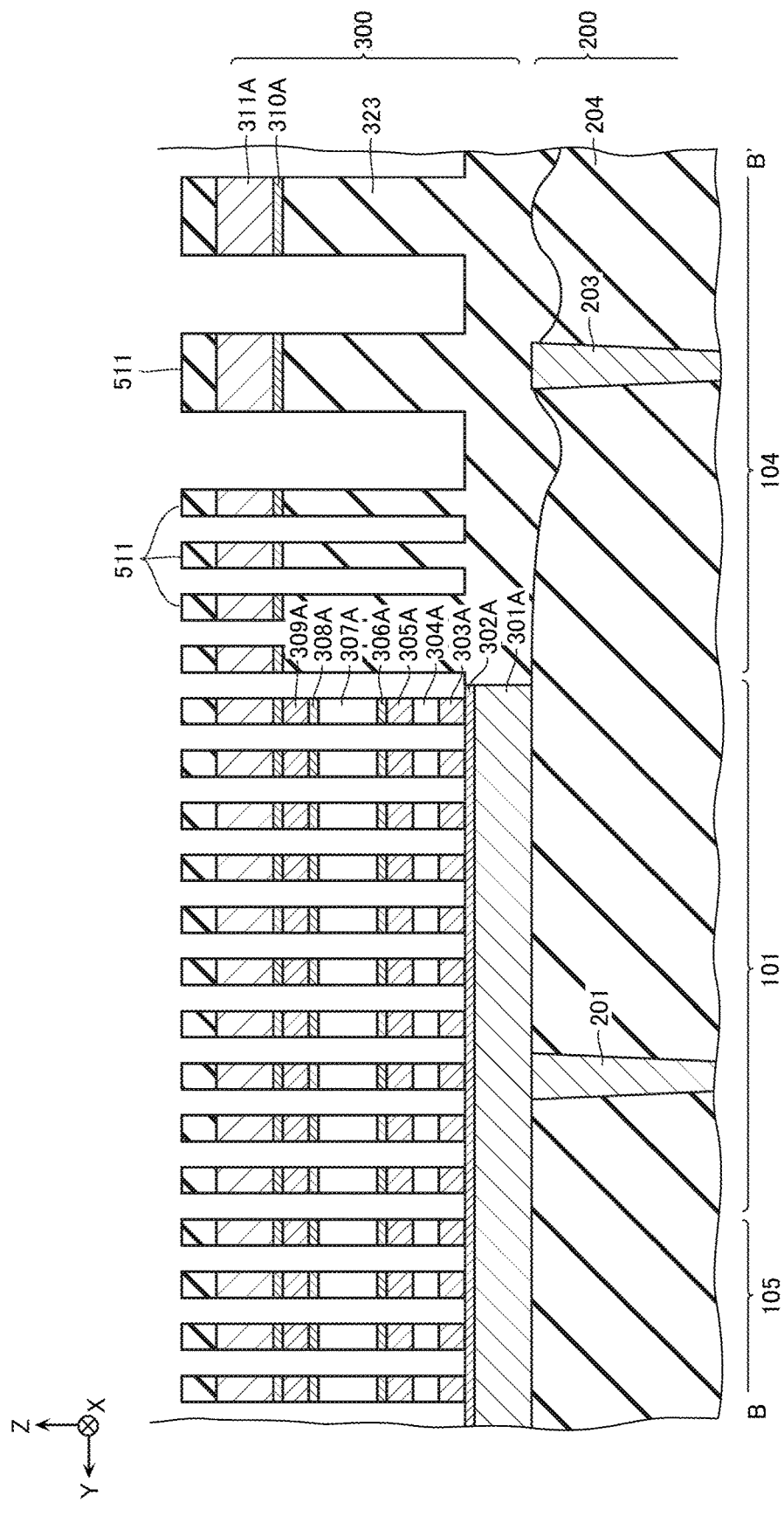
FIG. 35 is a schematic view illustrating the manufacturing method.

Next, for example, as illustrated in FIG. 33 to FIG. 35, the process similar to the process that has been described with reference to FIG. 12 to FIG. 18 is performed.

The process divides the hard mask layer 511 in the Y direction in the area 101 and the area 102, and near the area 101 and the area 102, thus forming a line and space pattern. Additionally, in the area away from the area 101 and the area 102, the hard mask layer 511 is divided in the X direction and the Y direction, thus forming an island-shaped pattern in which the hard mask layers 511 are arranged in a matrix.

Further, the process divides the electrode layer 303A, the chalcogen layer 304A, the electrode layer 305A, the barrier conducting layer 306A, the chalcogen layer 307A, the barrier conducting layer 308A, the electrode layer 309A, the barrier conducting layer 310A, and the conducting layer 311A in the X direction and the Y direction along the pattern formed on the hard mask layer 511. Note that the process removes core materials 512 and the hard mask layer 513 and at least a part of the hard mask layers 511 remain.

Figure 36:
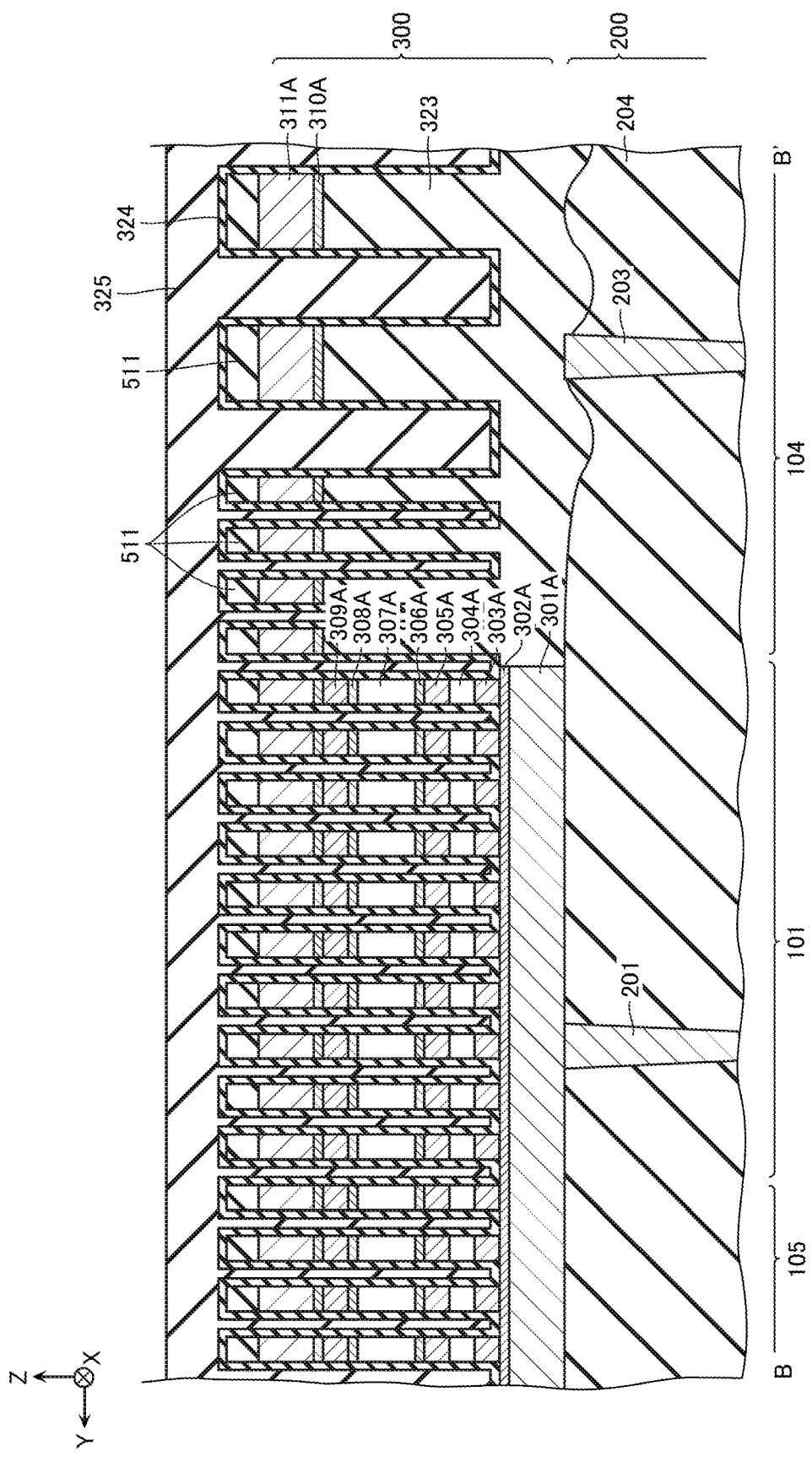
FIG. 36 is a schematic view illustrating the manufacturing method.

Next, for example, as illustrated in FIG. 36, the barrier insulating layer 324 is formed on the top surfaces of the barrier conducting layer 302A and the insulating layers 323, the top surfaces of the hard mask layers 511, and side surfaces in the Y direction of the electrode layers 303A, the chalcogen layers 304A, the electrode layers 305A, the barrier conducting layers 306A, the chalcogen layers 307A, the barrier conducting layers 308A, the electrode layers 309A, the barrier conducting layers 310A, the conducting layers 311A, and the hard mask layers 511. Further, the insulating layer 325 is formed. The insulating layer 325 is formed by, for example, applying a polysilazane or the like on the wafer by means, such as spin coat, and performing a heat treatment or the like.

Figure 37:
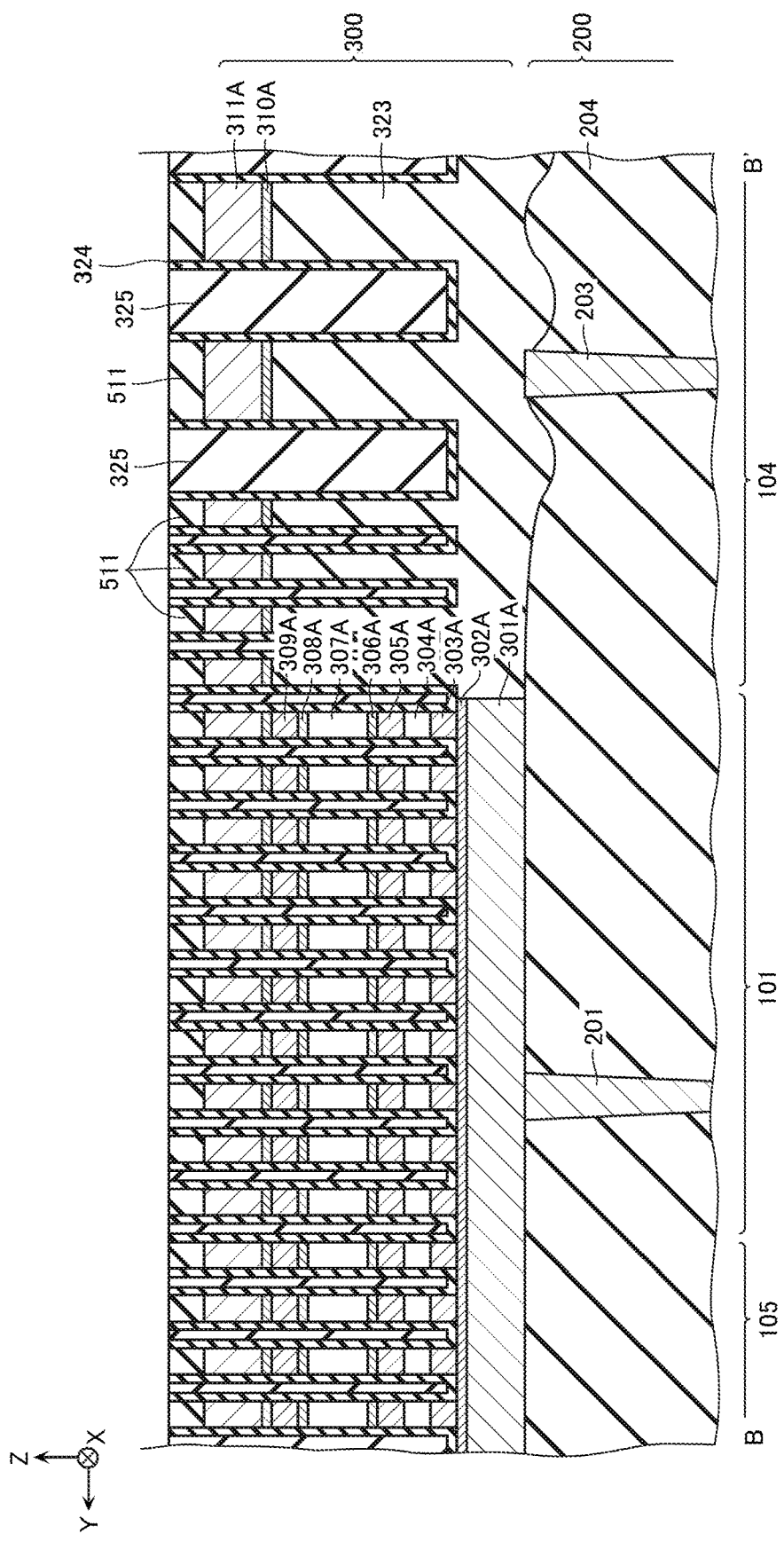
FIG. 37 is a schematic view illustrating the manufacturing method.

Next, for example, as illustrated in FIG. 37, a part of the insulating layer 325 is removed to expose the top surfaces of the hard mask layers 511. The process is, for example, performed by flattening process, such as CMP, using the hard mask layers 511 as stoppers.

Figure 38:
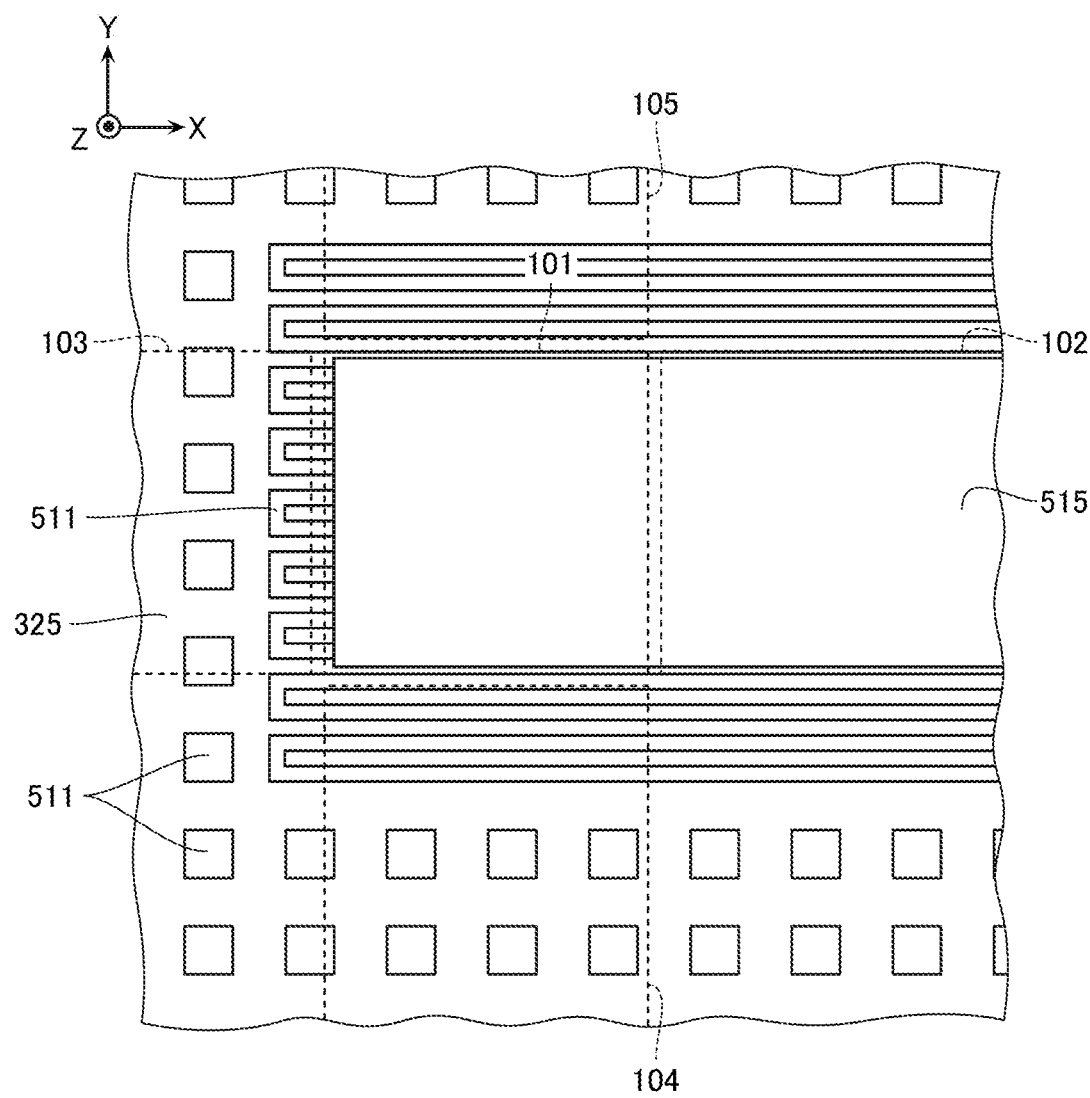
FIG. 38 is a schematic view illustrating the manufacturing method.
Figure 39:
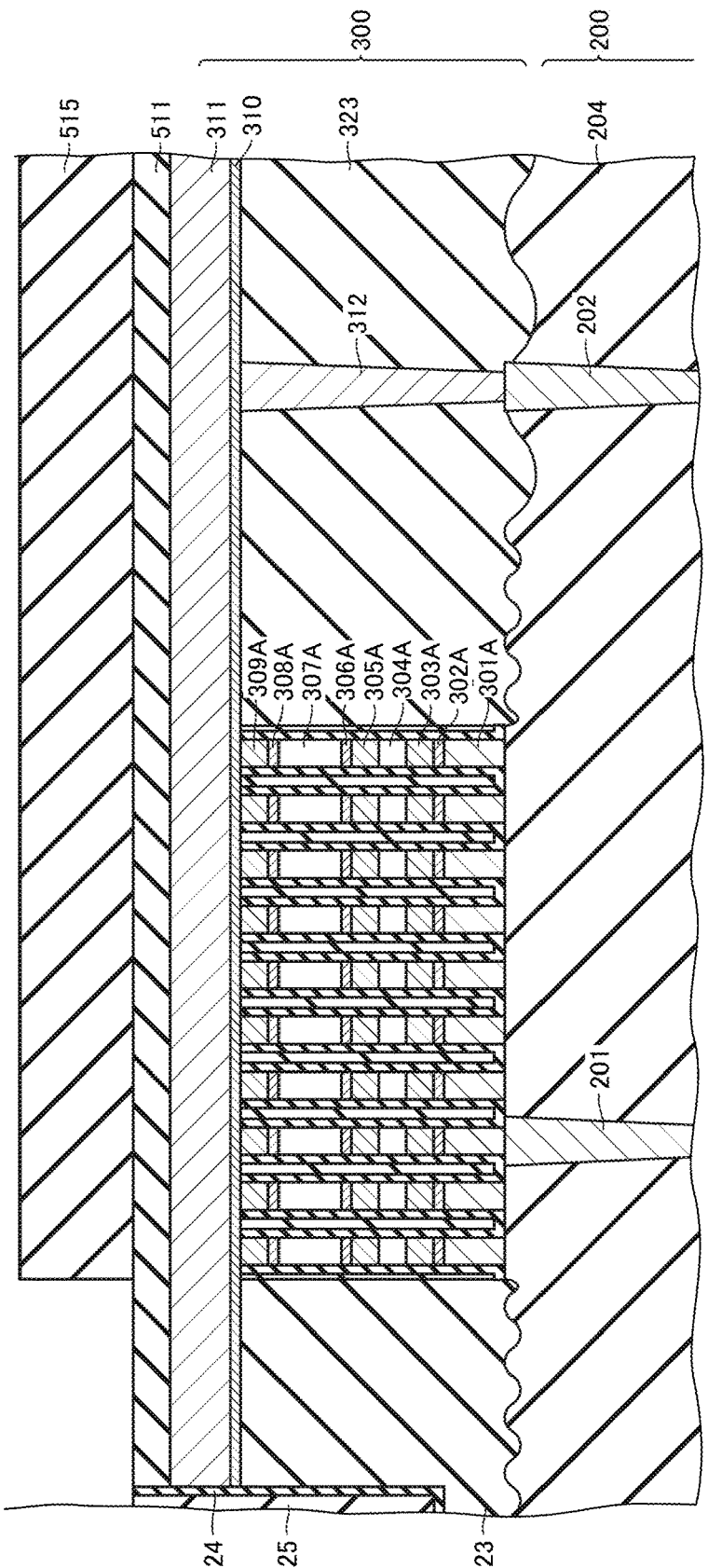
FIG. 39 is a schematic view illustrating the manufacturing method.
Figure 40:
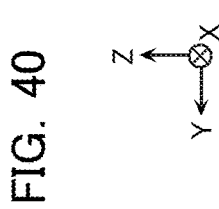
FIG. 40 is a schematic view illustrating the manufacturing method.

Next, for example, as illustrated in FIG. 38 to FIG. 40, a mask material 515 that covers the area 101 and the area 102 is formed.

Figure 41:
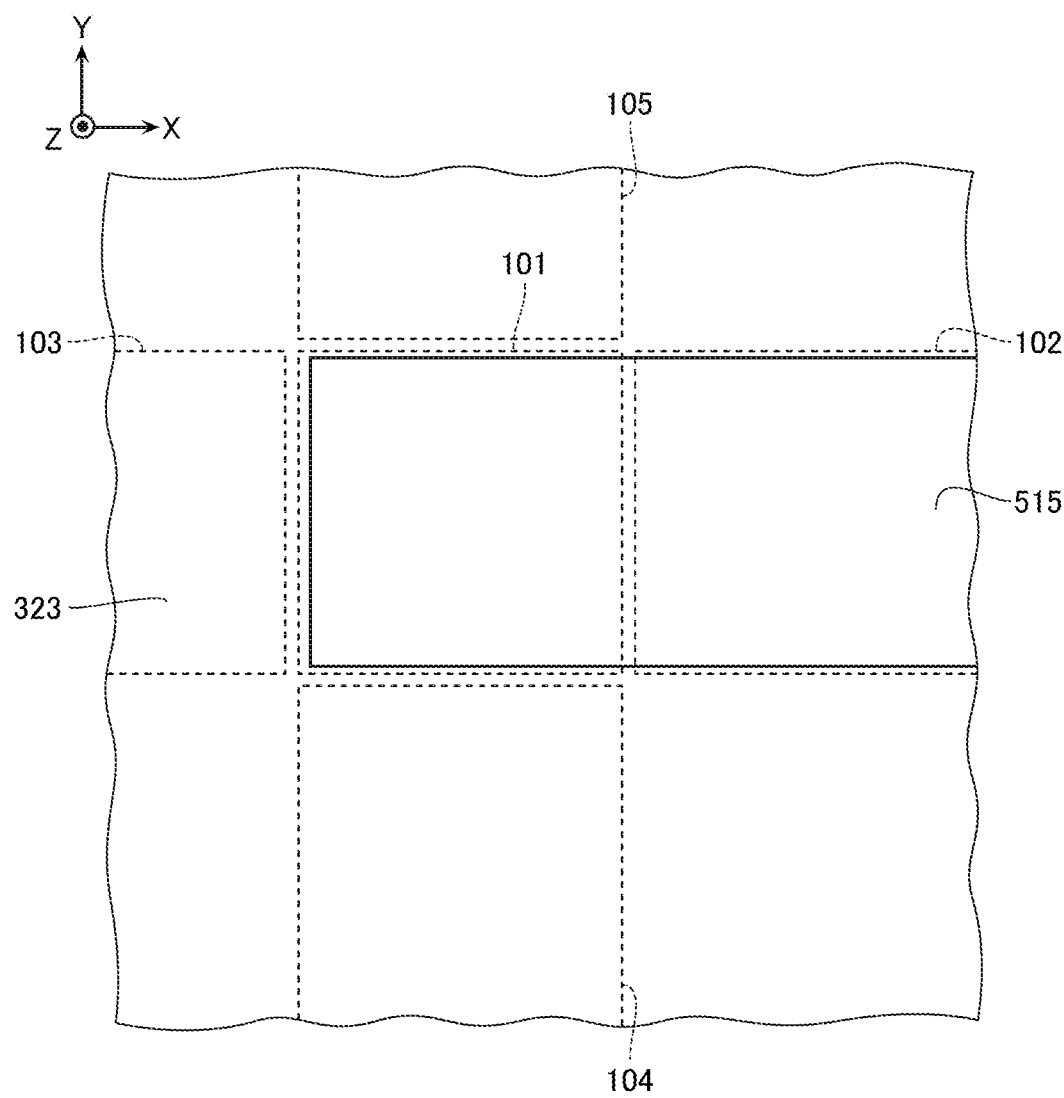
FIG. 41 is a schematic view illustrating the manufacturing method.
Figure 42:
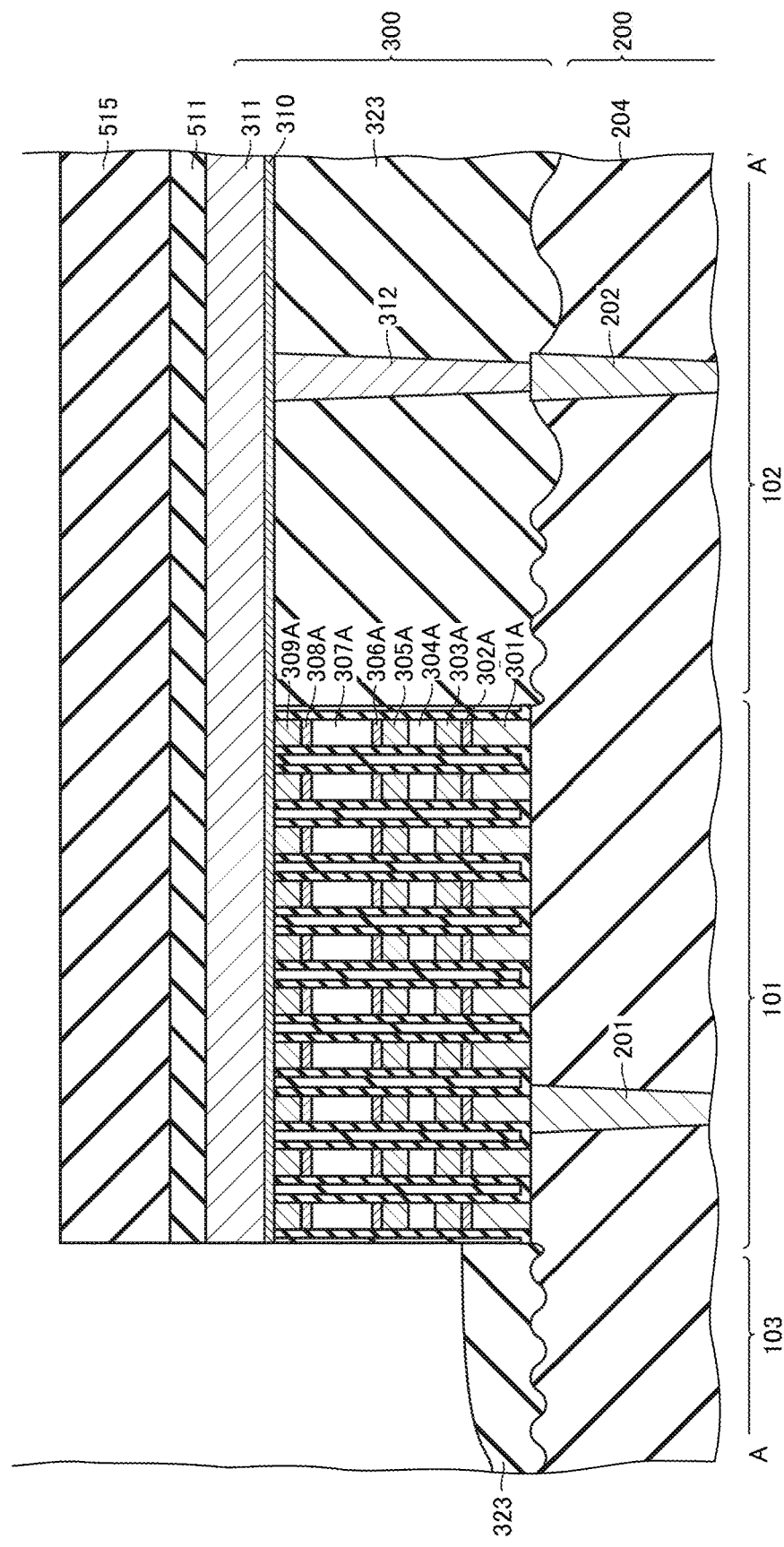
FIG. 42 is a schematic view illustrating the manufacturing method.
Figure 43:
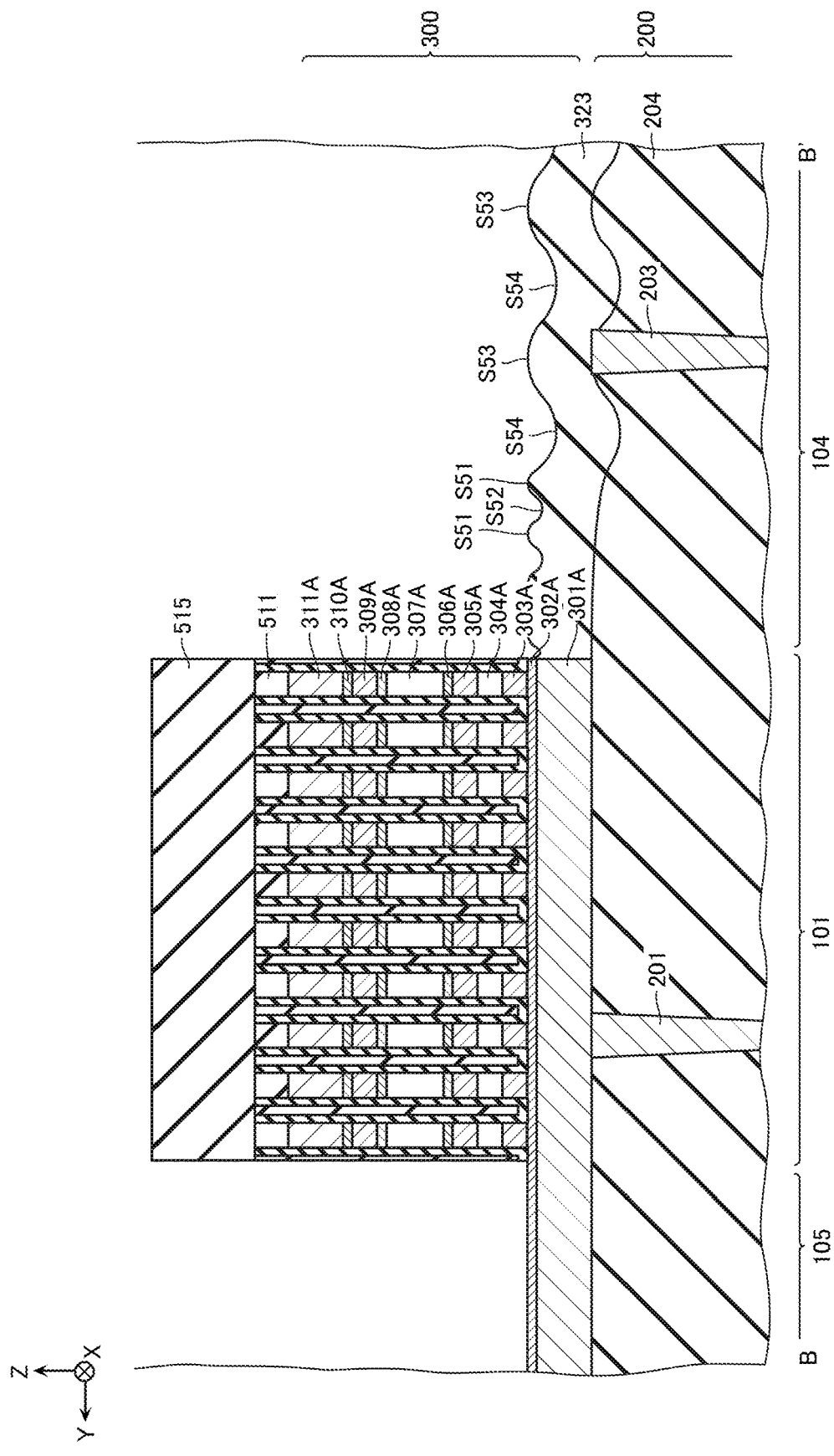
FIG. 43 is a schematic view illustrating the manufacturing method.

Next, for example, as illustrated in FIG. 41 to FIG. 43, the configuration formed on the insulating layer 323 in the area 103, the area 104, and the area 105 is removed. The process is performed by, for example, anisotropic etching, such as RIE, that uses the mask material 515 as a mask. Note that an etching rate differs between a structure including the hard mask layers 511 and the like and the insulating layers 422 in some cases. In this case, for example, as illustrated in FIG. 43, the protruding surfaces S51 and the recessed surfaces S52 are formed on the top surface of the insulating layer 323 in near the area 101 and the area 102 (a position corresponding to the line and space pattern) in some cases. Additionally, the protruding surfaces S53 and the recessed surfaces S54 are formed on the top surface of the insulating layer 323 in an area away from the area 101 and the area 102 (a position corresponding to the island-shaped pattern) in some cases. Afterwards, the mask material 515 is removed.

Figure 44:
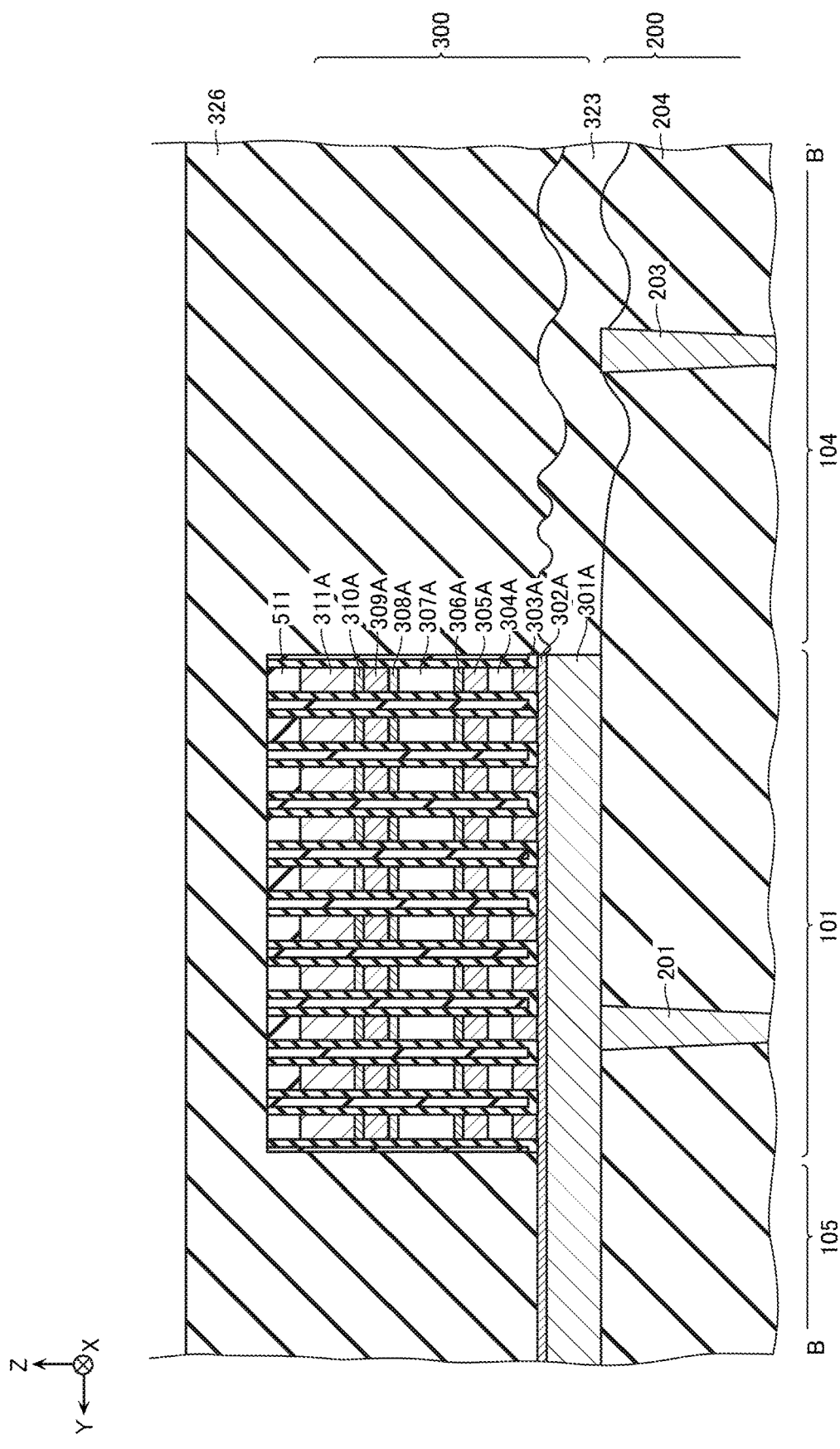
FIG. 44 is a schematic view illustrating the manufacturing method.

Next, for example, as illustrated in FIG. 44, the insulating layer 326 is formed. The process is performed by, for example, CVD using a gas, such as TEOS.

Figure 45:
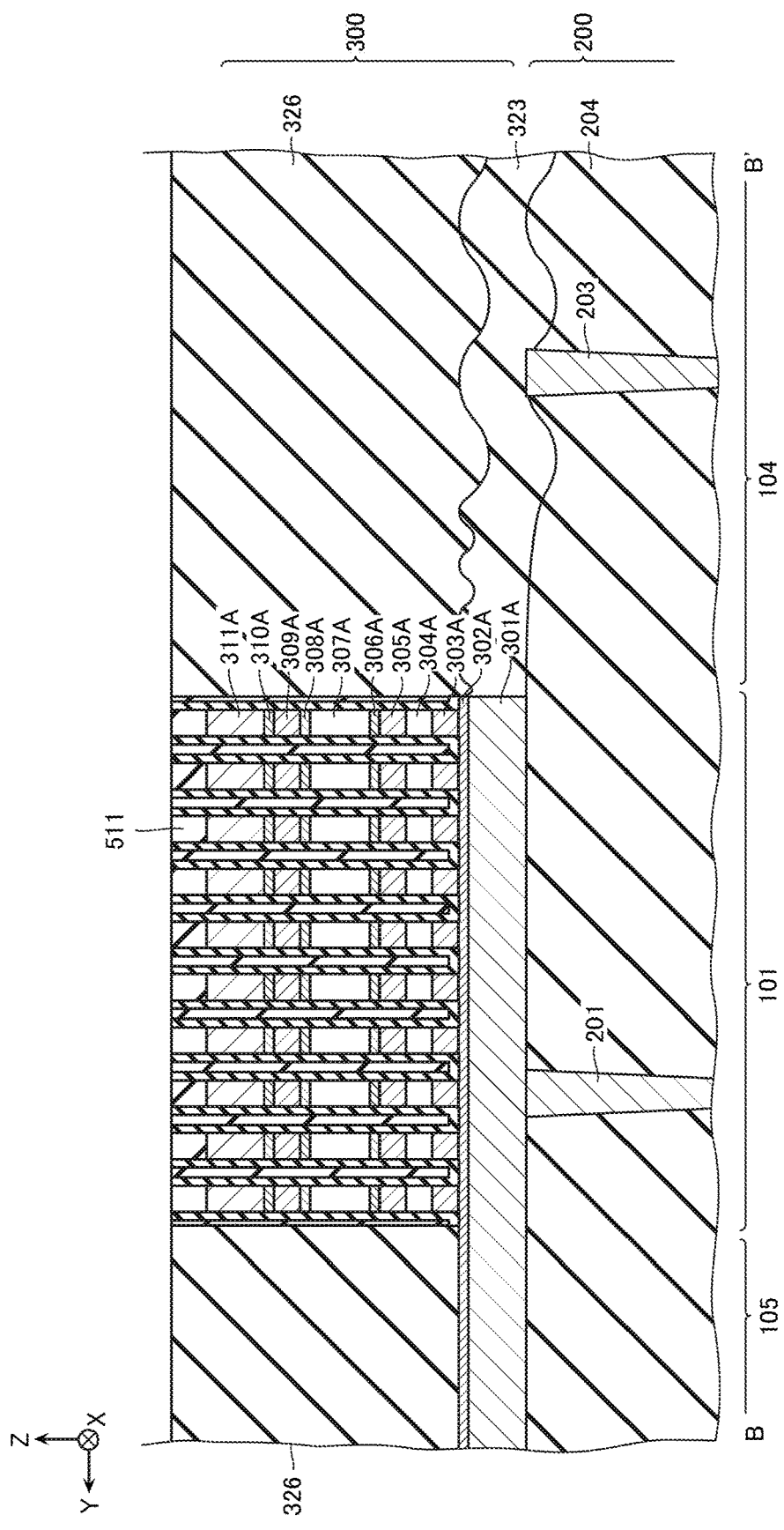
FIG. 45 is a schematic view illustrating the manufacturing method.

Next, for example, as illustrated in FIG. 45, a part of the insulating layer 326 is removed to expose the top surfaces of the hard mask layers 511. The process is, for example, performed by flattening process, such as CMP, using the hard mask layers 511 as stoppers.

Figure 46:
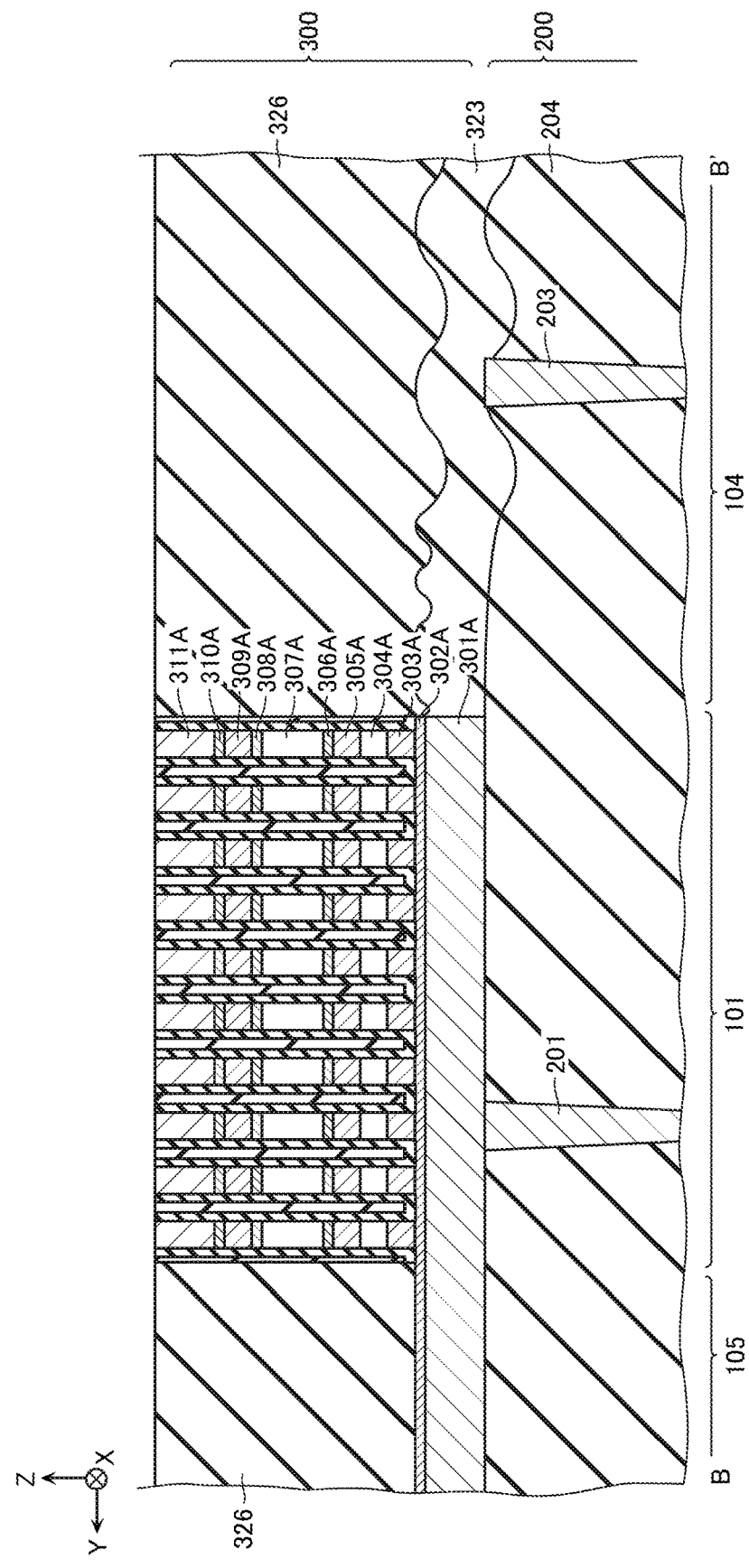
FIG. 46 is a schematic view illustrating the manufacturing method.

Next, for example, as illustrated in FIG. 46, a part of the hard mask layers 511 and the insulating layer 326 are removed to expose top surfaces of the conducting layers 311A. The process is performed by, for example, CMP or wet etching.

Figure 48:
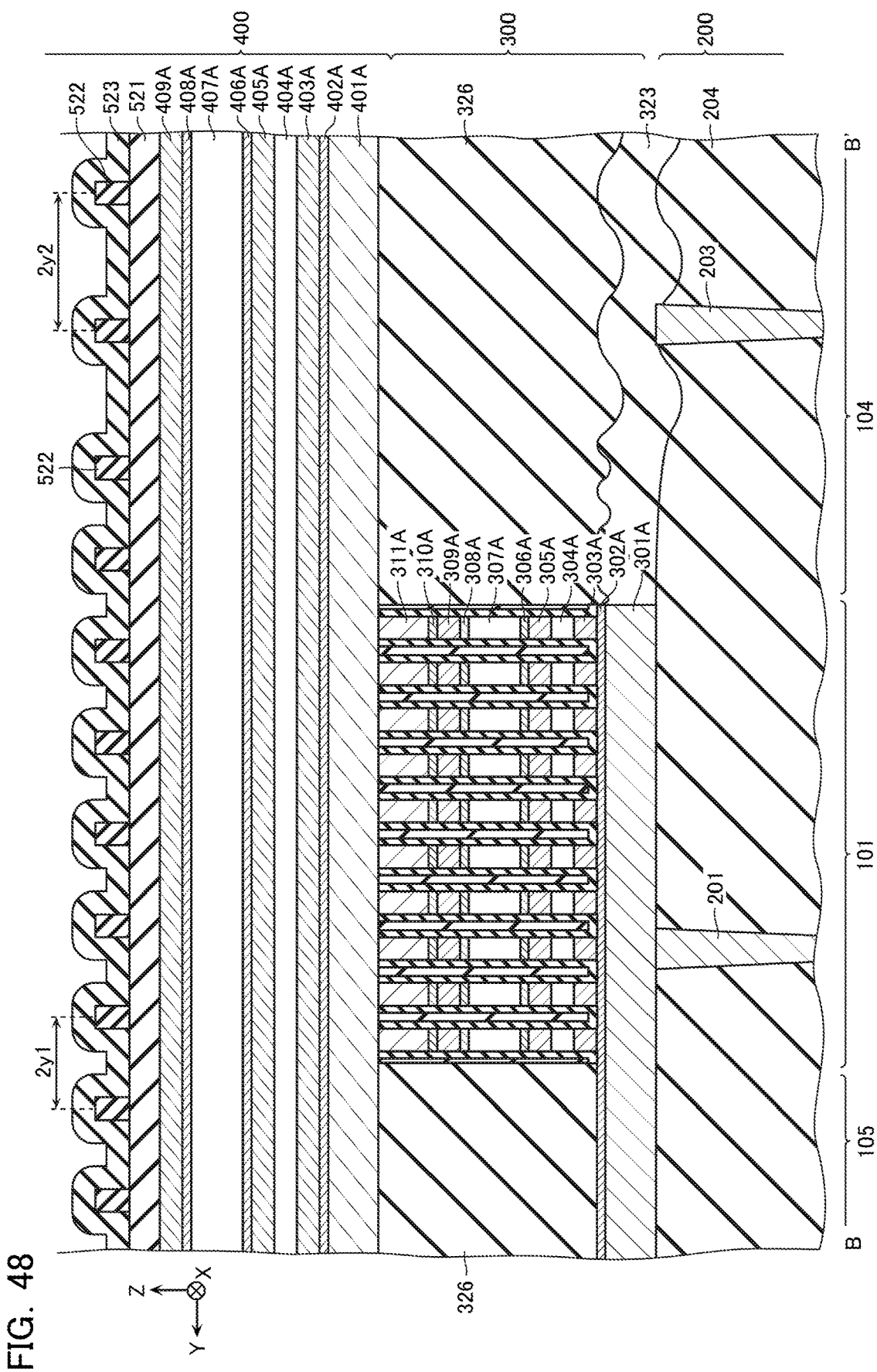
FIG. 48 is a schematic view illustrating the manufacturing method.

Next, for example, as illustrated in FIG. 48, on top surfaces of the conducting layers 311A and the insulating layer 326, a laminated body including a conducting layer 401A forming the conducting layer 401, a barrier conducting layer 402A forming the barrier conducting layer 402, an electrode layer 403A forming the electrode layer 403, a chalcogen layer 404A forming the chalcogen layer 404, an electrode layer 405A forming the electrode layer 405, a barrier conducting layer 406A forming the barrier conducting layer 406, a chalcogen layer 407A (variable resistance layer) forming the chalcogen layer 407, a barrier conducting layer 408A forming the barrier conducting layer 408, an electrode layer 409A forming the electrode layer 409, and a hard mask layer 521, such as silicon nitride (SiN), is formed. The process is performed by, for example, PVD, such as sputtering.

Figure 47:
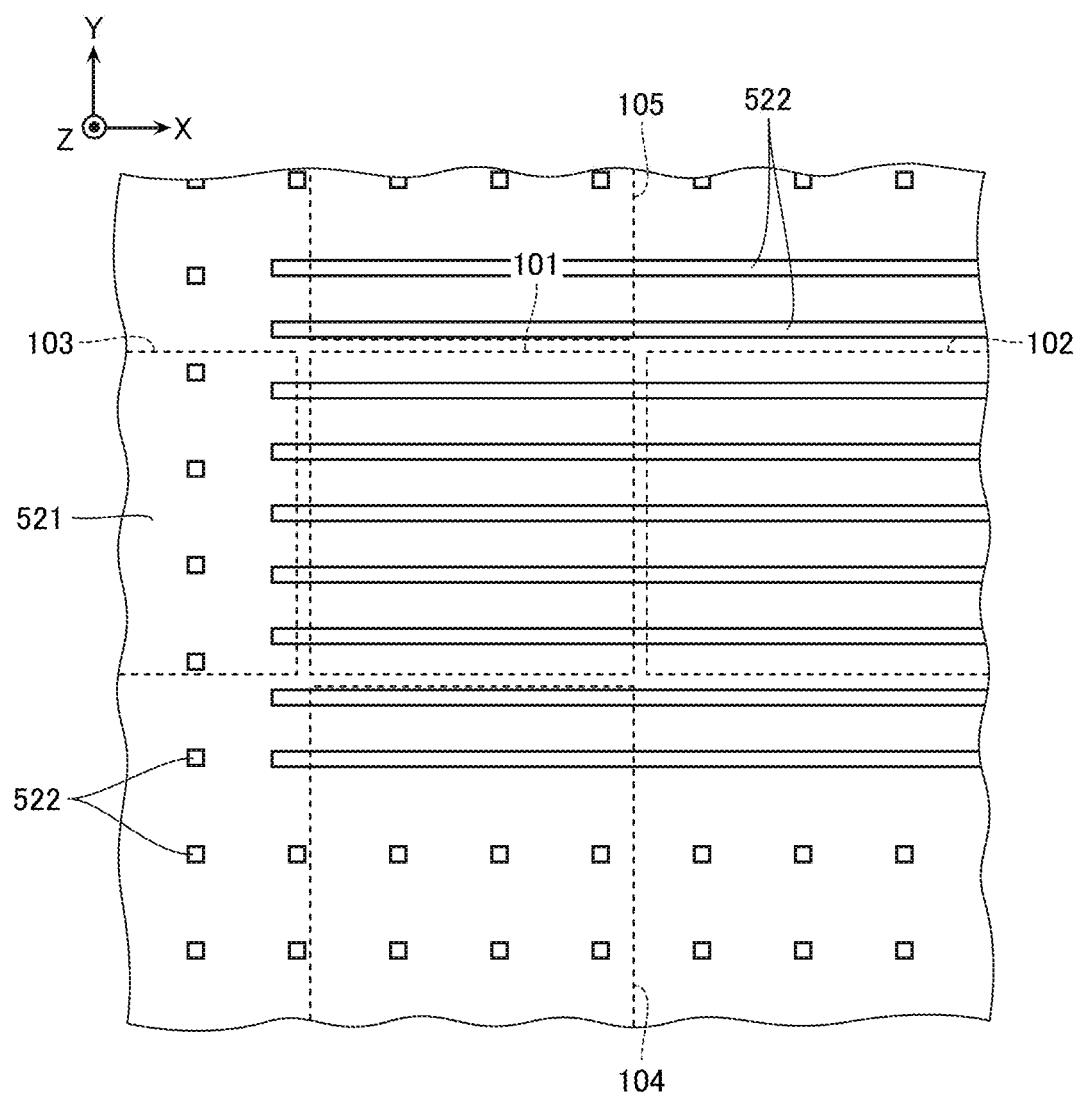
FIG. 47 is a schematic view illustrating the manufacturing method.

Next, for example, as illustrated in FIG. 47 and FIG. 48, core materials 522, such as carbon (C), are formed on the top surface of the hard mask layer 521. The core materials 522, for example, extend in the X direction and are arranged in the Y direction at the pitch $2y1$ in the area 101 and the area 102 and near the area 101 and the area 102 (a part of the area 103, a part of the area 104, and a part of the area 105). The core materials 522, for example, are arranged in the Y direction at the pitch $2y2$ and arranged in the X direction at predetermined pitch in an area away from the area 101 and the area 102 (a part of the area 103, a part of the area 104, and a part of the area 105).

Next, for example, as illustrated in FIG. 48, on the top surface of the hard mask layer 521, the side surfaces of the core materials 522, and the top surfaces of the core materials 522, a hard mask layer 523, such as silicon oxide ($SiO_2$), is formed. The process is performed by, for example, CVD using a gas, such as TEOS.

Figure 49:
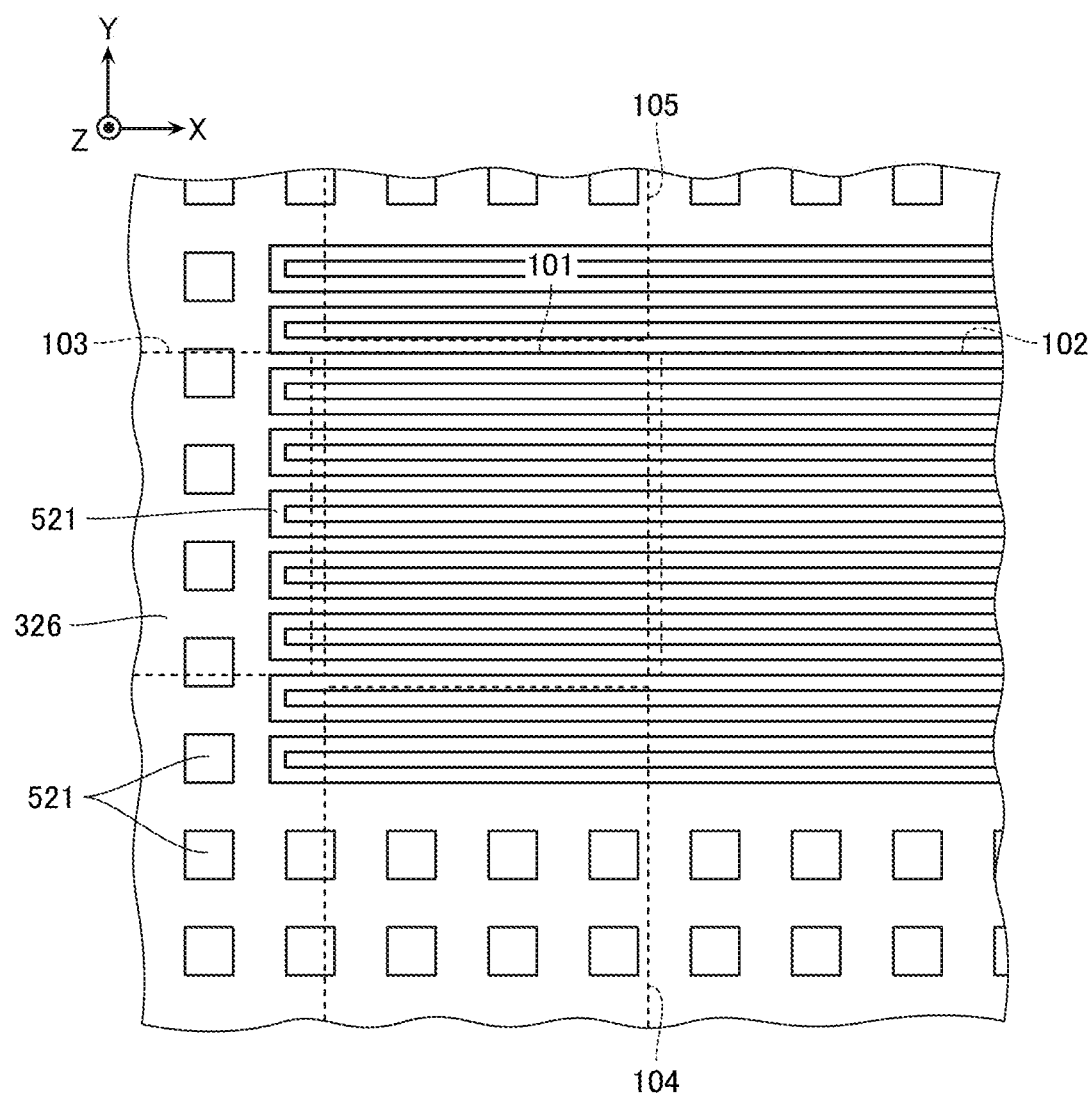
FIG. 49 is a schematic view illustrating the manufacturing method.
Figure 50:
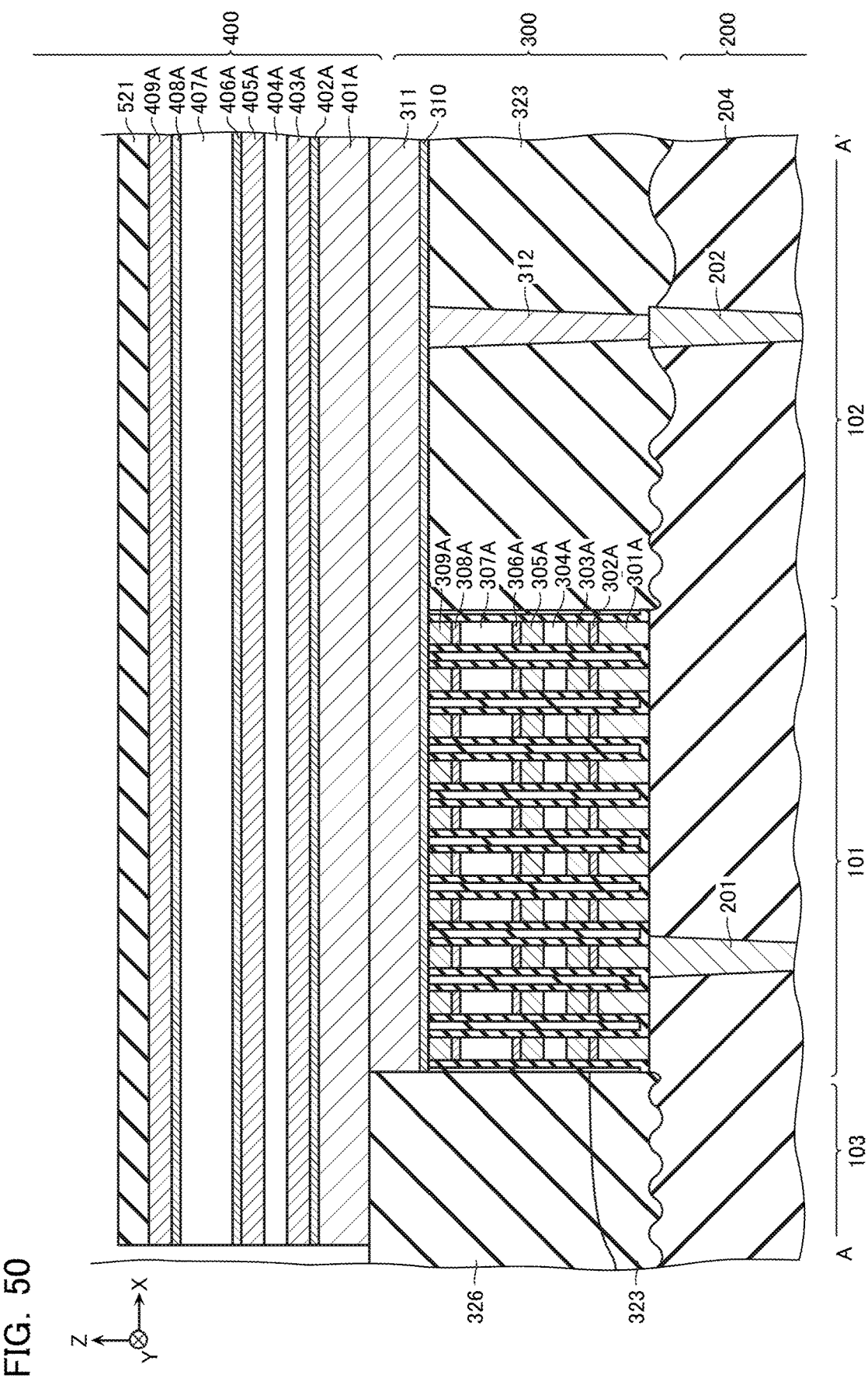
FIG. 50 is a schematic view illustrating the manufacturing method.
Figure 51:
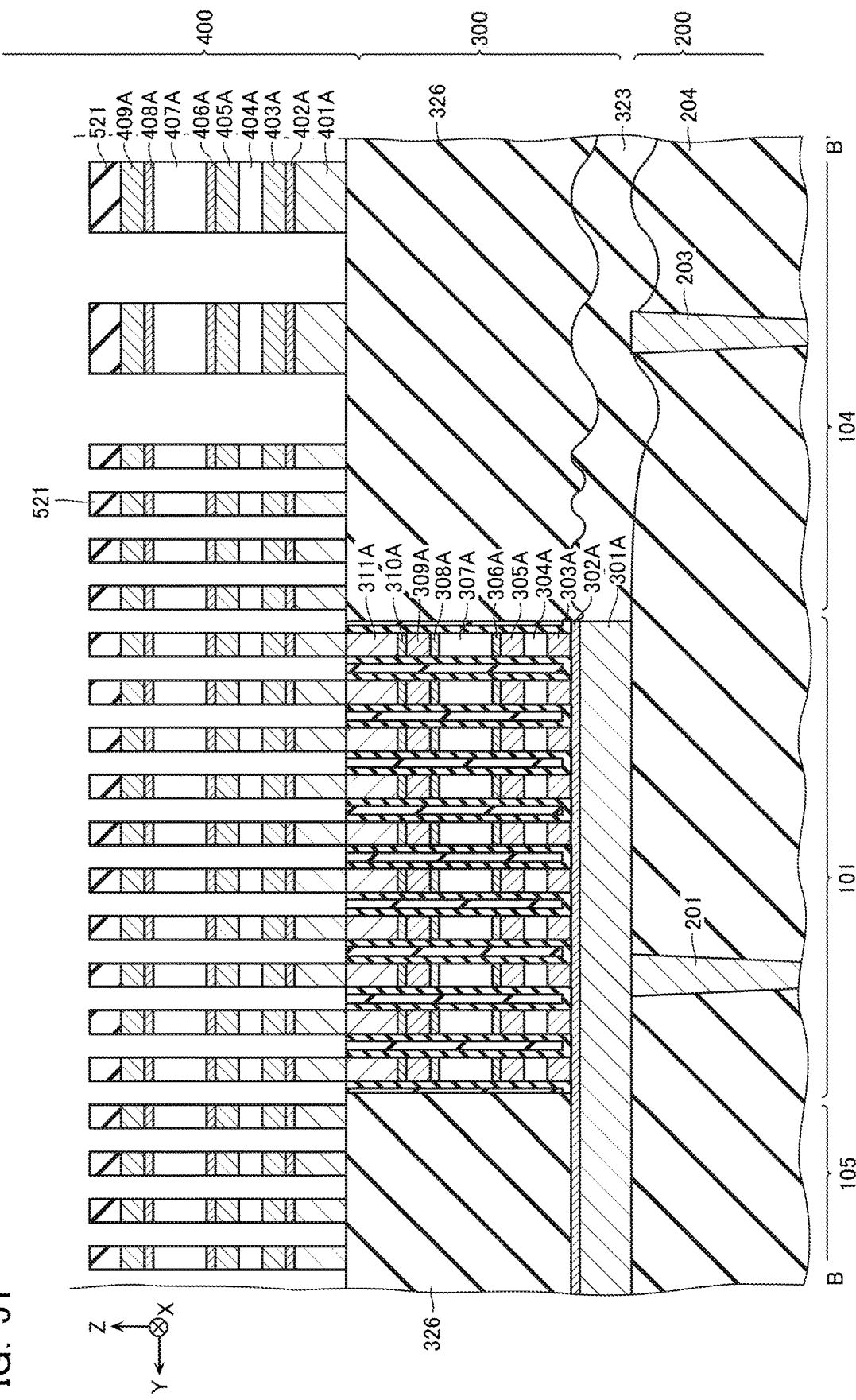
FIG. 51 is a schematic view illustrating the manufacturing method.

Next, for example, as illustrated in FIG. 49 to FIG. 51, the process similar to the process that has been described with reference to FIG. 12 to FIG. 18 is performed.

The process divides the hard mask layer 521 in the Y direction in the area 101 and the area 102 and near the area 101 and the area 102, thus forming a line and space pattern. Additionally, in the area away from the area 101 and the area 102, the hard mask layer 521 is divided in the X direction and the Y direction, thus forming an island-shaped pattern in which the hard mask layers 521 are arranged in a matrix.

Further, the process divides the conducting layer 401A, the barrier conducting layer 402A, the electrode layer 403A, the chalcogen layer 404A, the electrode layer 405A, the barrier conducting layer 406A, the chalcogen layer 407A, the barrier conducting layer 408A, and the electrode layer 409A in the X direction and the Y direction along the pattern formed on the hard mask layer 521. Note that the process removes the core materials 522 and the hard mask layers 523 and at least a part of the hard mask layers 521 remain.

Figure 52:
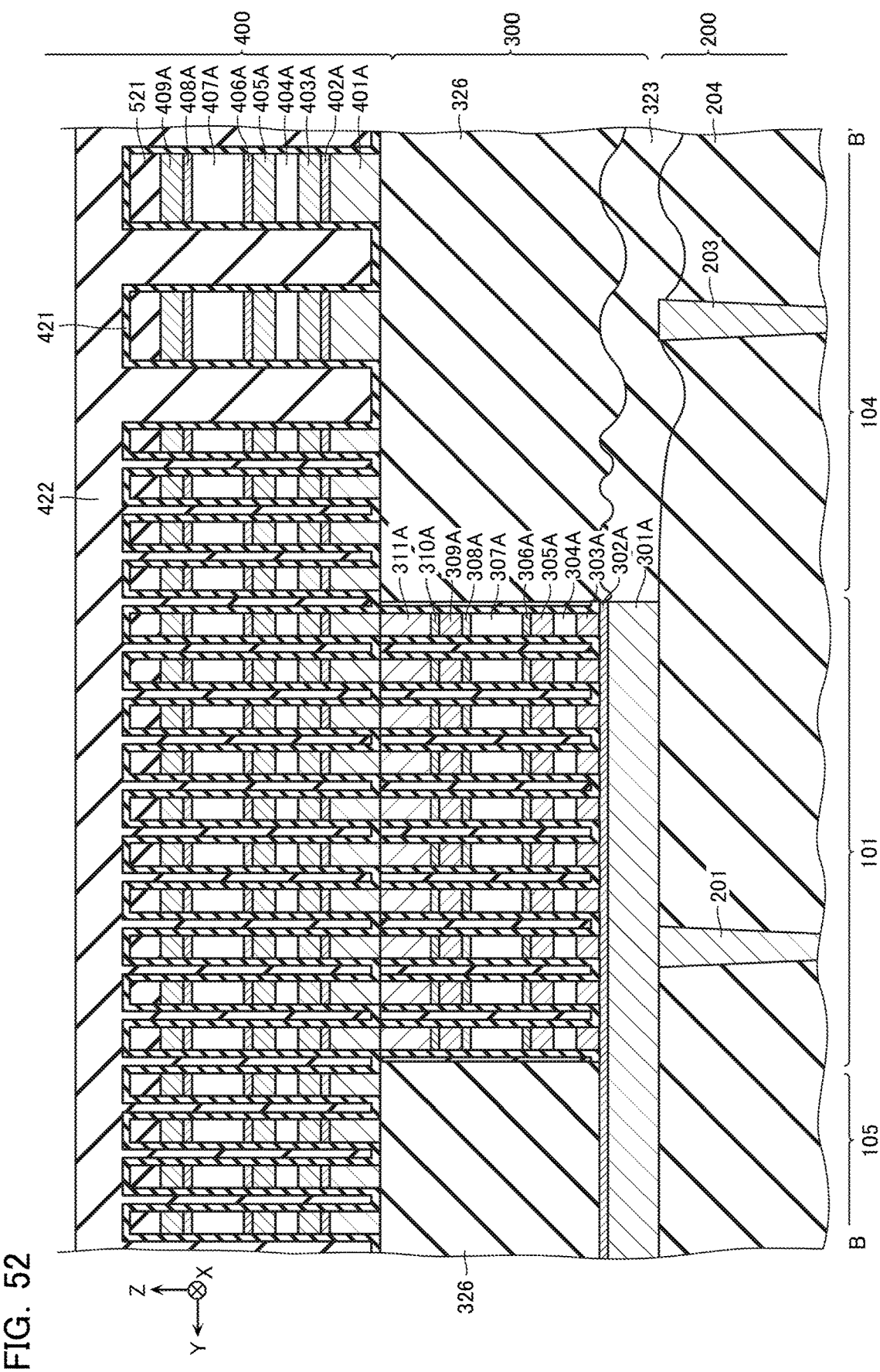
FIG. 52 is a schematic view illustrating the manufacturing method.

Next, for example, as illustrated in FIG. 52, the barrier insulating layer 421 is formed on the top surface of the insulating layer 326, top surfaces of the hard mask layers 521, and side surfaces in the Y direction of the conducting layers 401A, the barrier conducting layers 402A, the electrode layers 403A, the chalcogen layers 404A, the electrode layers 405A, the barrier conducting layers 406A, the chalcogen layers 407A, the barrier conducting layers 408A, the electrode layers 409A, and the hard mask layers 521. Additionally, the insulating layer 422 is formed. The insulating layer 422 is formed by, for example, applying a polysilazane or the like on the wafer by means, such as spin coat, and performing a heat treatment or the like.

Figure 53:
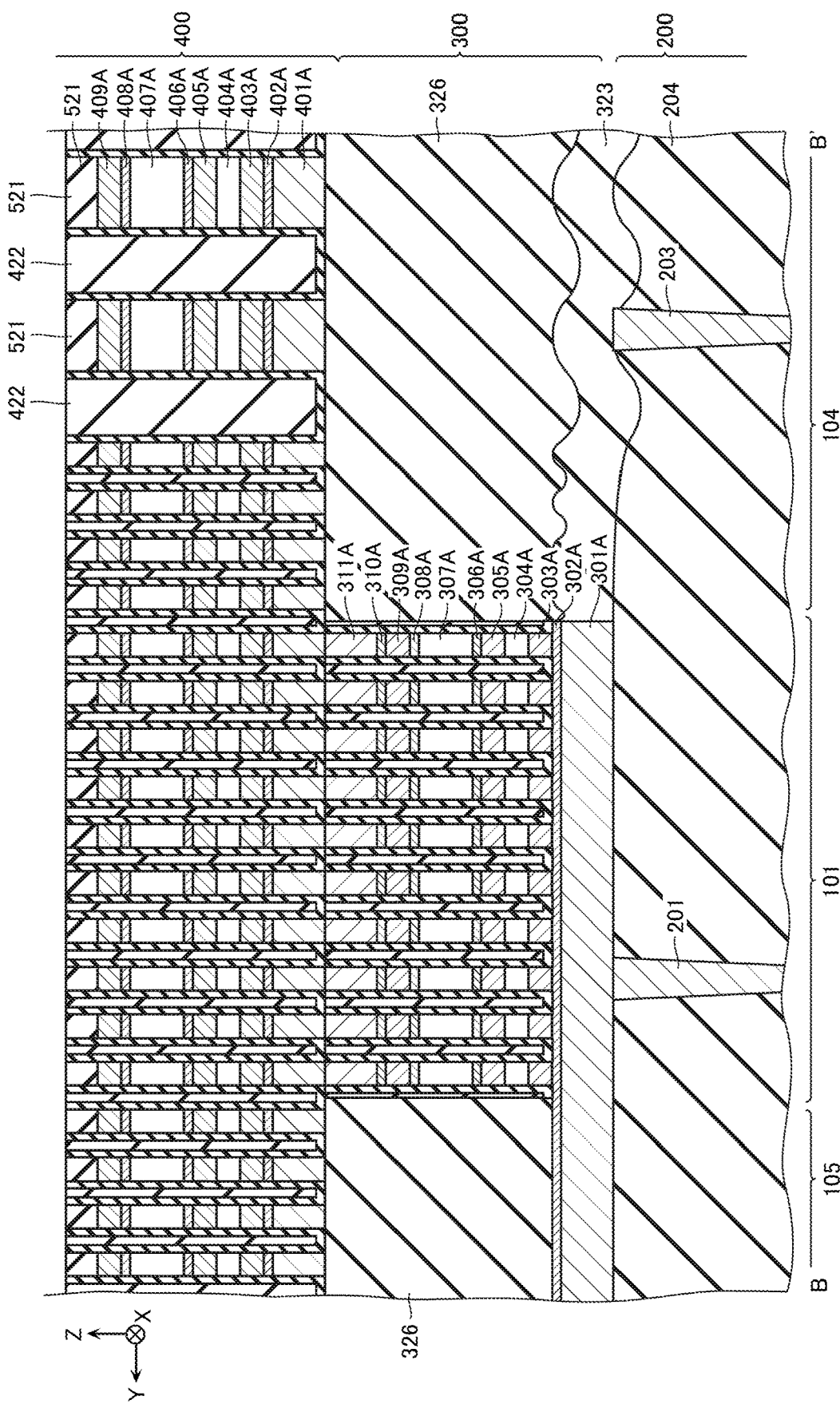
FIG. 53 is a schematic view illustrating the manufacturing method.

Next, for example, as illustrated in FIG. 53, a part of the insulating layer 422 is removed to expose the top surfaces of the hard mask layers 521. The process is, for example, performed by flattening process, such as CMP, using the hard mask layers 521 as stoppers.

Figure 54:
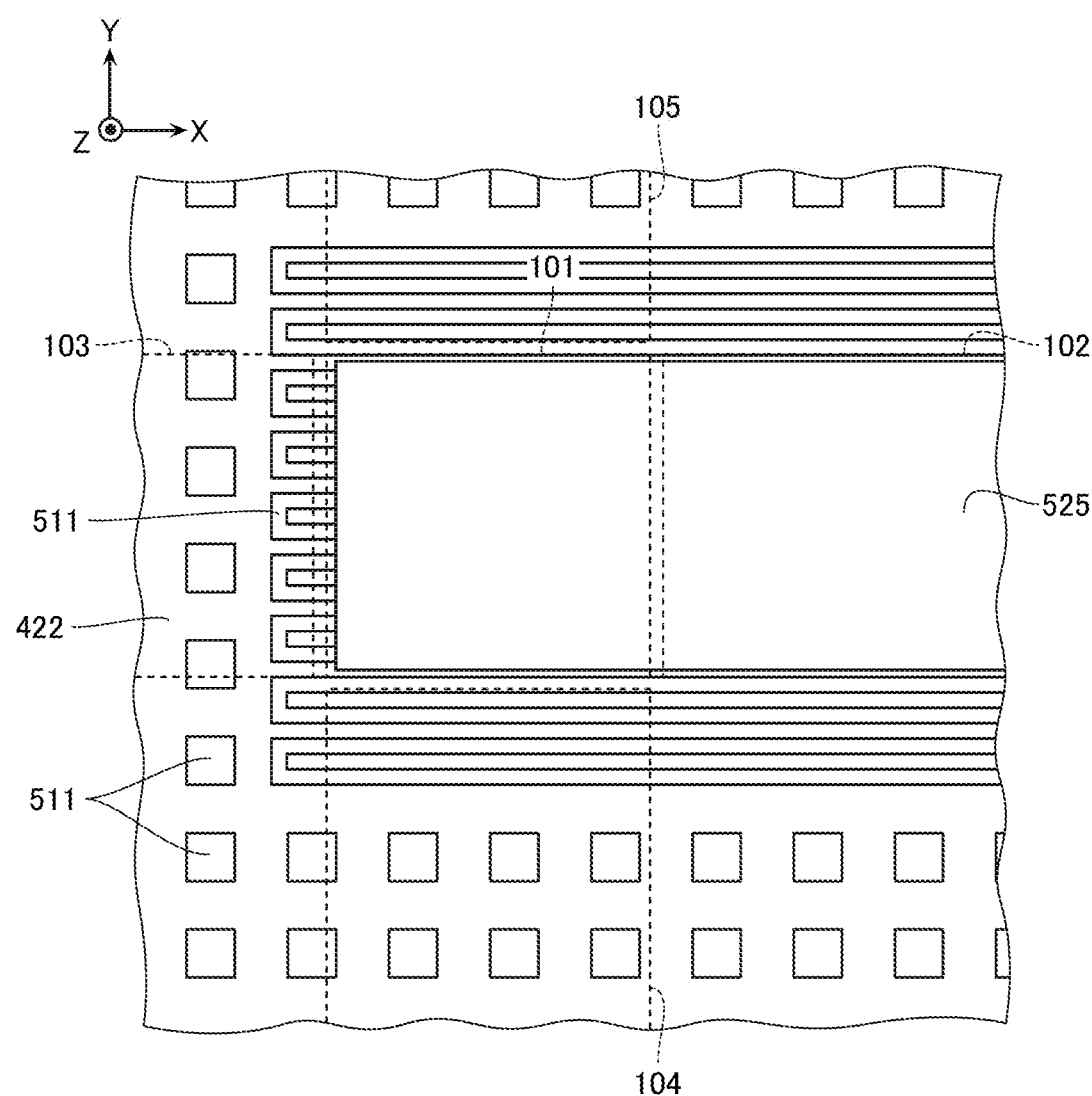
FIG. 54 is a schematic view illustrating the manufacturing method.
Figure 55:
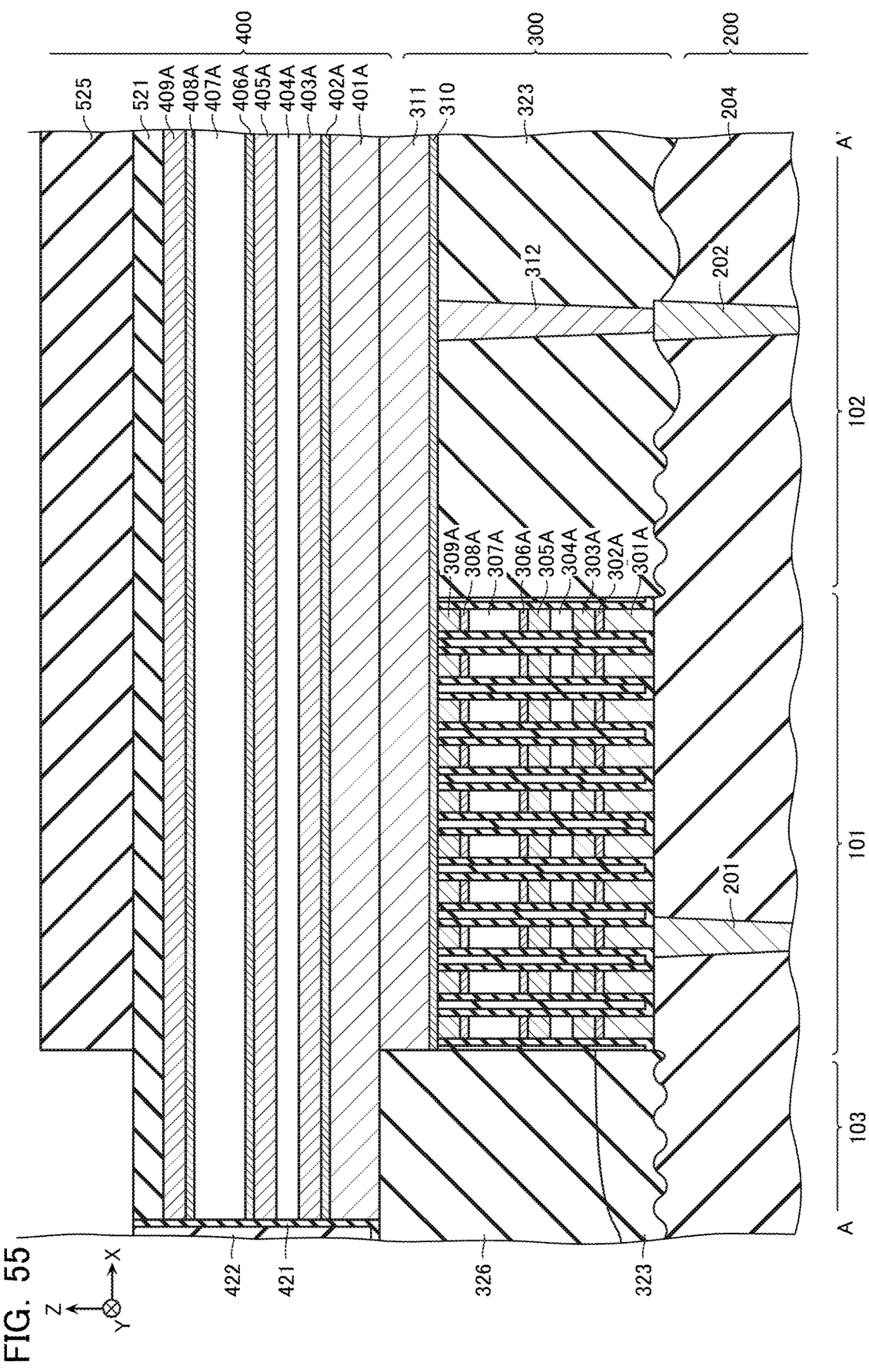
FIG. 55 is a schematic view illustrating the manufacturing method.
Figure 56:
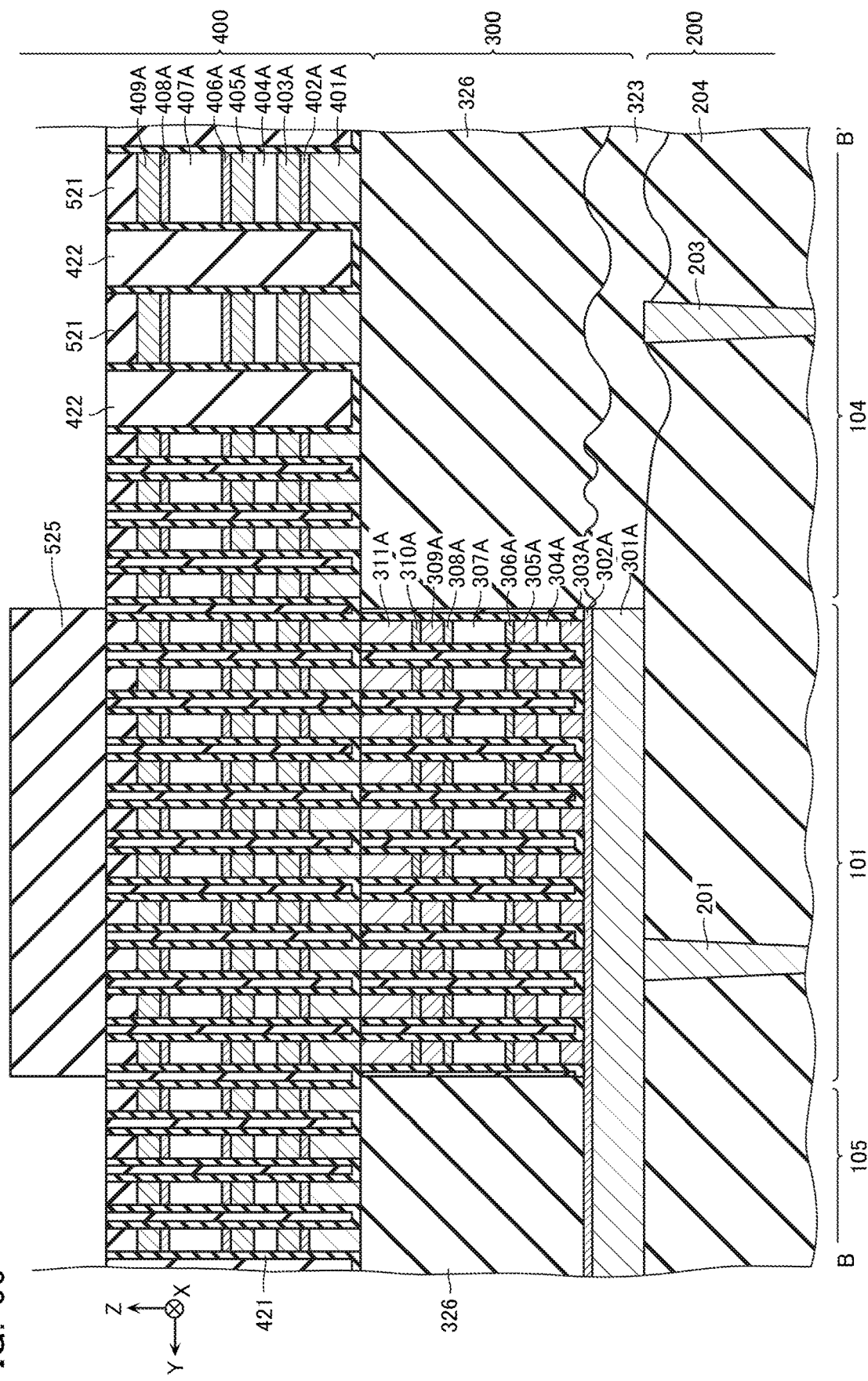
FIG. 56 is a schematic view illustrating the manufacturing method.

Next, for example, as illustrated in FIG. 54 to FIG. 56, a mask material 525 that covers the area 101 and the area 102 is formed.

Figure 57:
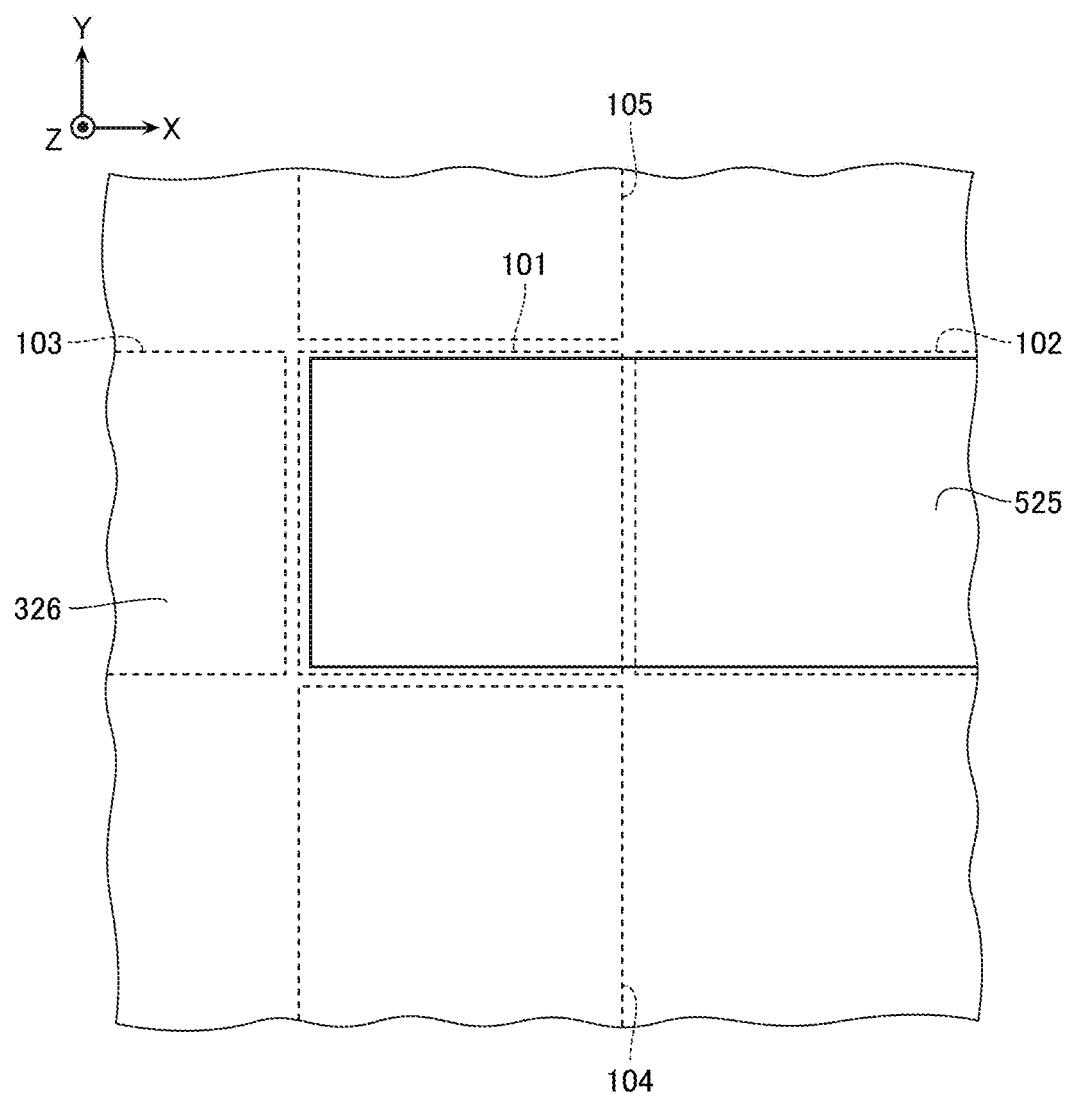
FIG. 57 is a schematic view illustrating the manufacturing method.
Figure 58:
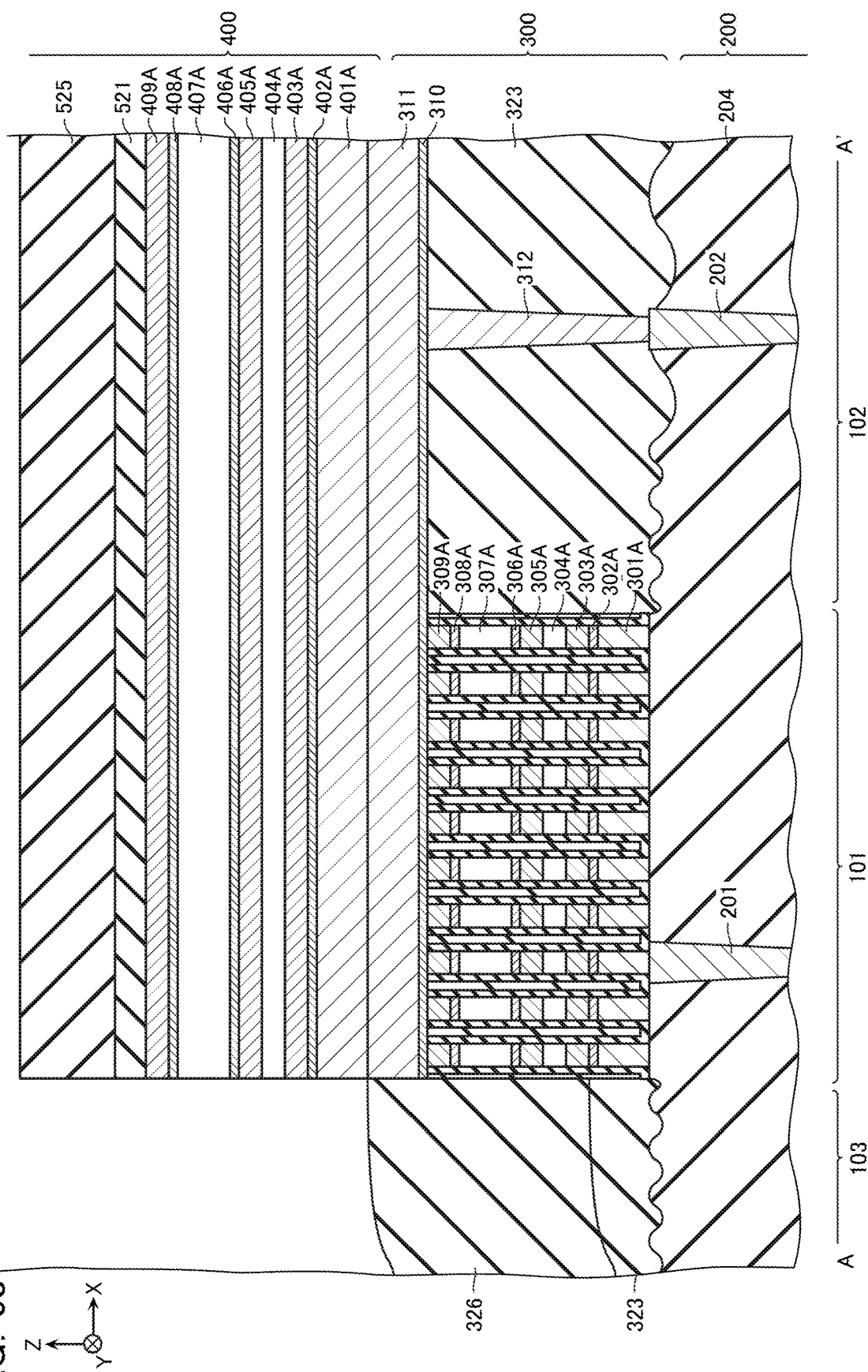
FIG. 58 is a schematic view illustrating the manufacturing method.
Figure 59:
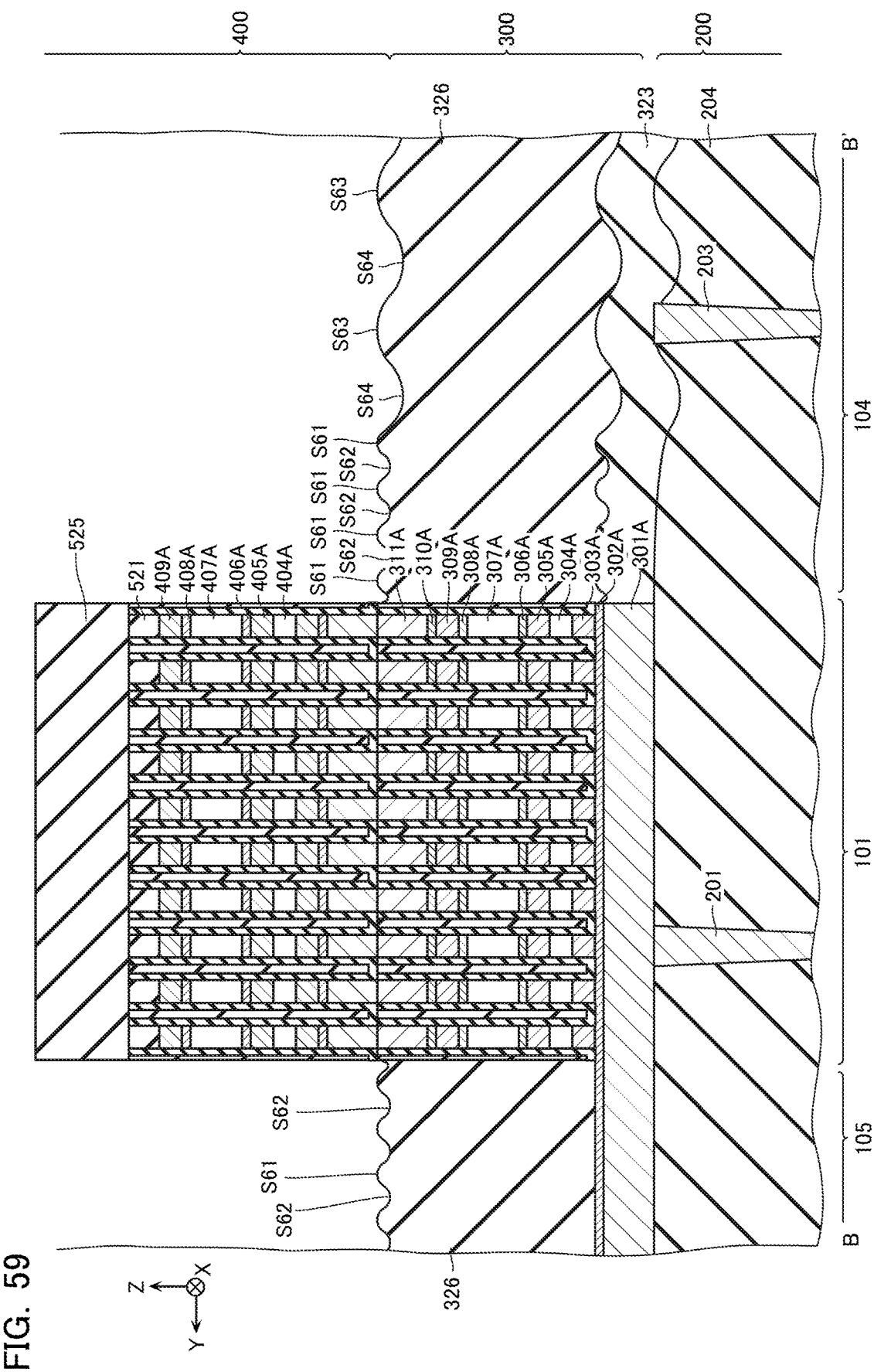
FIG. 59 is a schematic view illustrating the manufacturing method.

Next, for example, as illustrated in FIG. 57 to FIG. 59, the configuration formed on the insulating layer 326 in the area 103, the area 104, and the area 105 is removed. The process is performed by, for example, anisotropic etching, such as RIE, that uses the mask material 525 as a mask. Note that an etching rate differs between a structure including the hard mask layers 521 and the like and the insulating layers 422 in some cases. In this case, for example, as illustrated in FIG. 59, the protruding surfaces S61 and the recessed surfaces S62 are formed on the top surface of the insulating layer 326 in near the area 101 and the area 102 (a position corresponding to the line and space pattern) in some cases. Additionally, the protruding surfaces S63 and the recessed surfaces S64 are formed on the top surface of the insulating layer 326 in an area away from the area 101 and the area 102 (a position corresponding to the island-shaped pattern) in some cases. Afterwards, the mask material 525 is removed.

Figure 60:
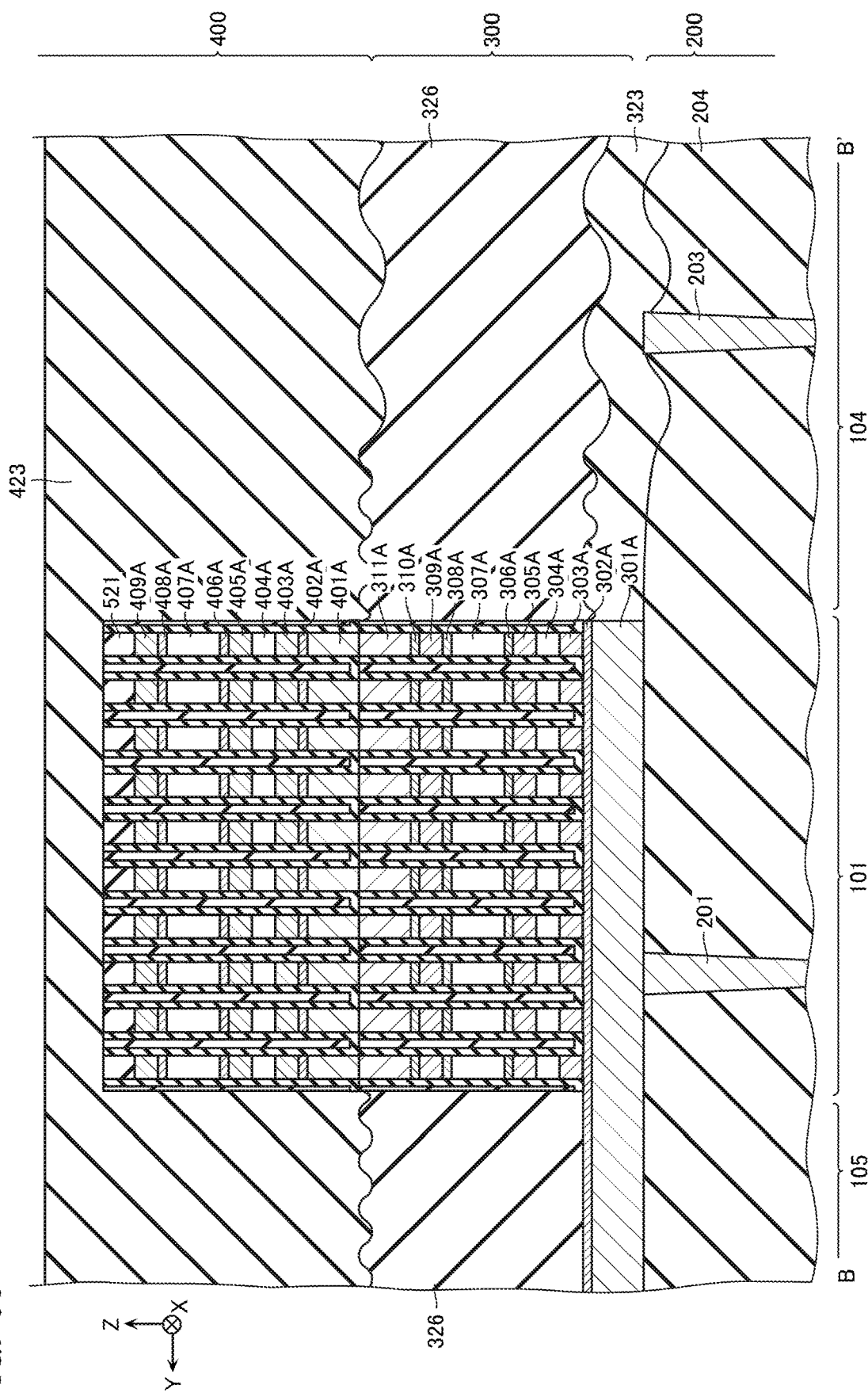
FIG. 60 is a schematic view illustrating the manufacturing method.

Next, for example, as illustrated in FIG. 60, the insulating layer 423 is formed. The process is performed by, for example, CVD using a gas, such as TEOS.

Figure 61:
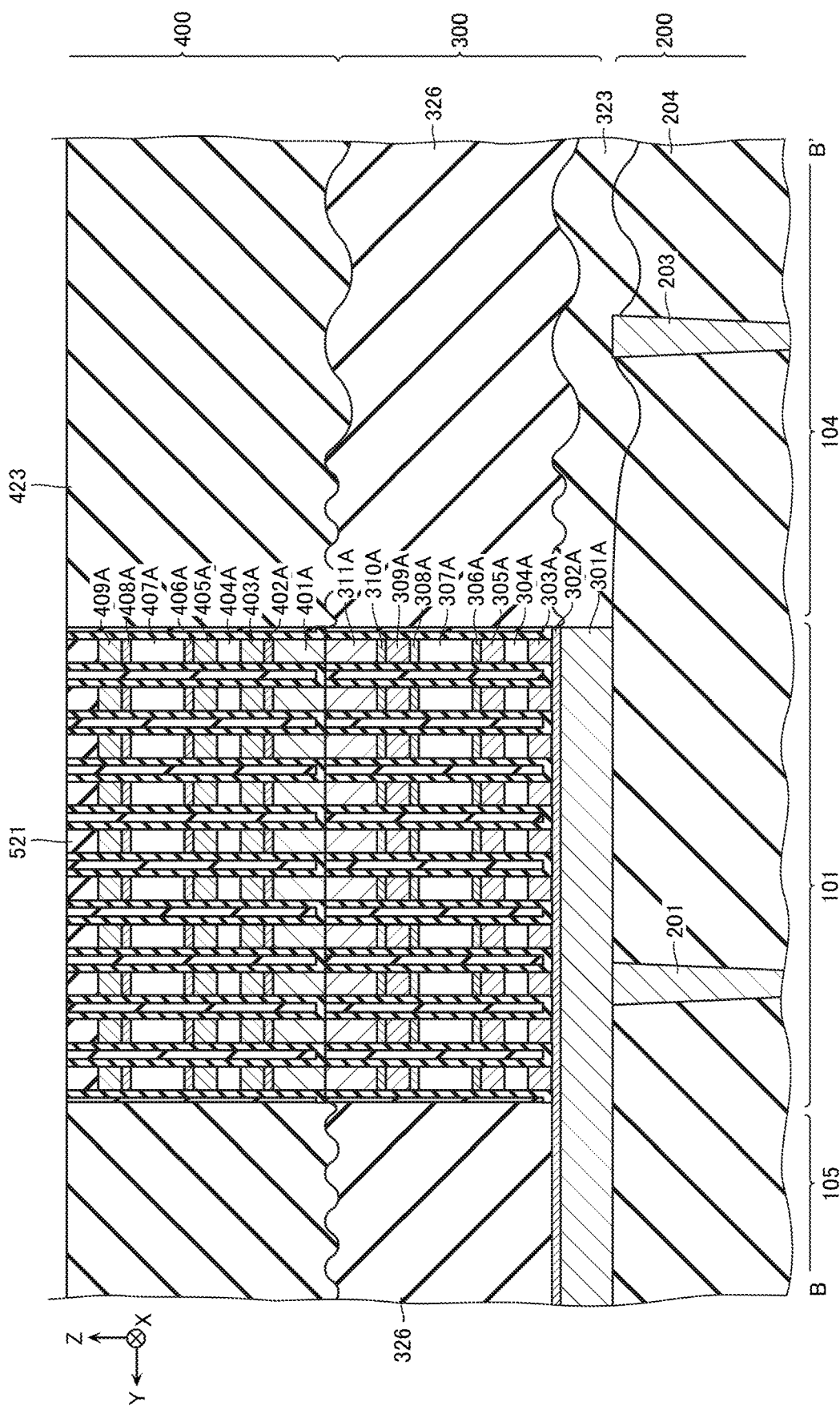
FIG. 61 is a schematic view illustrating the manufacturing method.

Next, for example, as illustrated in FIG. 61, a part of the insulating layer 423 is removed to expose top surfaces of the hard mask layers 521. The process is, for example, performed by flattening process, such as CMP, using the hard mask layers 521 as stoppers.

Figure 62:
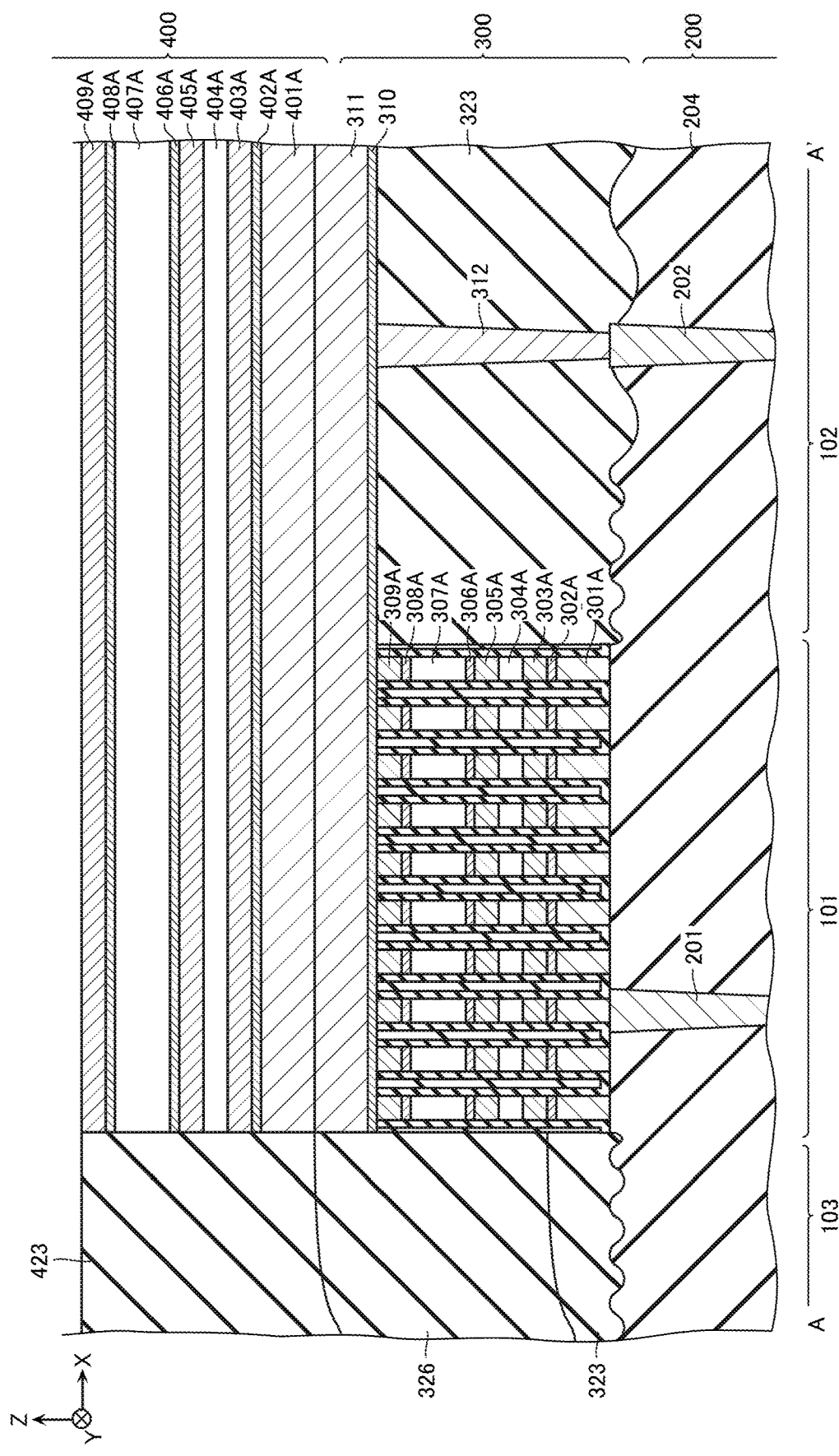
FIG. 62 is a schematic view illustrating the manufacturing method.
Figure 63:
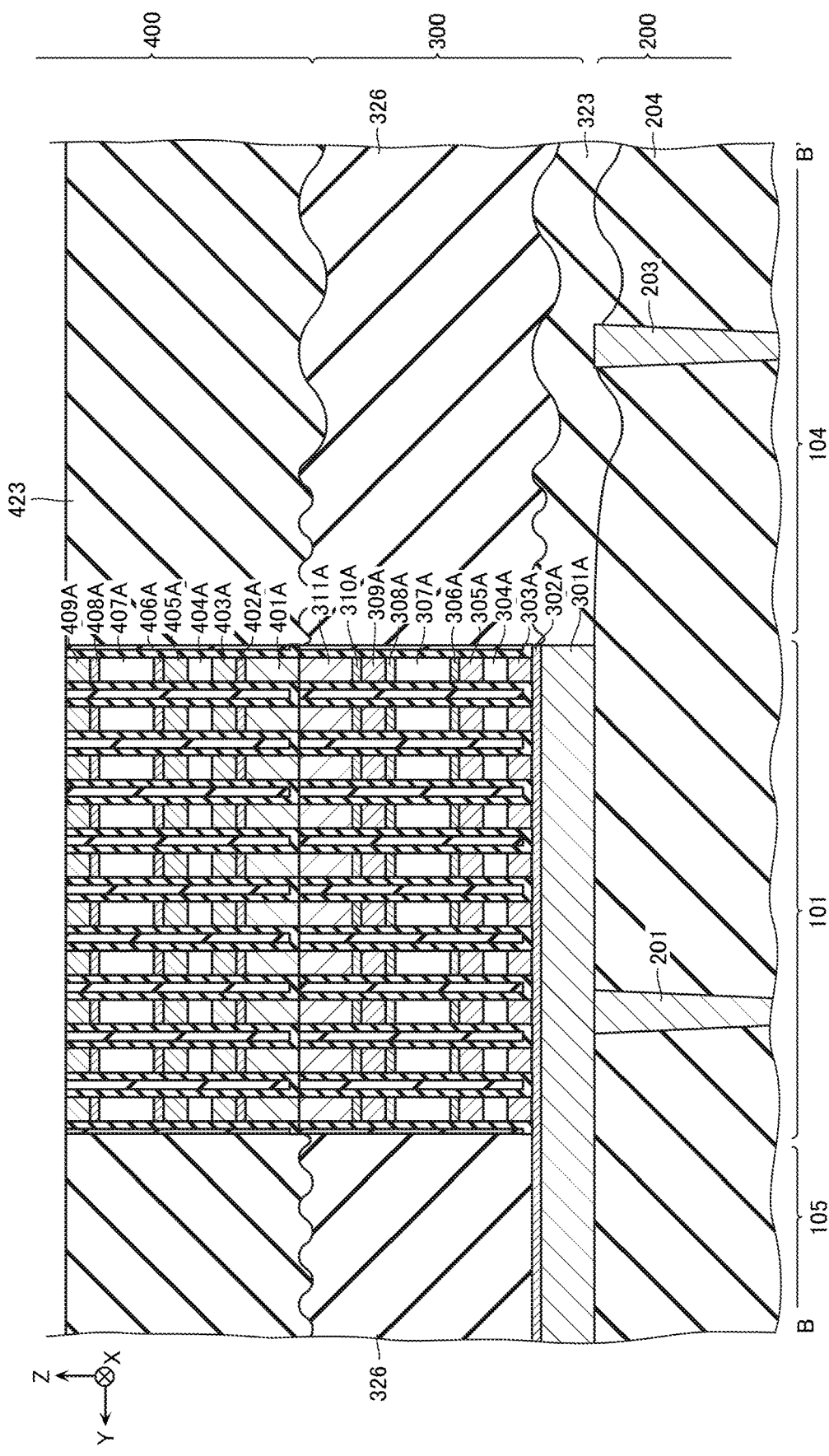
FIG. 63 is a schematic view illustrating the manufacturing method.

Next, for example, as illustrated in FIG. 62 and FIG. 63, the hard mask layers 521 and a part of the insulating layer 423 are removed to expose top surfaces of the electrode layers 409A. The process is performed by, for example, CMP or wet etching.

Figure 65:
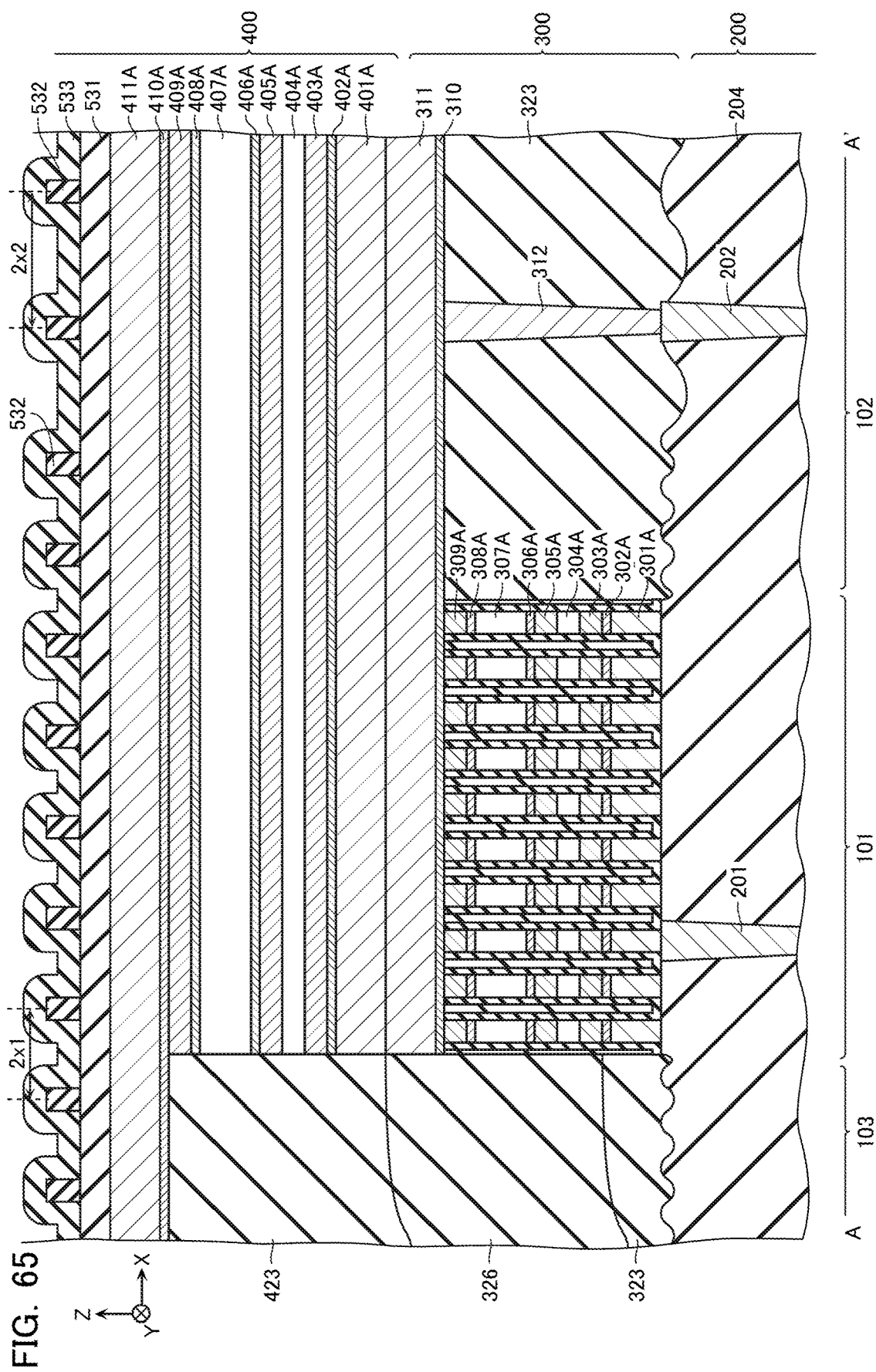
FIG. 65 is a schematic view illustrating the manufacturing method.

Next, for example, as illustrated in FIG. 65, on the top surfaces of the electrode layer 409A and the insulating layer 423, a laminated body including a barrier conducting layer 410A forming the barrier conducting layer 410, a conducting layer 411A forming the conducting layer 411, and a hard mask layer 531, such as silicon nitride (SiN), is formed. The process is performed by, for example, PVD, such as sputtering.

Figure 64:
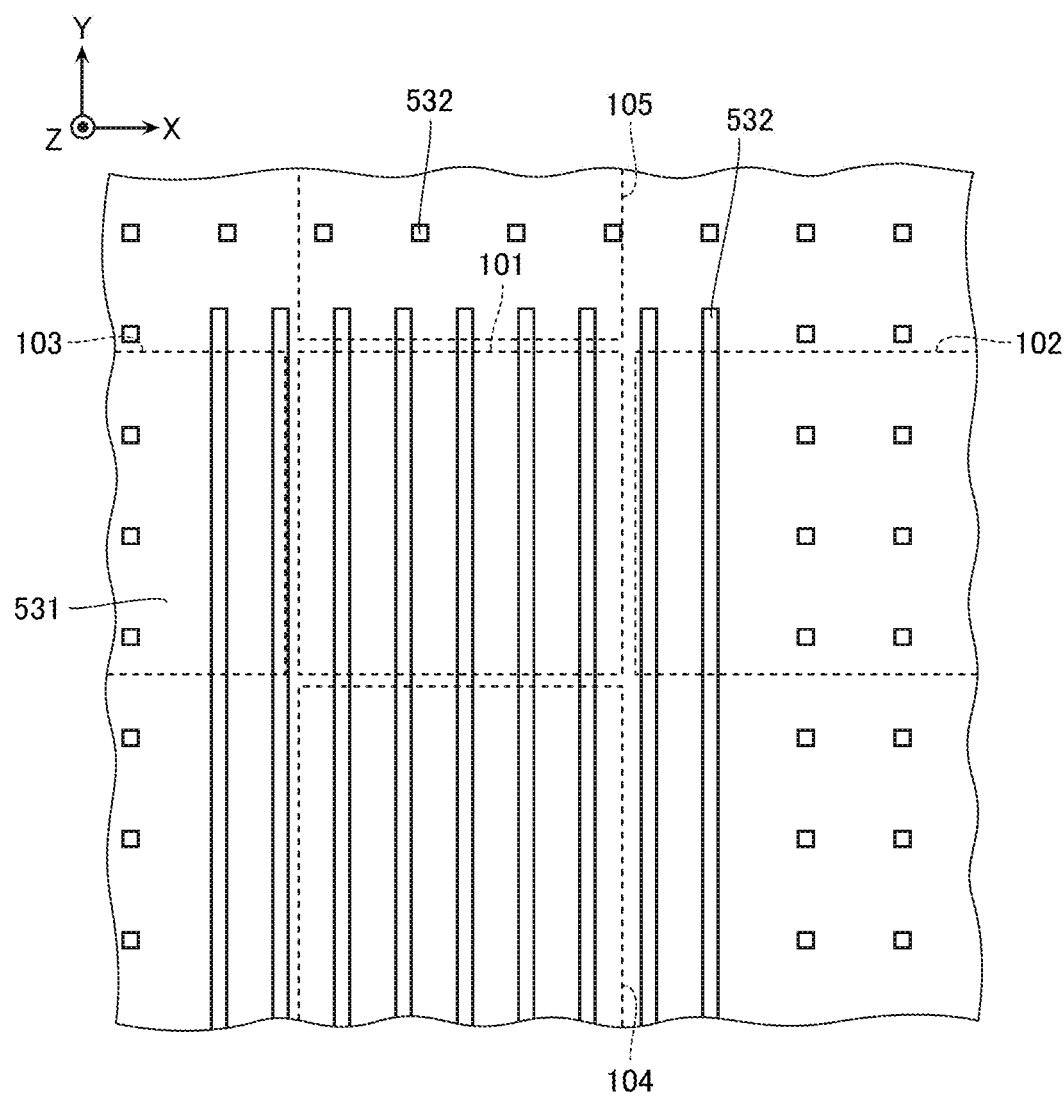
FIG. 64 is a schematic view illustrating the manufacturing method.

Next, for example, as illustrated in FIG. 64 and FIG. 65, core materials 532, such as carbon (C), are formed on the top surface of the hard mask layer 531. The core materials 532, for example, extend in the Y direction and are arranged in the X direction at the pitch 2x1 in the area 101 and the area 104 and near the area 101 and the area 104 (a part of the area 102, a part of the area 103, and a part of the area 105). The core materials 532, for example, are arranged in the X direction at the pitch 2x2 and arranged in the Y direction at predetermined pitch in an area away from the area 101 and the area 104 (a part of the area 102, a part of the area 103, and a part of the area 105).

Next, for example, as illustrated in FIG. 65, a hard mask layer 533, such as silicon oxide (SiO$_2$), is formed on the top surface of the hard mask layer 531, the side surfaces of the core materials 532, and the top surfaces of the core materials 532. The process is performed by, for example, CVD using a gas, such as TEOS.

Figure 66:
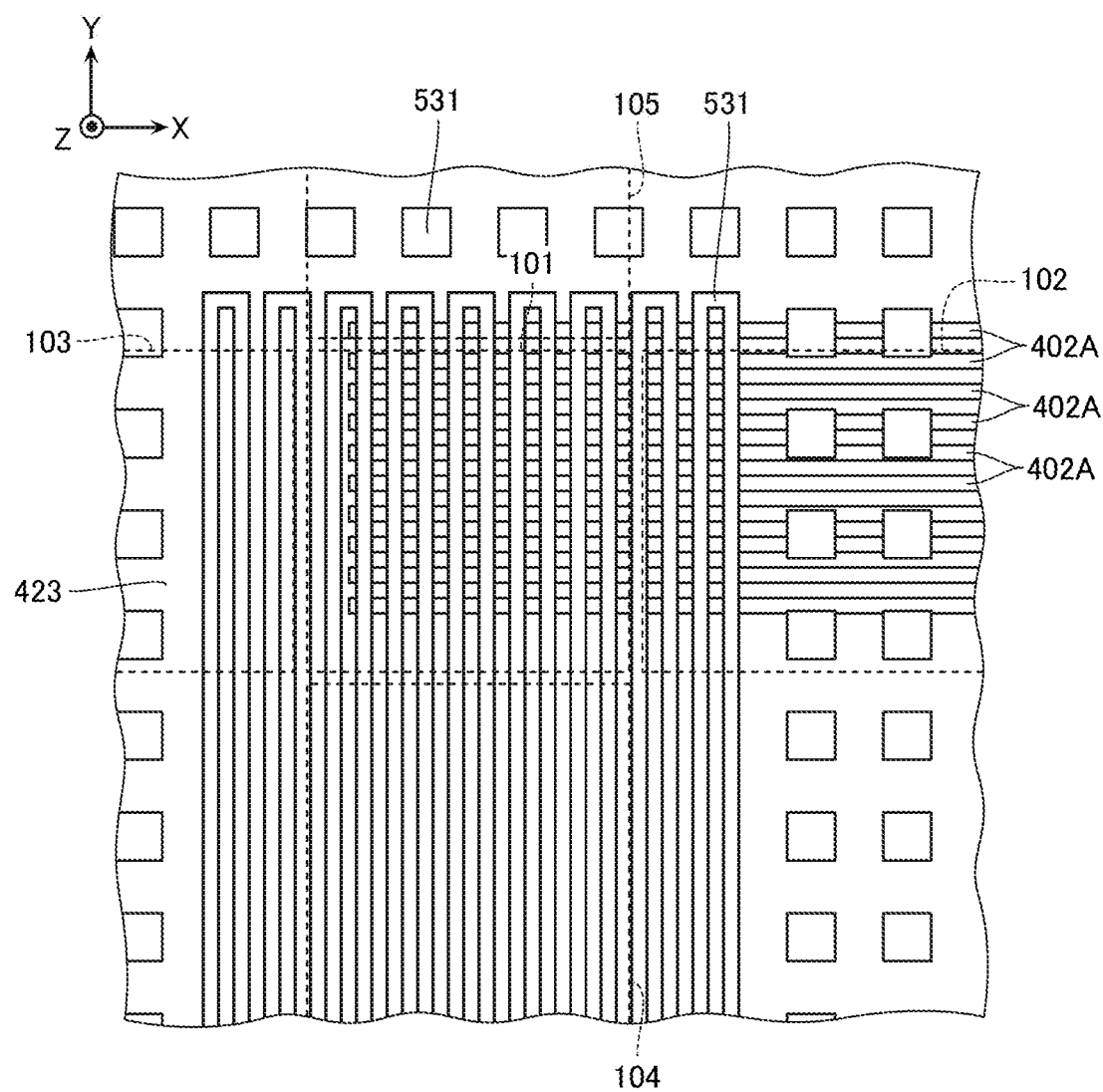
FIG. 66 is a schematic view illustrating the manufacturing method.
Figure 67:
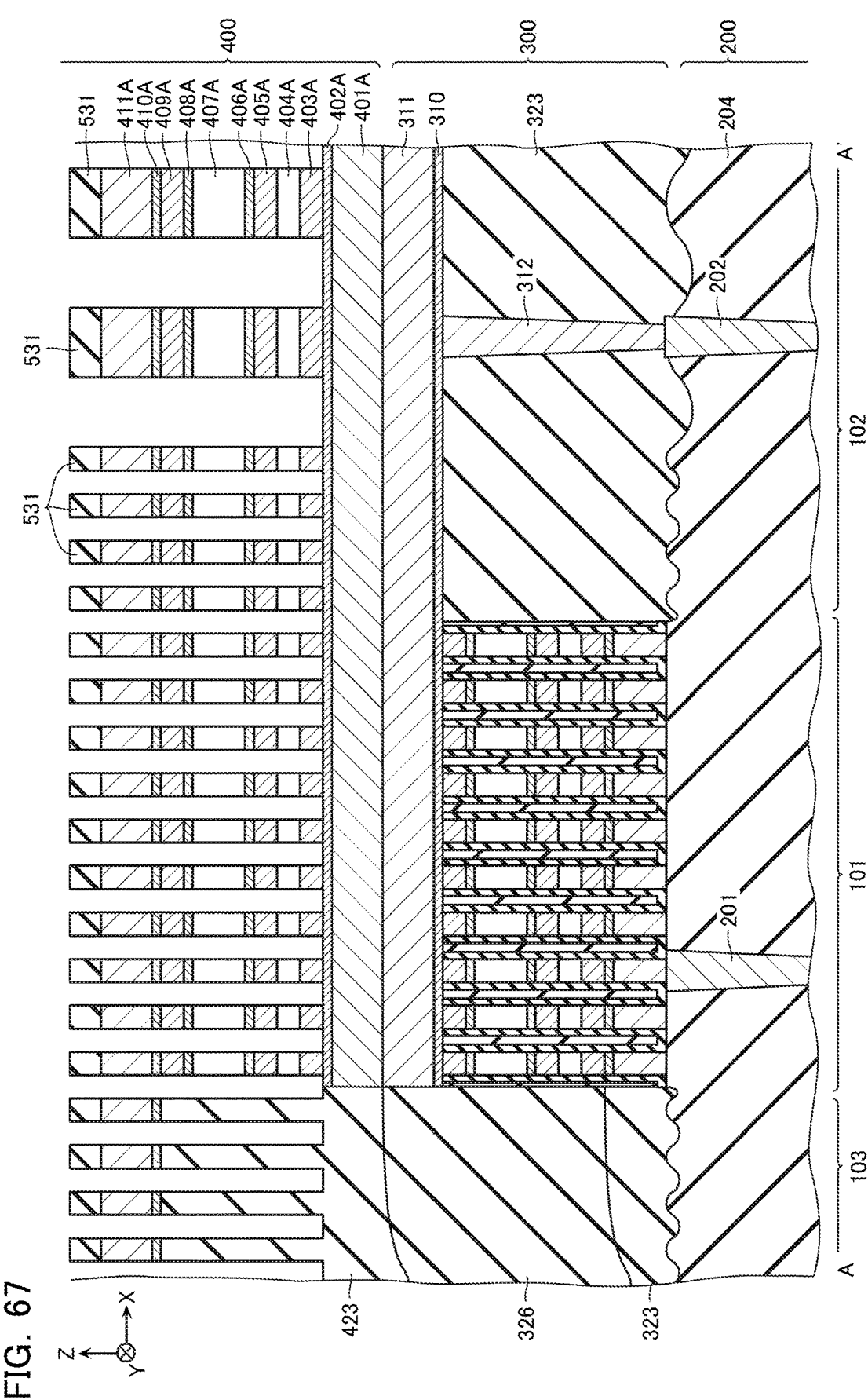
FIG. 67 is a schematic view illustrating the manufacturing method.

Next, for example, as illustrated in FIG. 66 and FIG. 67, the process similar to the process that has been described with reference to FIG. 12 to FIG. 18 is performed.

The process divides the hard mask layer 531 in the X direction in the area 101 and the area 104 and near the area 101 and the area 104, thus forming a line and space pattern. Additionally, in the area away from the area 101 and the area 104, the hard mask layer 531 is divided in the X direction and the Y direction, thus forming an island-shaped pattern in which the hard mask layers 531 are arranged in a matrix.

The process divides the electrode layer 403A, the chalcogen layer 404A, the electrode layer 405A, the barrier conducting layer 406A, the chalcogen layer 407A, the barrier conducting layer 408A, the electrode layer 409A, the barrier conducting layer 410A, and the conducting layer 411A in the X direction and the Y direction along the pattern formed on the hard mask layer 531. Note that the process removes the core materials 532 and the hard mask layers 533 and at least a part of the hard mask layer 531 remains.

Figure 68:
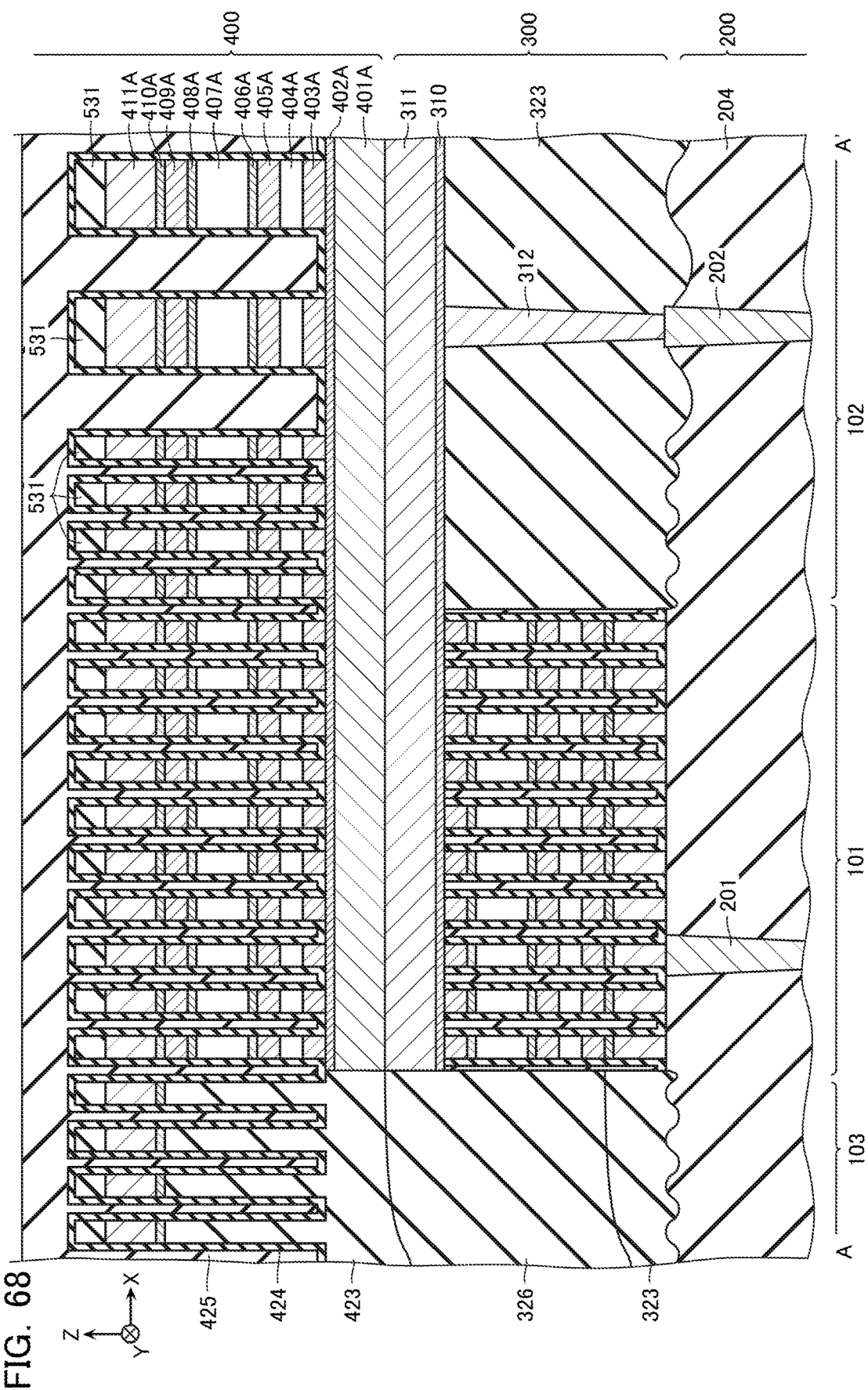
FIG. 68 is a schematic view illustrating the manufacturing method.

Next, for example, as illustrated in FIG. 68, the barrier insulating layer 424 is formed on top surfaces of the barrier conducting layer 402A and the insulating layers 423 and the top surfaces of the hard mask layers 531, and side surfaces in the X direction of the electrode layers 403A, the chalcogen layers 404A, the electrode layers 405A, the barrier conducting layers 406A, the chalcogen layers 407A, the barrier conducting layers 408A, the electrode layers 409A, the barrier conducting layers 410A, the conducting layers 411A, and the hard mask layers 531. Additionally, the insulating layer 425 is formed. The insulating layer 425 is formed by, for example, applying a polysilazane or the like on the wafer by means, such as spin coat, and performing a heat treatment or the like.

Figure 69:
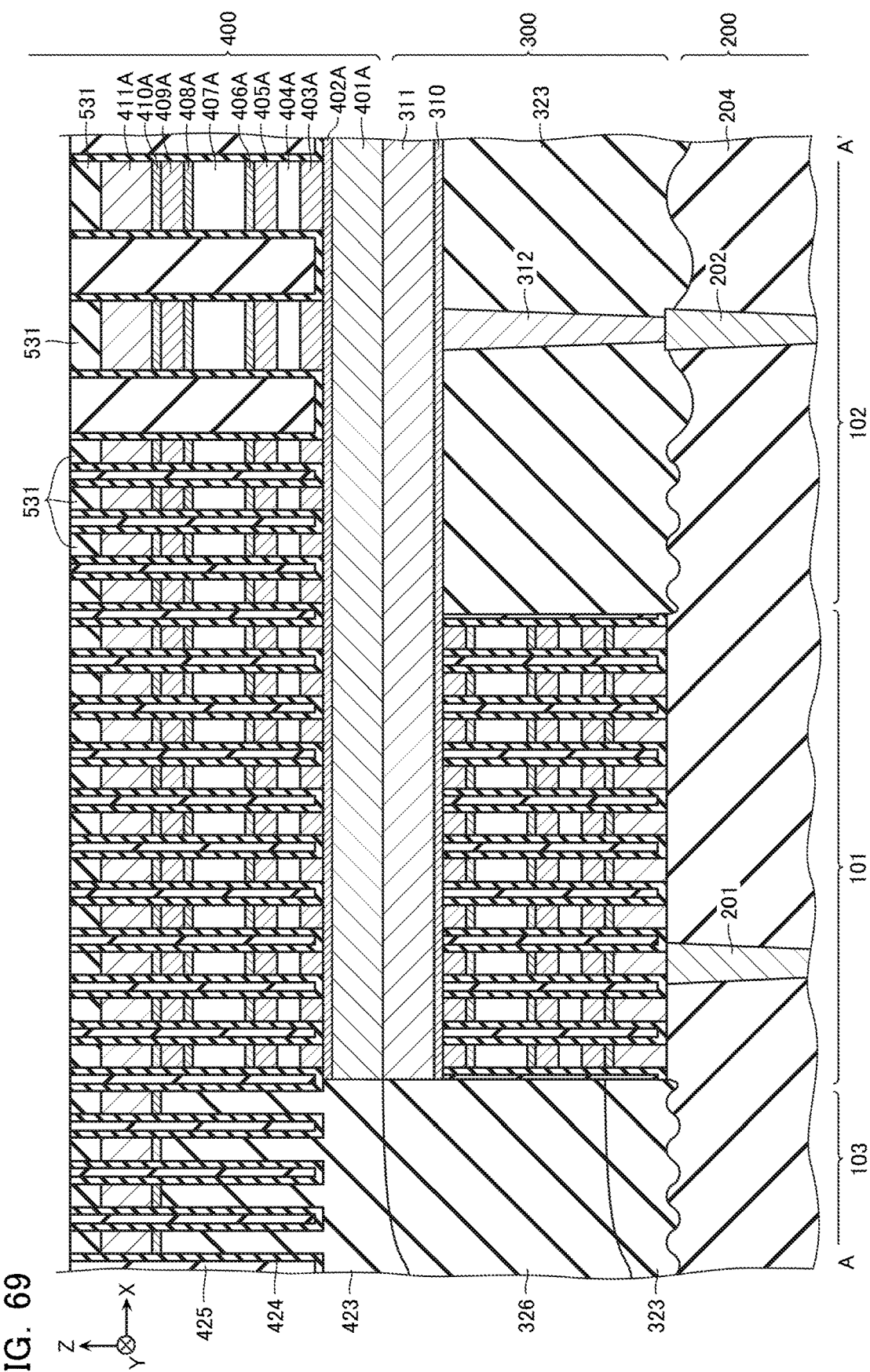
FIG. 69 is a schematic view illustrating the manufacturing method.

Next, for example, as illustrated in FIG. 69, a part of the insulating layer 425 is removed to expose the top surfaces of the hard mask layers 531. The process is performed by, for example, flattening process, such as CMP, using the hard mask layers 531 as stoppers.

Figure 70:
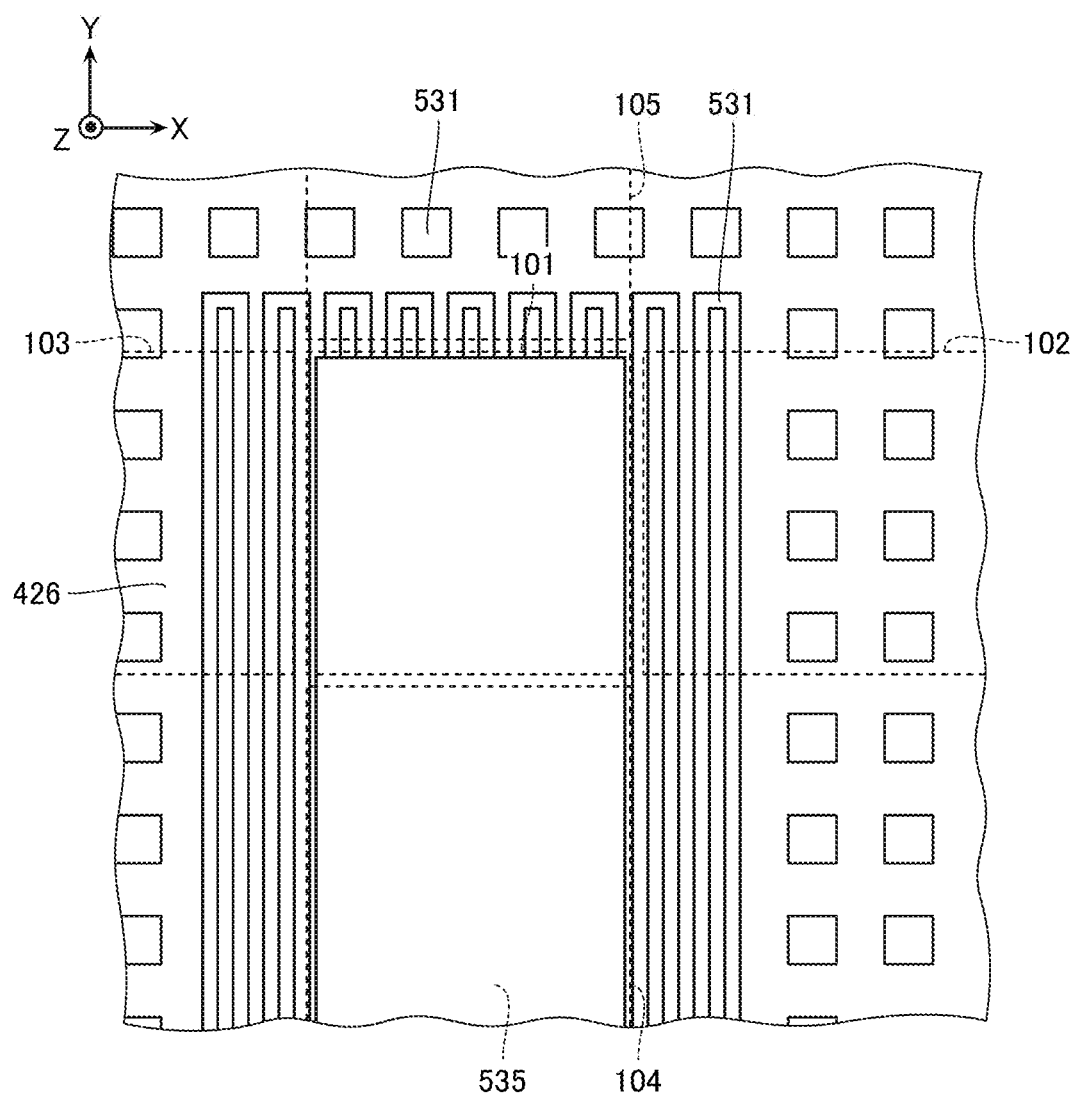
FIG. 70 is a schematic view illustrating the manufacturing method.
Figure 71:
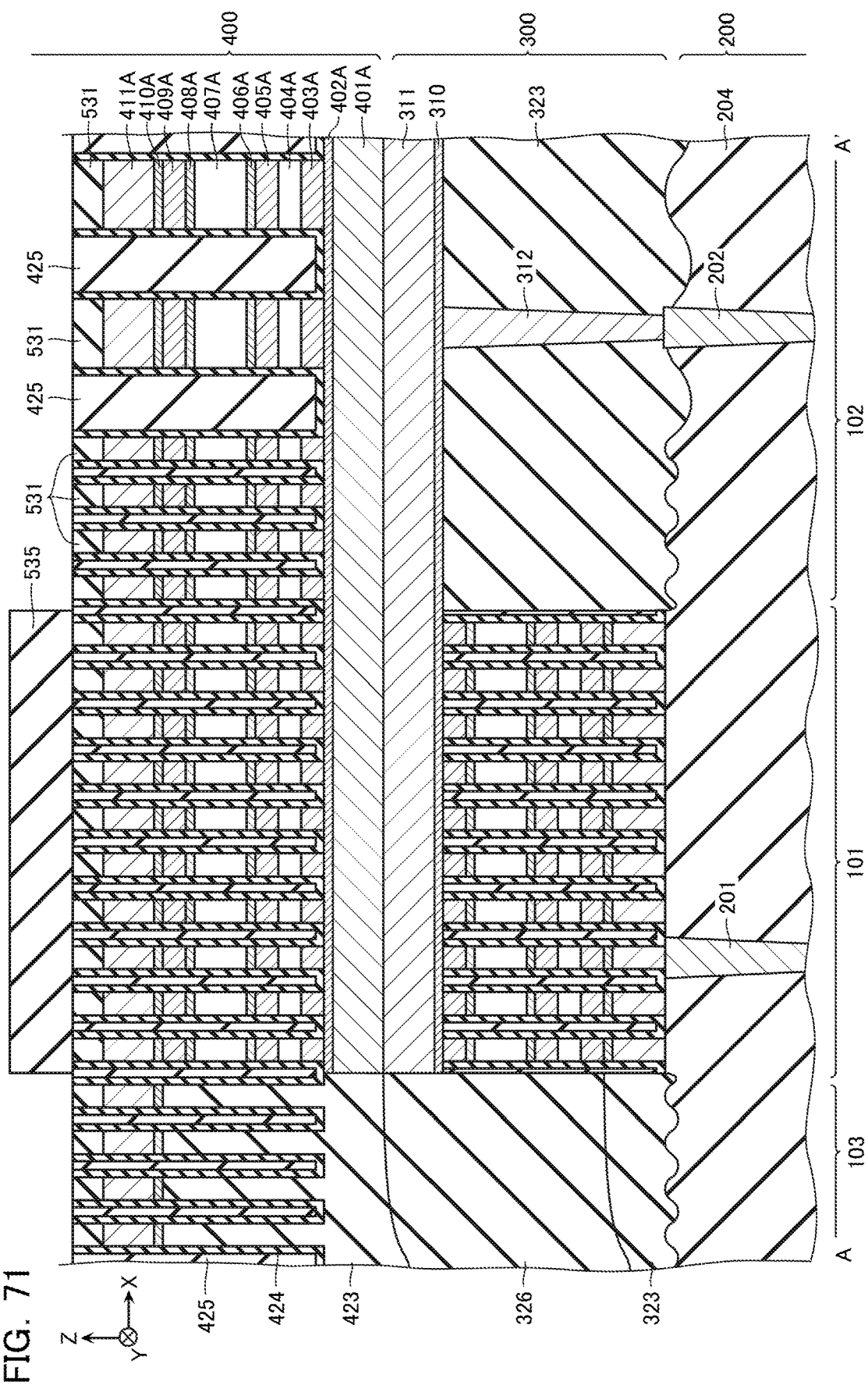
FIG. 71 is a schematic view illustrating the manufacturing method.
Figure 72:
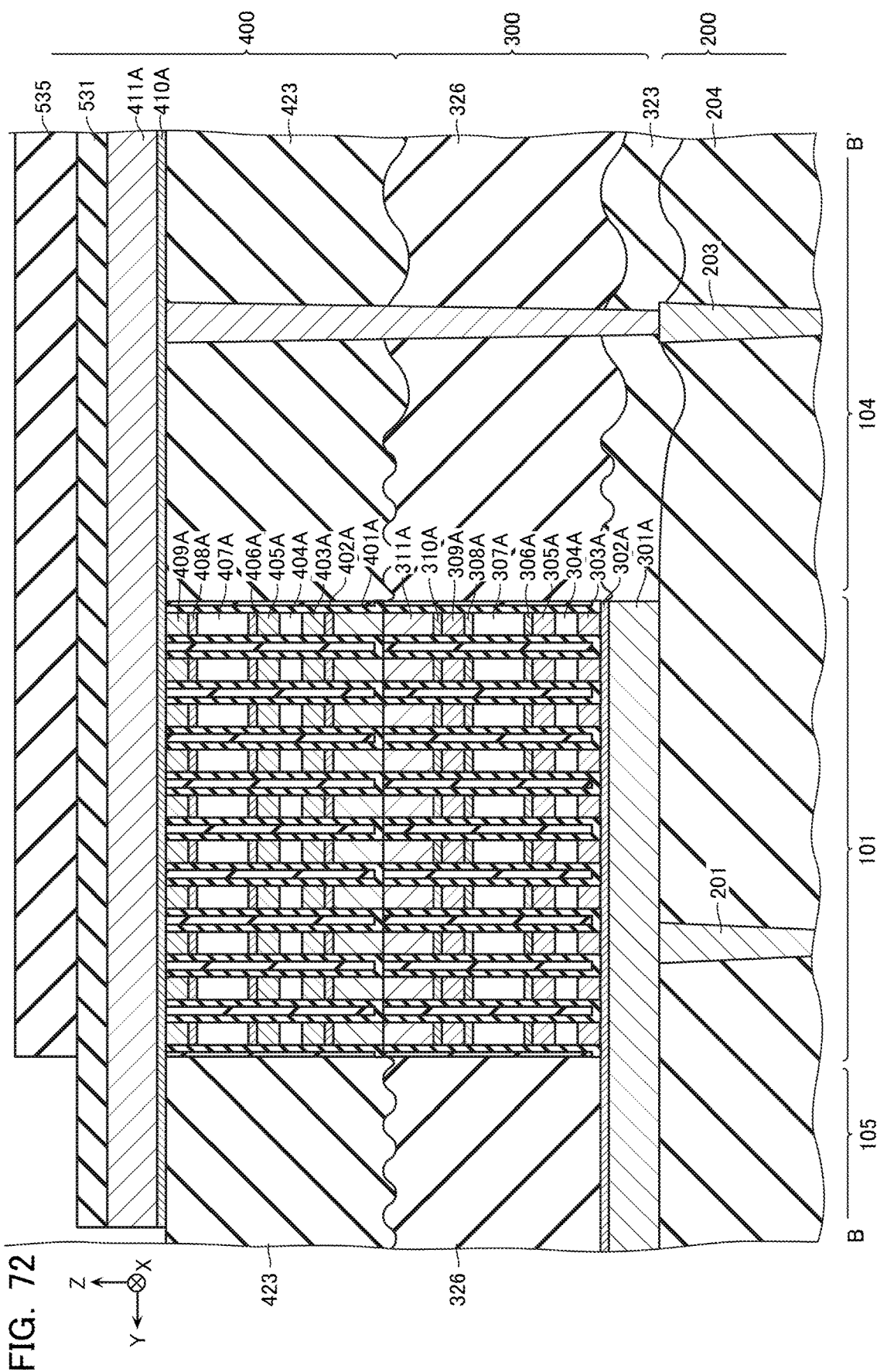
FIG. 72 is a schematic view illustrating the manufacturing method.

Next, for example, as illustrated in FIG. 70 to FIG. 72, a mask material 535 that covers the area 101 and the area 104 is formed.

Figure 73:
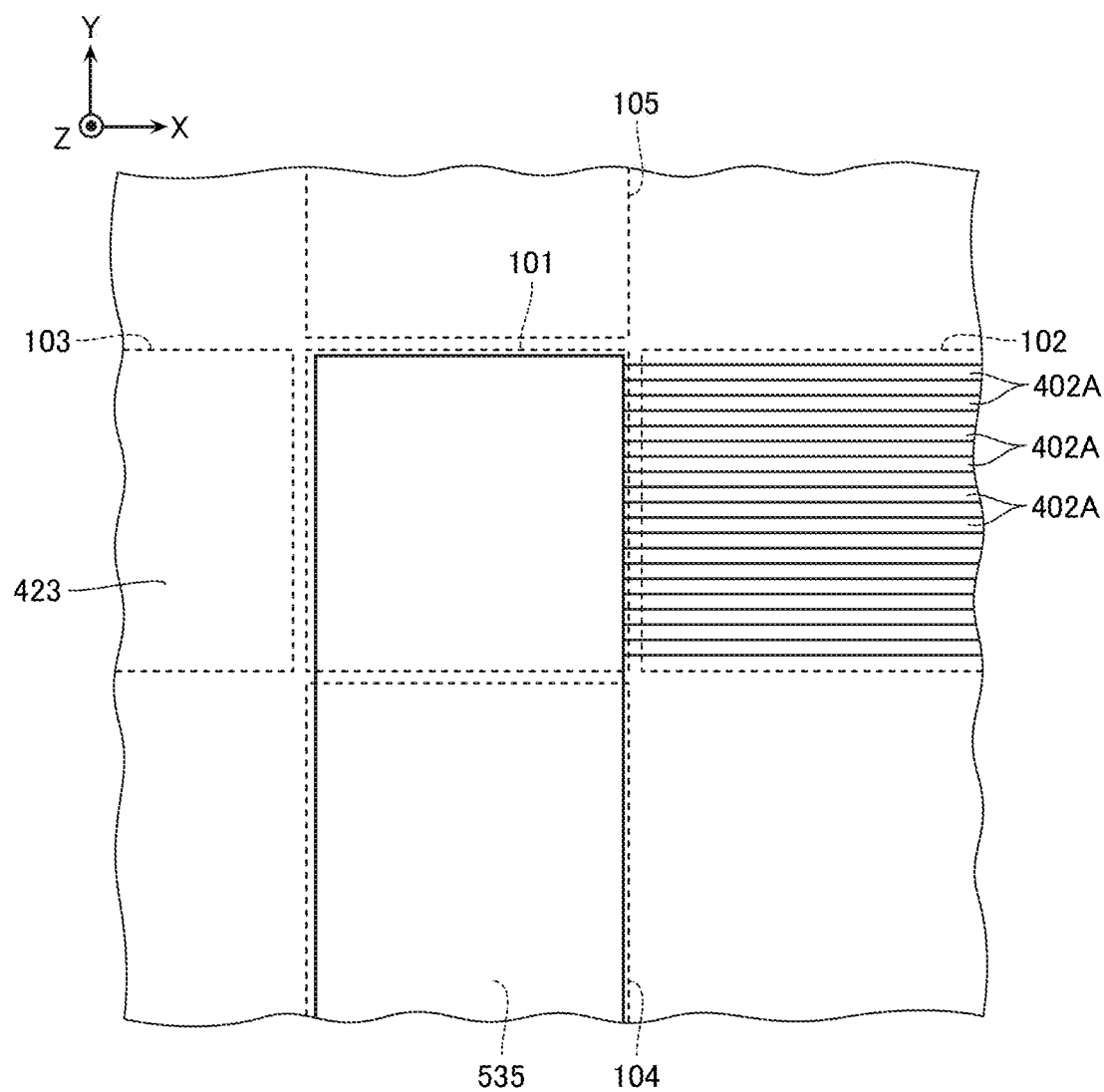
FIG. 73 is a schematic view illustrating the manufacturing method.
Figure 74:
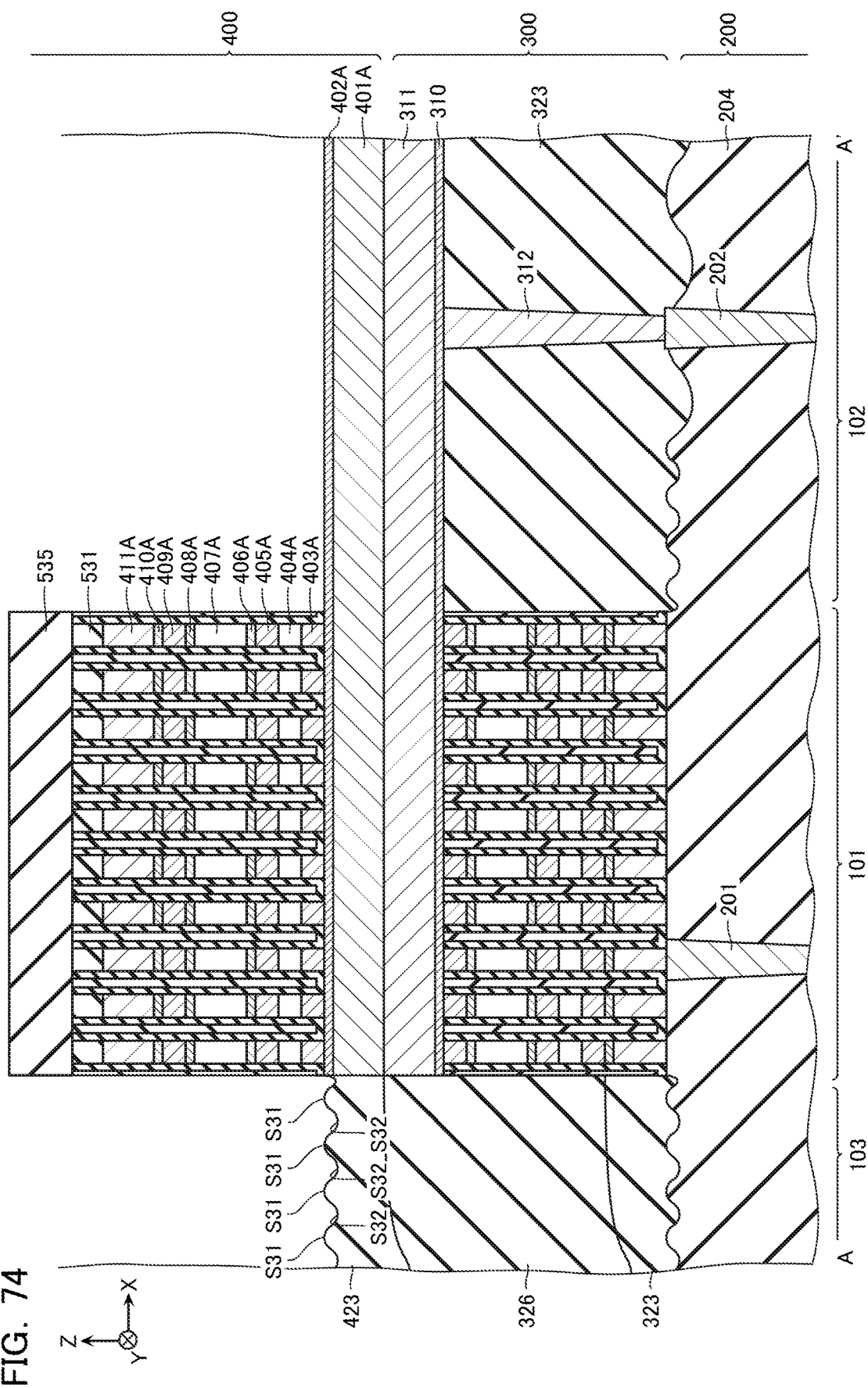
FIG. 74 is a schematic view illustrating the manufacturing method.
Figure 75:
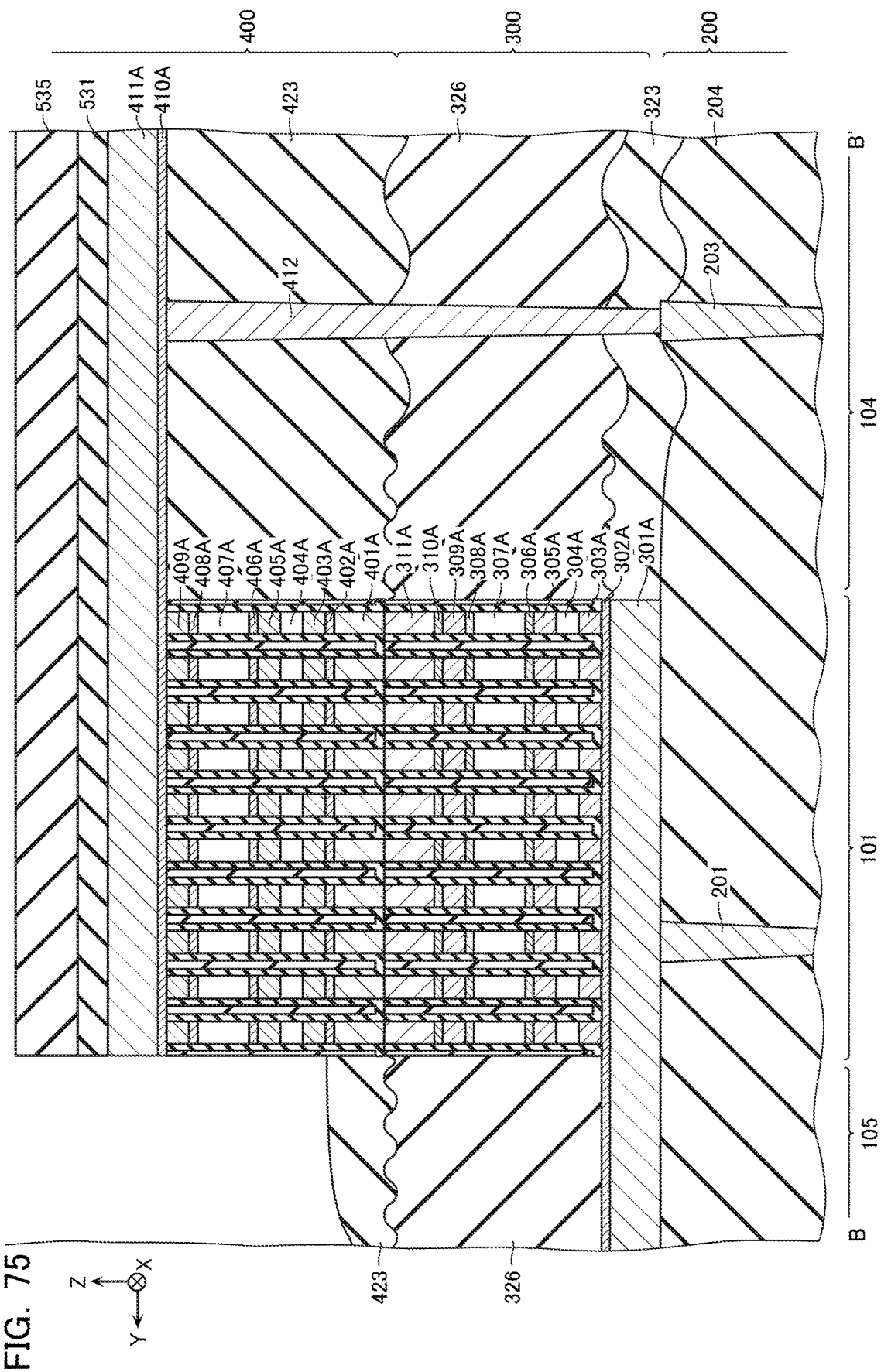
FIG. 75 is a schematic view illustrating the manufacturing method.

Next, for example, as illustrated in FIG. 73 to FIG. 75, the configuration formed on the insulating layer 423 in the area 103, the area 104, and the area 105 is removed. The process is performed by, for example, anisotropic etching, such as RIE, that uses the mask material 535 as a mask. Note that an etching rate differs between a structure including the hard mask layers 531 and the like and the insulating layer 425 in some cases. In this case, for example, as illustrated in FIG. 74, the protruding surfaces S31 and the recessed surfaces S32 are formed on the top surface of the insulating layer 423 in near the area 101 and the area 104 (a position corresponding to the line and space pattern) in some cases. Additionally, the protruding surfaces and the recessed surfaces are formed on the top surface of the insulating layer 423 in an area away from the area 101 and the area 104 (a position corresponding to the island-shaped pattern) in some cases. Afterwards, the mask material 535 is removed.

Next, for example, the insulating layer 426 (FIG. 5) is formed. The process is performed by, for example, CVD using a gas, such as TEOS. Thus, the configuration that has been described with reference to FIG. 5 and FIG. 6 is formed.

Comparative Example

Next, with reference to FIG. 76 to FIG. 78, a method of manufacturing a semiconductor memory device according to the comparative example will be described.

The method of manufacturing the semiconductor memory device according to the comparative example is approximately similar to the method of manufacturing the semiconductor memory device according to the first embodiment.

However, for example, as described with reference to FIG. 16 to FIG. 18, in the first embodiment, the hard mask layers 501 and the like are caused to remain in the area 102 to the area 104, in addition to the area 101. Meanwhile, as illustrated in FIG. 76, in the comparative example, the hard mask layers 501 and the like are removed in the area 102 to the area 104 in a process corresponding to the process.

Figure 77:
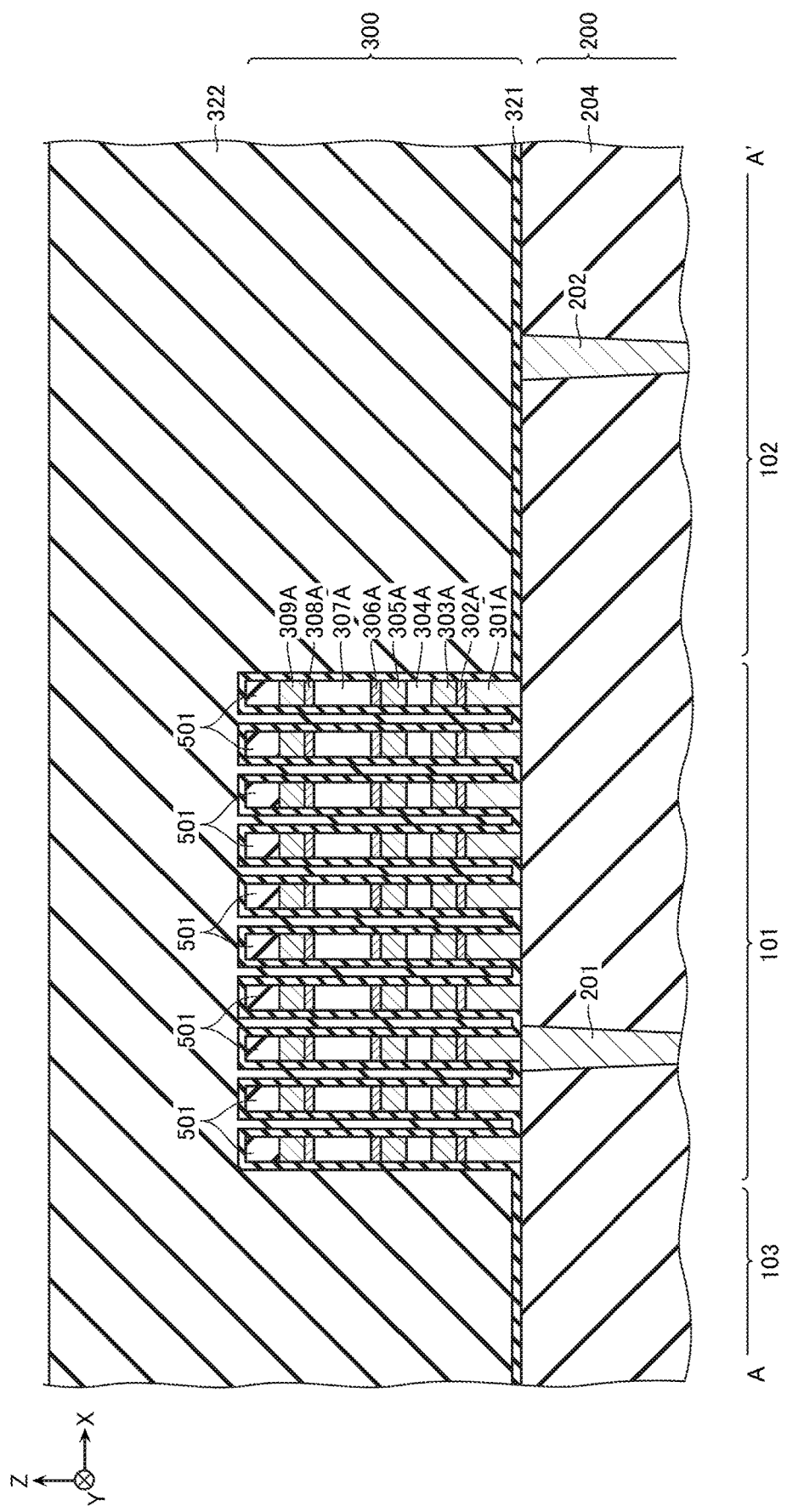
FIG. 77 is a schematic view illustrating the manufacturing method.

Next, for example, as illustrated in FIG. 77, the insulating layer 322 is formed. The insulating layer 322 is formed by, for example, applying a polysilazane or the like on the wafer by means, such as spin coat, and performing a heat treatment or the like.

Figure 78:
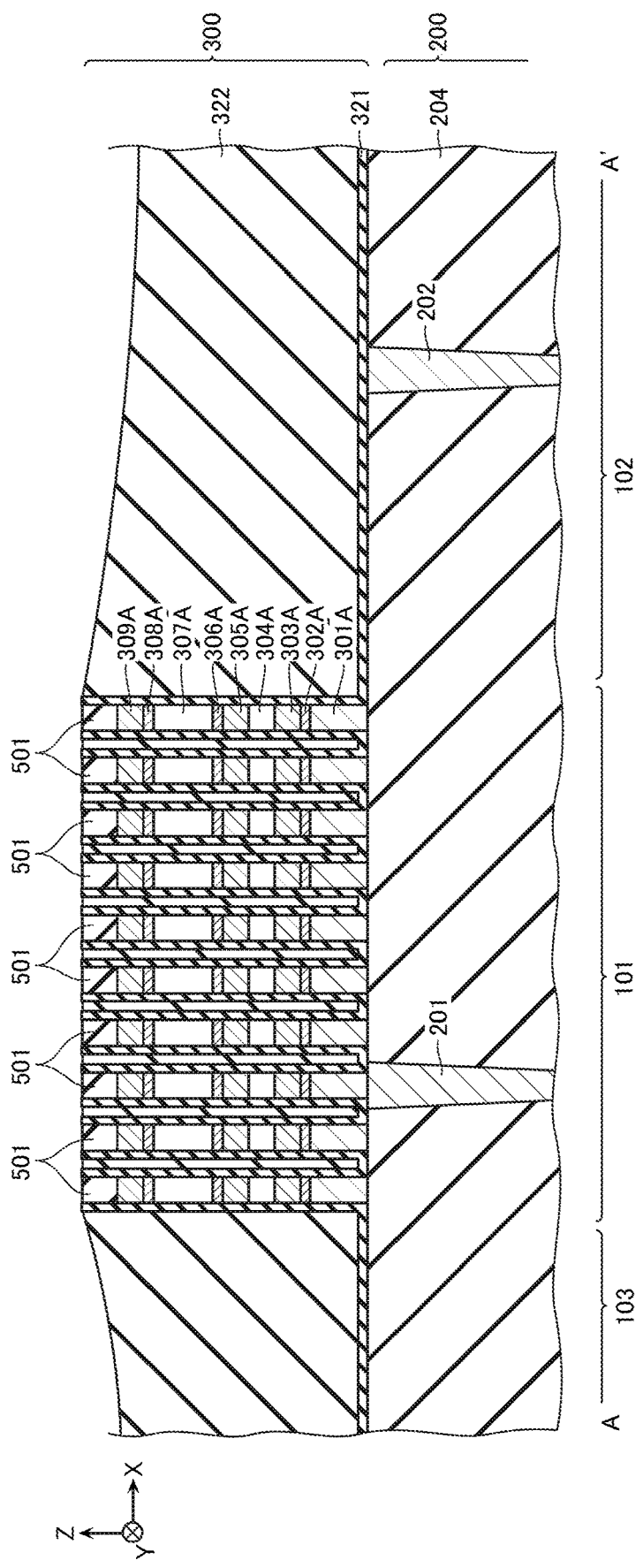
FIG. 78 is a schematic view illustrating the manufacturing method.

Next, for example, as illustrated in FIG. 78, a part of the insulating layer 322 is removed to expose the top surfaces of the hard mask layers 501. The process is performed by, for example, flattening process, such as CMP, using the hard mask layers 501 as stoppers.

Note that the method of manufacturing the semiconductor memory device according to the comparative example removes the hard mask layers 511, 521, 531, and the like disposed in the area where the wiring or the like are not disposed in all of the process corresponding to the process that has been described with reference to FIG. 33 to FIG. 35 of the embodiment, the process corresponding to the process that has been described with reference to FIG. 49 to FIG. 51 of the embodiment, and the process corresponding to the process that has been described with reference to FIG. 66 and FIG. 67 of the embodiment.

[Effects]

In the comparative example, similarly to the embodiment, for example, the insulating layer 323 and the like are formed in the process corresponding to, for example, FIG. 27. The process is performed by, for example, CVD using a gas, such as TEOS. The method allows forming high-density silicon oxide and allows forming an insulating layer having excellent insulating property and mechanical strength.

However, in association with miniaturization of semiconductor memory devices, a distance between the memory cells MC, for example, the pitch x1 of FIG. 8 and the pitch y1 of FIG. 9 have been decreasing. Accordingly, it is becoming difficult to form the insulating layer between the memory cells MC by, for example, CVD using a gas, such as TEOS.

Therefore, in the comparative example, similarly to the embodiment, the insulating layer 322 and the like are formed in the process corresponding to, for example, FIG. 19. The process is performed by applying, for example, a polysilazane, on the wafer. The method can preferably form the insulating layer between the memory cells MC.

However, the insulating layer formed by, for example, a polysilazane exhibits low mechanical strength in some cases. When the flattening process, such as CMP, is performed in the state, for example, as illustrated in FIG. 78 as an example, the insulating layer 322 is possibly significantly etched in the area 102 to the area 104. Thus, a difference in height occurs between the top surface of the structure formed in the area 101 and the area 105 and the top surface of the structure formed in the area 102 to the area 104, possibly causing a problem in the subsequent process.

Therefore, in the first embodiment, for example, in the process that has been described with reference to FIG. 16 to FIG. 18 and the like, the hard mask layers 501 and the like are caused to remain in the area 102 to the area 104, in addition to the area 101 and the area 105. Further, for example, when the flattening process, such as CMP, is performed in the process that has been described with reference to FIG. 20, the hard mask layers 501 are used as stoppers. This reduces a significant etching of the insulating layer 322 in the area 102 to the area 104 and allows preferably manufacturing the semiconductor memory device.

However, in a case where the hard mask layers 501 and the like are caused to remain in the area 102 to the area 104, due to a relationship with the contact wiring 312 and the like, there may be a restriction of its position. Furthermore, a structure similar to the memory cell MC is possibly formed at an unintended position.

Therefore, in the first embodiment, in the process that has been described with reference to FIG. 24 to FIG. 26 and the like, the structure formed in, for example, the area 102 to the area 104 is removed. Therefore, the structure including the hard mask layers 501 and the like is not restricted by the position of the contact wiring 312 or the like and can be arranged at high density.

Figure 76:
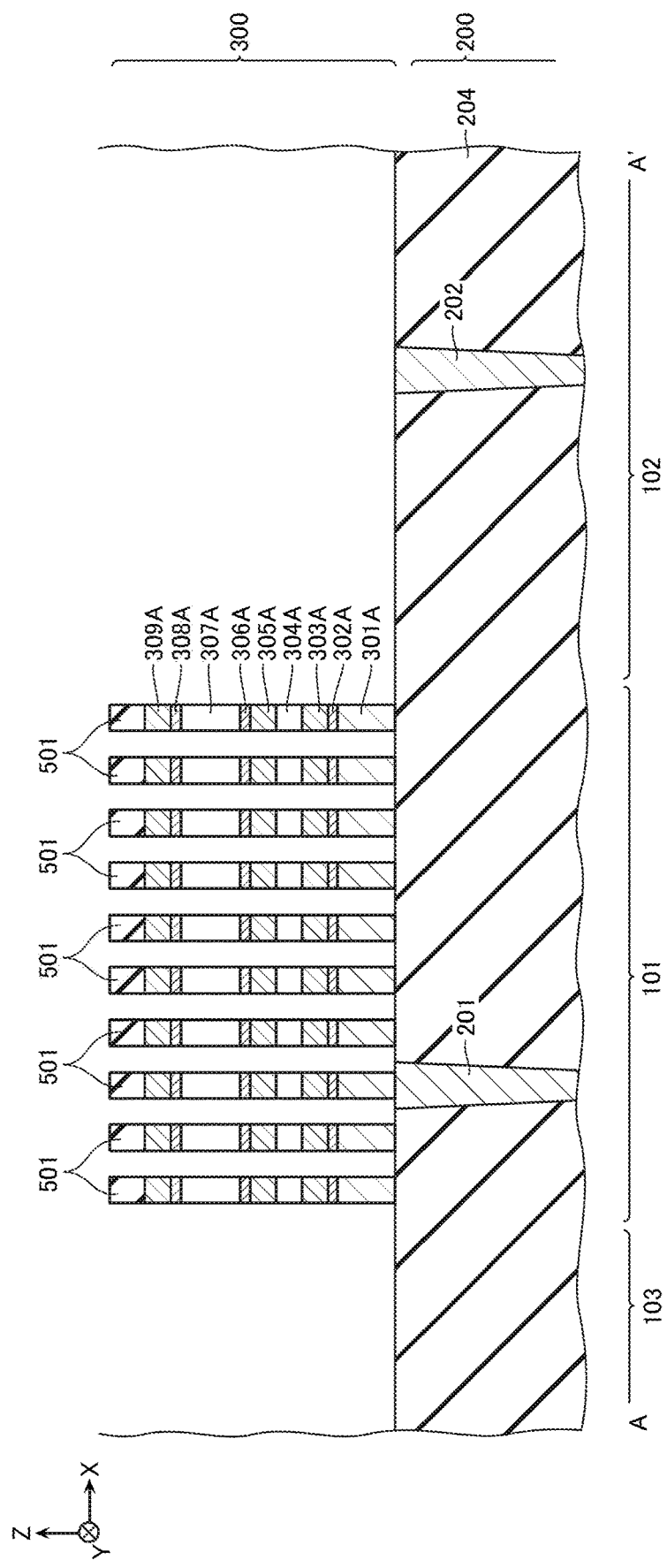
FIG. 76 is a schematic view illustrating a method of manufacturing a semiconductor memory device according to a comparative example.

Additionally, in the comparative example, for example, as illustrated in FIG. 76, a line and space pattern is formed only in the area 101 and the area 105. In this case, there may be a case where a line width of the line and space changes and the pattern breaks near an end portion in the X direction of the area 101. In this case, a characteristic of the memory cell MC formed near the end portion of the area 101 possibly changes.

Therefore, in the first embodiment, for example, in the process that has been described with reference to FIG. 16 to FIG. 18 and the like, the line and space pattern is formed in the area 101 and the area 105, near the area 101 and the area 105, and the like. Thus, by configuring the part where the pattern breaks outside of the area 101, the characteristics of the memory cells MC formed in the area 101 can be the same.

Second Embodiment

Figure 79:
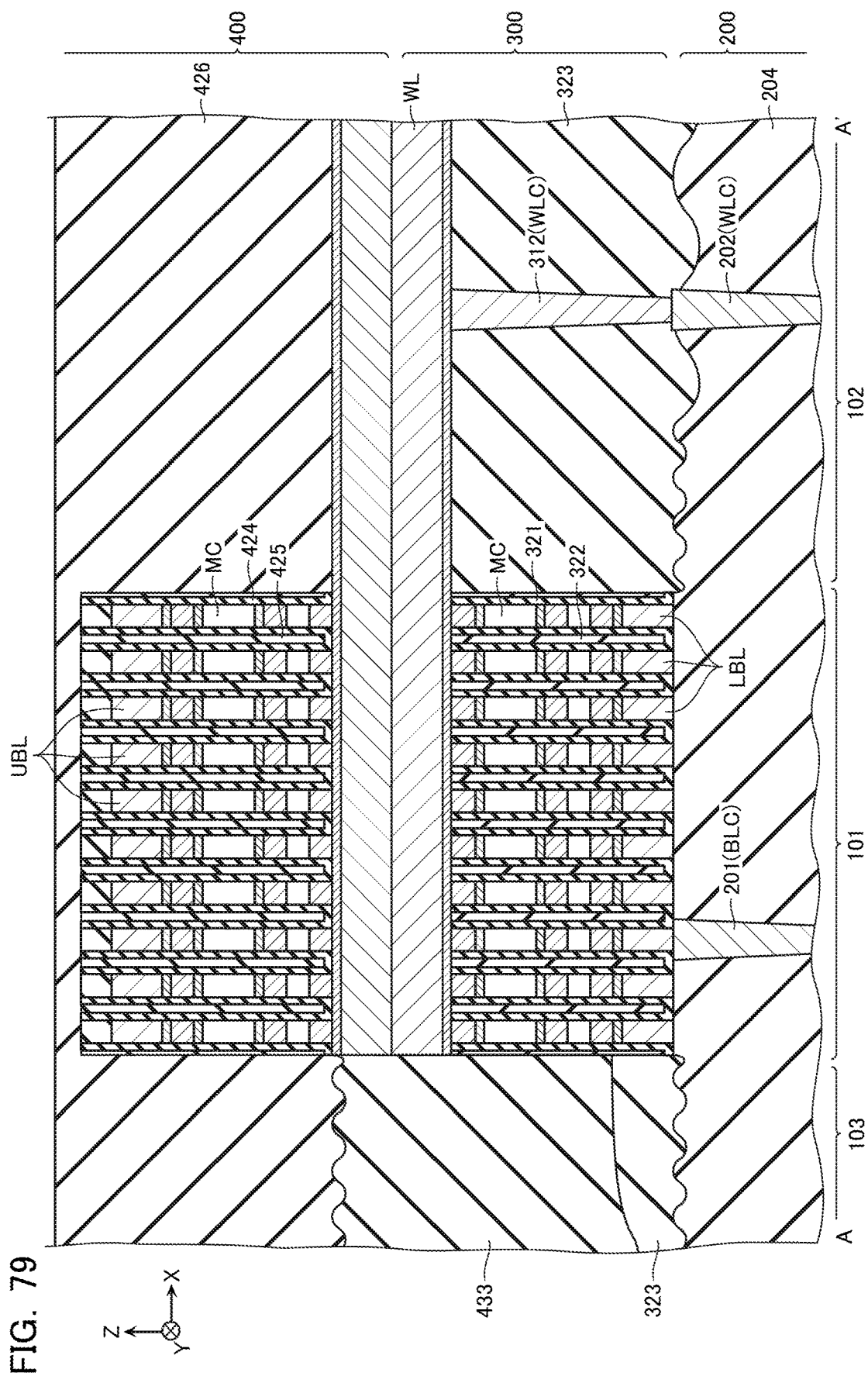
FIG. 79 is a schematic cross-sectional view illustrating a configuration of a part of a semiconductor memory device according to a second embodiment.
Figure 80:
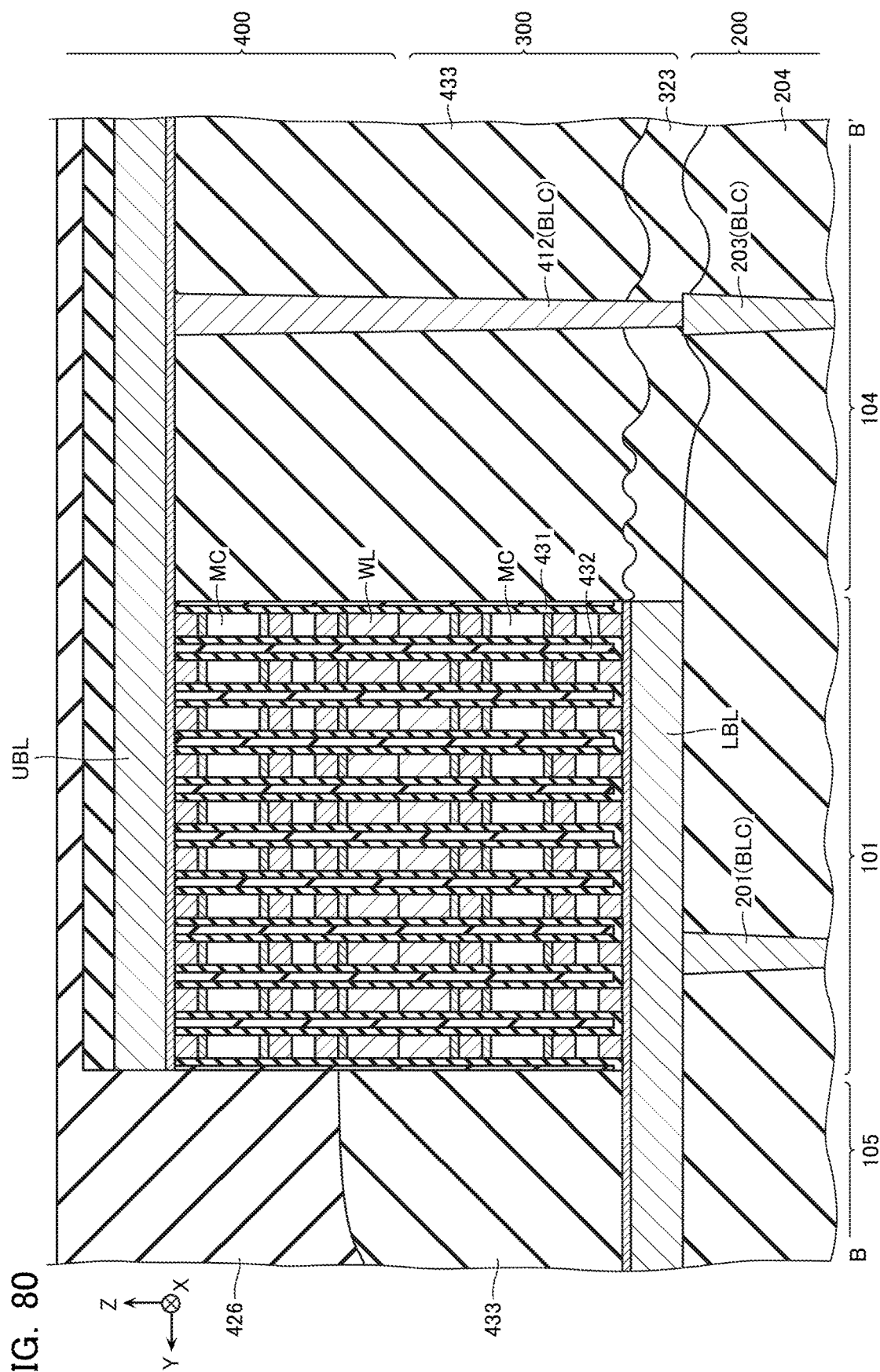
FIG. 80 is a schematic cross-sectional view illustrating a configuration of a part of the semiconductor memory device.

Next, a semiconductor memory device according to the second embodiment will be described with reference to FIG. 79 to FIG. 82. FIG. 79 is a schematic cross-sectional view illustrating a cross-sectional surface corresponding to FIG. 5 of the semiconductor memory device. FIG. 80 is a schematic cross-sectional view illustrating a cross-sectional surface corresponding to FIG. 6 of the semiconductor memory device.

As illustrated in FIG. 79 and FIG. 80, the semiconductor memory device according to the second embodiment is configured approximately similar to the semiconductor memory device according to the first embodiment.

However, for example, as illustrated in FIG. 80, in the embodiment, barrier insulating layers 431 and insulating layers 432 disposed between these configurations are disposed on side surfaces in the Y direction of the configurations of the memory layer 300 and the memory layer 400 in the area 101. The barrier insulating layer 431 contains, for example, silicon nitride (SiN). The insulating layer 432 contains, for example, silicon oxide ($SiO_2$).

Further, as illustrated in FIG. 79 and FIG. 80, the semiconductor memory device according to the embodiment does not include the insulating layer 326 or the insulating layer 423, and an insulating layer 433 is disposed in the part where the insulating layer 326 and the insulating layer 423 are disposed. The insulating layer 433 contains, for example, silicon oxide ($SiO_2$).

Figure 81:
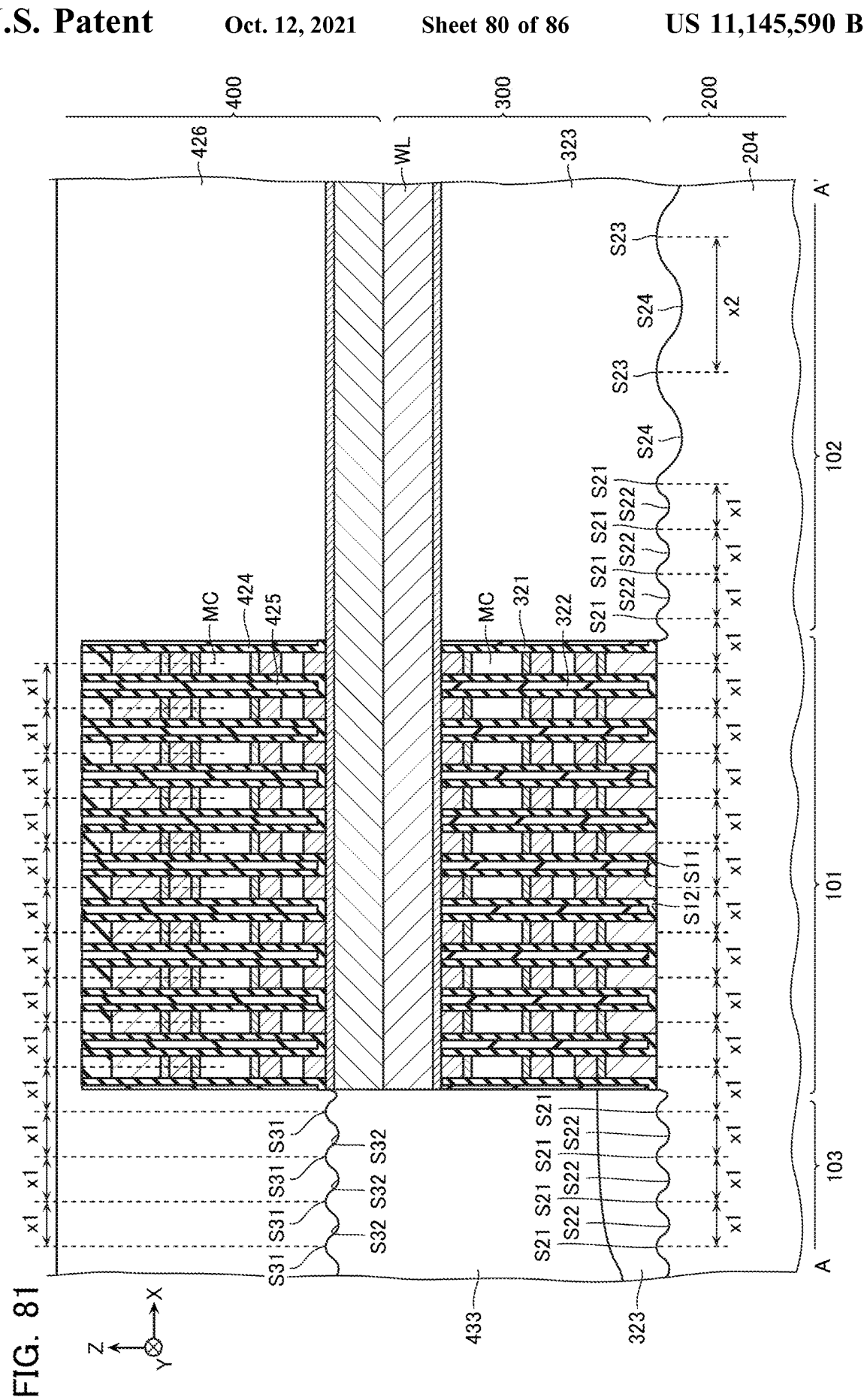
FIG. 81 is a schematic cross-sectional view illustrating a configuration of a part of the semiconductor memory device.
Figure 82:
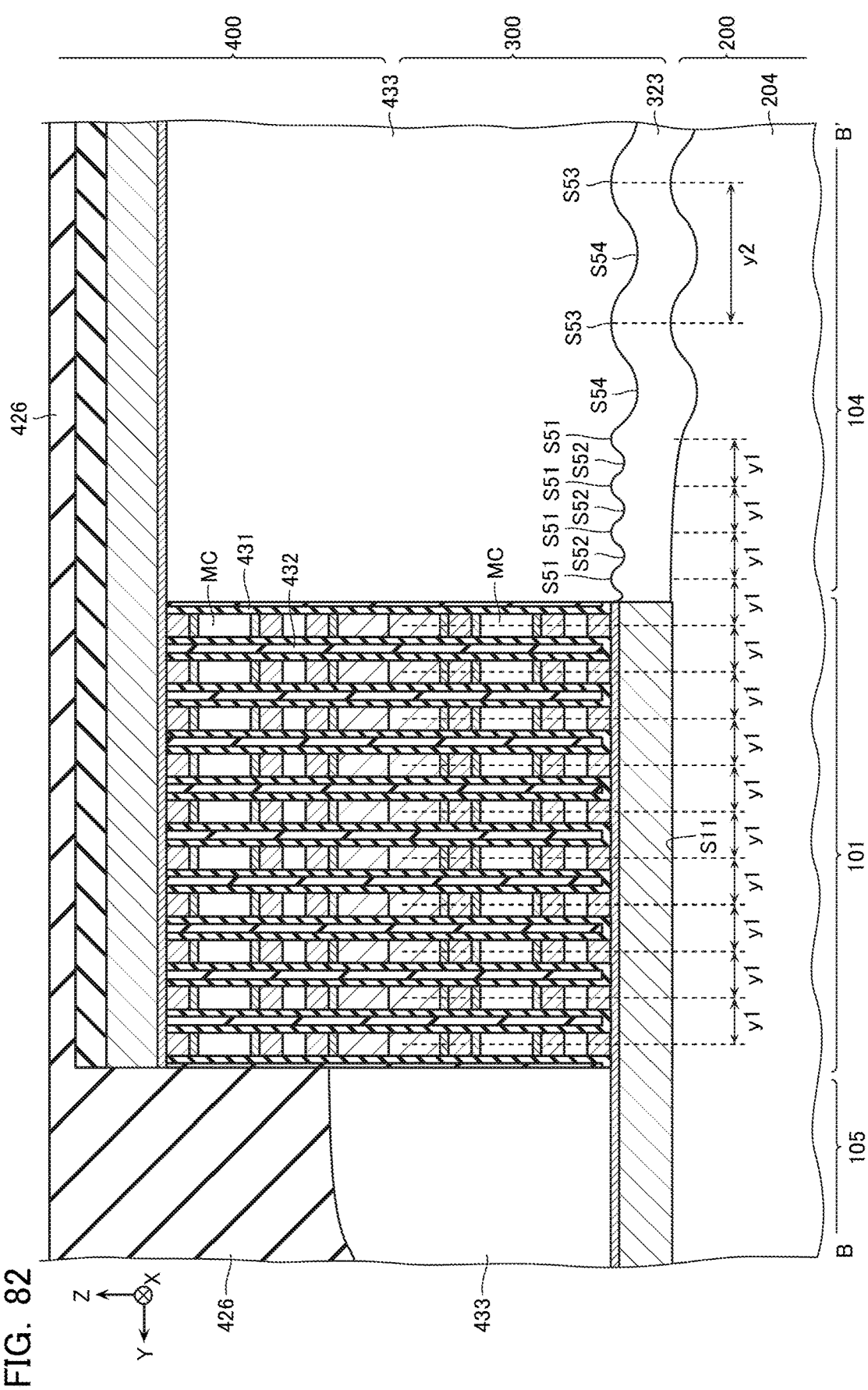
FIG. 82 is a schematic cross-sectional view illustrating a configuration of a part of the semiconductor memory device.

FIG. 81 is a schematic cross-sectional view corresponding to FIG. 79. FIG. 82 is a schematic cross-sectional view corresponding to FIG. 80. Note that, for convenience of explanation, FIG. 81 and FIG. 82 omit a part of the configuration.

As illustrated in FIG. 81 and FIG. 82, a top surface of the insulating layer 433 is configured similarly to the top surface of the insulating layer 423.

[Manufacturing Method]

Figure 83:
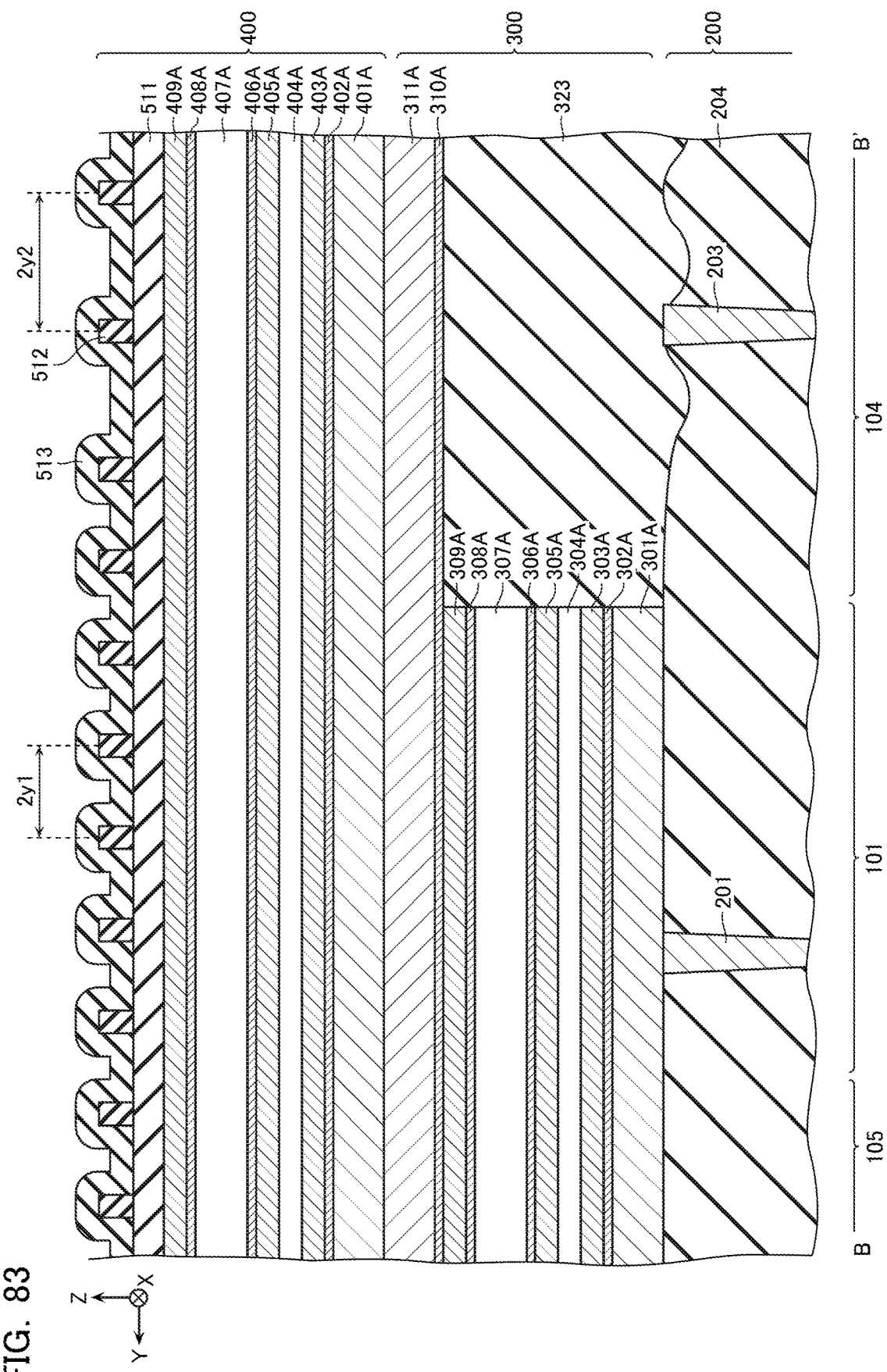
FIG. 83 is a schematic view illustrating a method of manufacturing the semiconductor memory device according to the second embodiment.
Figure 84:
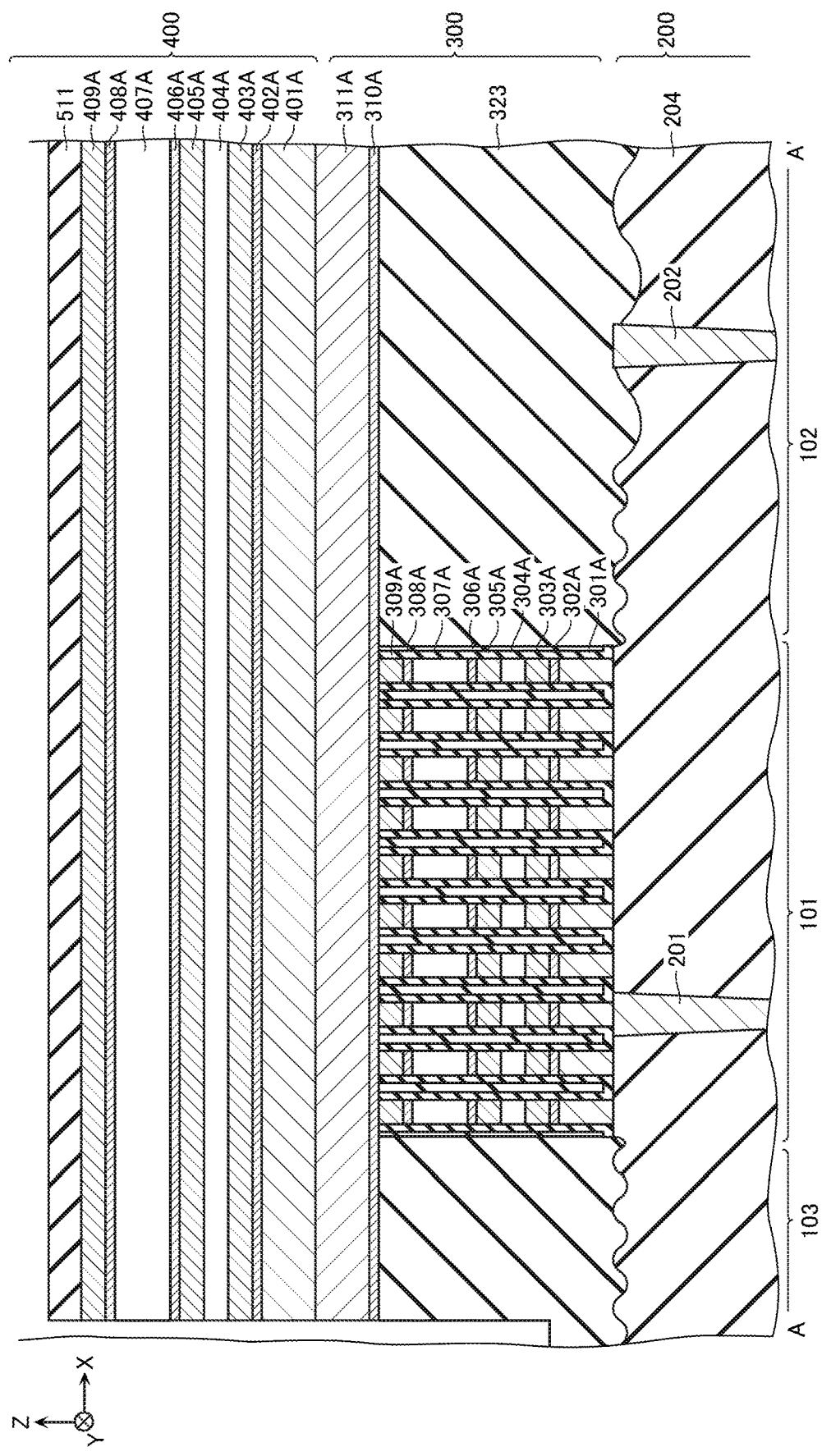
FIG. 84 is a schematic view illustrating the manufacturing method.
Figure 85:
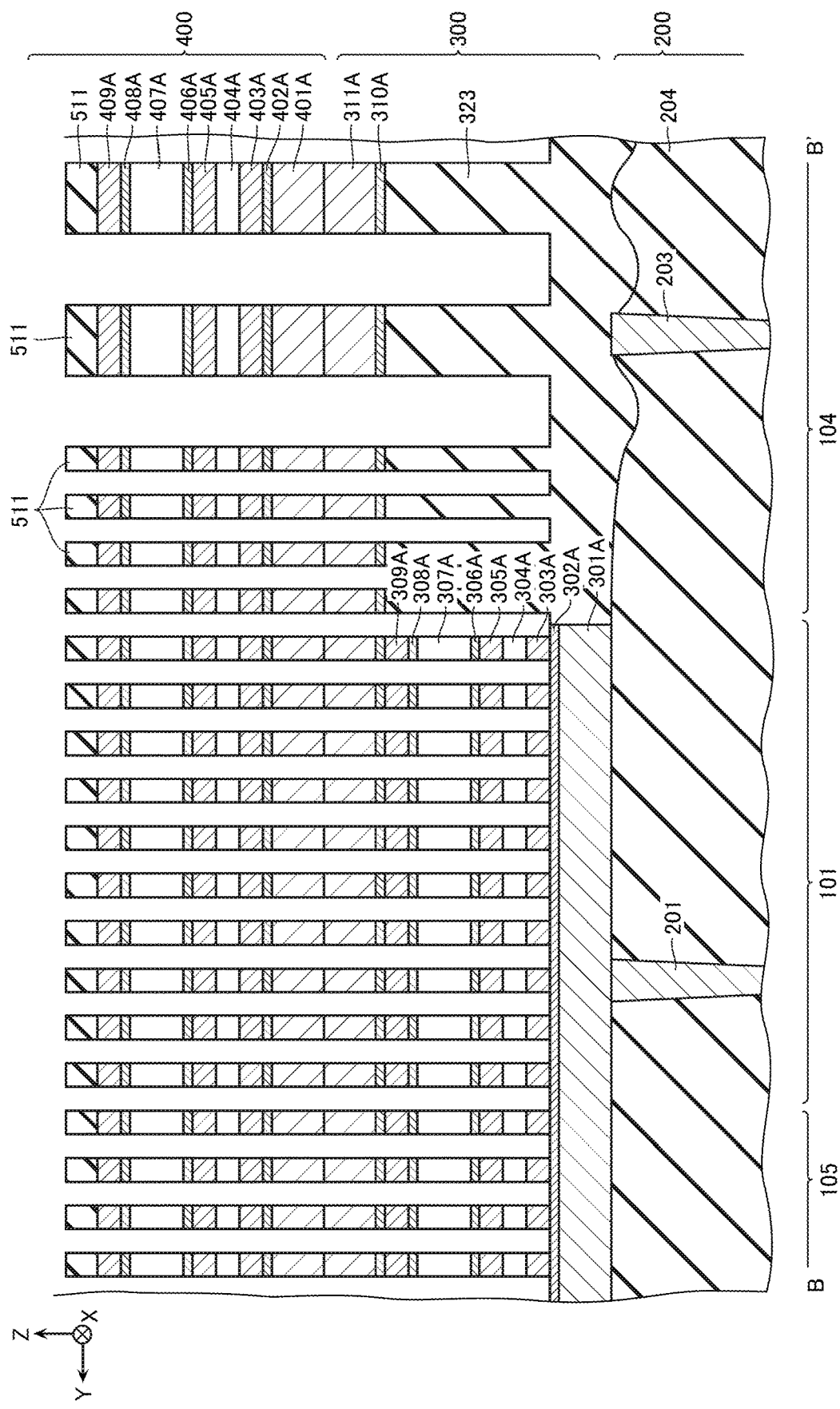
FIG. 85 is a schematic view illustrating the manufacturing method.
Figure 86:
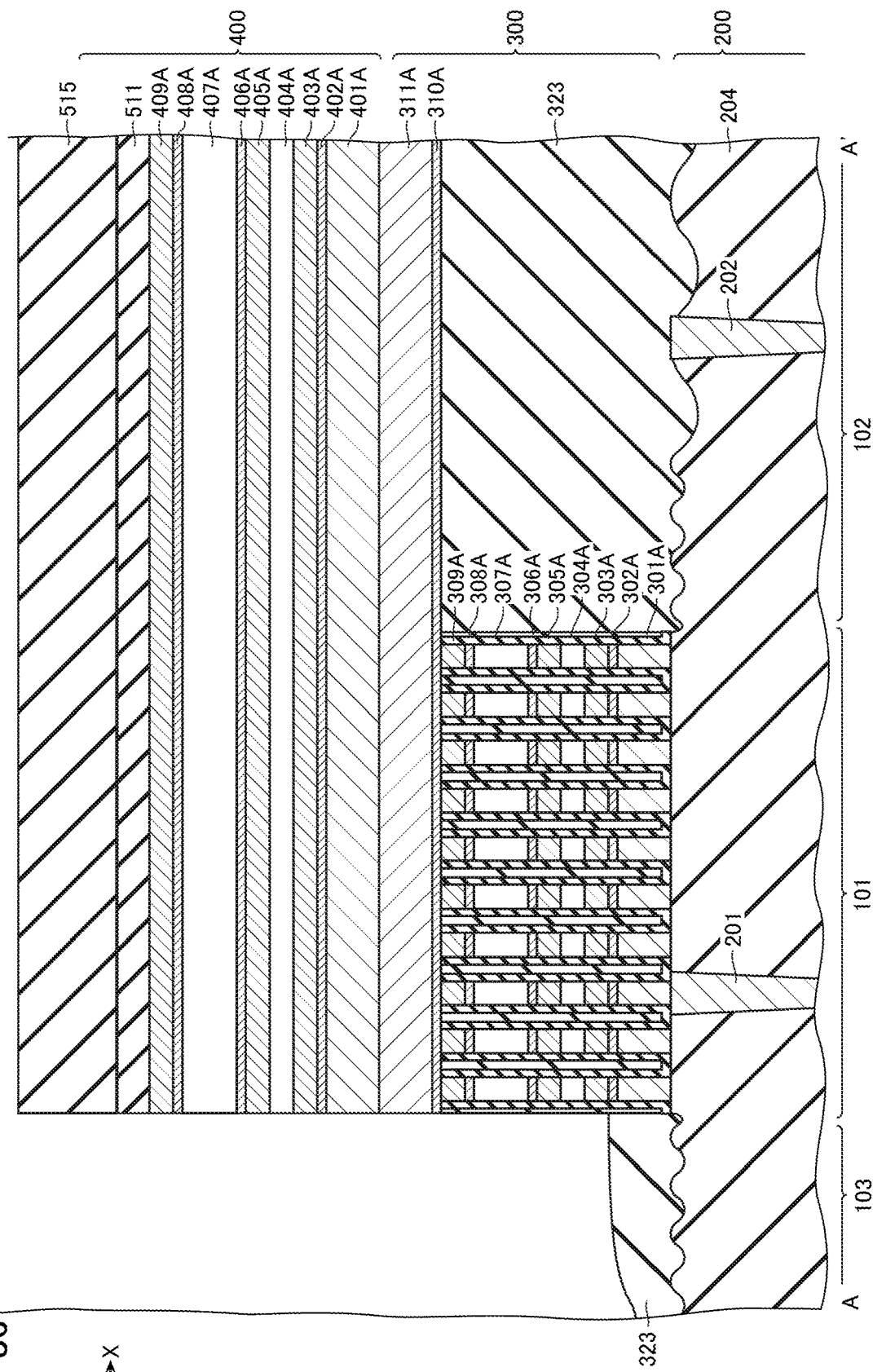
FIG. 86 is a schematic view illustrating the manufacturing method.
Figure 87:
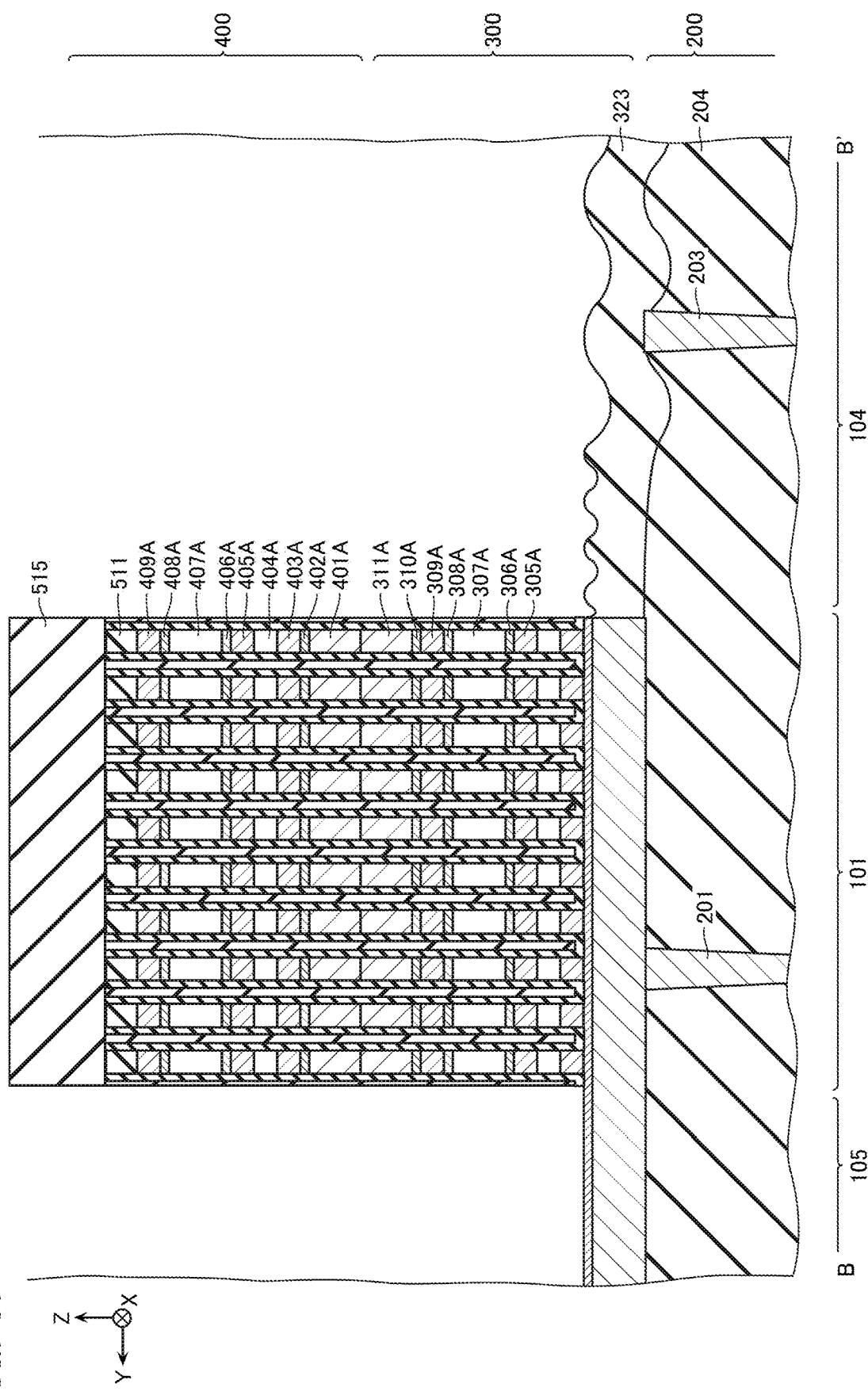
FIG. 87 is a schematic view illustrating the manufacturing method.

Next, the method of manufacturing the semiconductor memory device according to the embodiment will be described with reference to FIG. 83 to FIG. 87. FIG. 84 and FIG. 86 are schematic cross-sectional views corresponding to FIG. 79. FIG. 83, FIG. 85, and FIG. 87 are schematic cross-sectional views corresponding to FIG. 80.

To manufacture the semiconductor memory device according to the embodiment, for example, up to the process that has been described with reference to FIG. 29 and FIG. 30 is performed similarly to the first embodiment.

Next, for example, as illustrated in FIG. 83, a laminated body including the barrier conducting layer 310A, the conducting layer 311A, the conducting layer 401A, the barrier conducting layer 402A, the electrode layer 403A, the chalcogen layer 404A, the electrode layer 405A, the barrier conducting layer 406A, the chalcogen layer 407A, the barrier conducting layer 408A, the electrode layer 409A, and the hard mask layer 511 is formed on the top surfaces of the electrode layer 309A and the insulating layer 323. The process is performed by, for example, PVD, such as sputtering.

Next, for example, as illustrated in FIG. 31 and FIG. 83, the core materials 512 are formed on the top surface of the hard mask layer 511.

Next, for example, as illustrated in FIG. 83, the hard mask layer 513, such as silicon oxide ($SiO_2$), is formed on the top surface of the hard mask layer 511, the side surfaces of the core materials 512, and the top surfaces of the core materials 512.

Next, for example, as illustrated in FIG. 33, FIG. 84, and FIG. 85, the process similar to the process that has been described with reference to FIG. 12 to FIG. 18 is performed.

The process divides the electrode layer 303A, the chalcogen layer 304A, the electrode layer 305A, the barrier conducting layer 306A, the chalcogen layer 307A, the barrier conducting layer 308A, the electrode layer 309A, the barrier conducting layer 310A, the conducting layer 311A, the conducting layer 401A, the barrier conducting layer 402A, the electrode layer 403A, the chalcogen layer 404A, the electrode layer 405A, the barrier conducting layer 406A, the chalcogen layer 407A, the barrier conducting layer 408A, and the electrode layer 409A in the X direction and the Y direction.

Next, for example, as illustrated in FIG. 41, FIG. 86, and FIG. 87, the process similar to the process that has been described with reference to FIG. 19, FIG. 20, and FIG. 38 to FIG. 43 is performed.

Next, for example, similarly to the process that has been described with reference to FIG. 60, the insulating layer 433 is formed.

Thereafter, processes after the process that has been described with reference to FIG. 61 are performed. Thus, the configuration that has been described with reference to FIG. 79 and FIG. 80 is formed.

OTHER EMBODIMENTS

In the first embodiment and the second embodiment, in the process of forming the lower bit line LBL, the line and space pattern is formed in the area 101 and the area 105 and near the area 101 and the area 105 (a part of the area 102, a part of the area 103, and apart of the area 104), and the island-shaped pattern is formed in the area away from the area 101 and the area 105 (a part of the area 102, a part of the area 103, and a part of the area 104). However, these are merely examples and the specific patterns are appropriately adjustable. For example, the line and space pattern may be formed in all of the area 101 to the area 105. The same applies to the process of forming the upper bit lines UBL and the process of forming the word lines WL.

Additionally, in the first embodiment and the second embodiment, all line widths and intervals between the lines have the constant sizes in the line and space pattern. However, for example, in the area outside of the area 101, at least one of the line width and the interval between the lines may have a size different from the size in the area 101.

In the first embodiment and the second embodiment, the example in which, in the process that has been described with reference to FIG. 24 to FIG. 26, the protruding surfaces S21, S23, S43, and the like are formed in the part corresponding to the structure including, for example, the hard mask layers 501 of the insulating layer 204, and the recessed surfaces S22, S24, S44, and the like are formed in the part corresponding to the insulating layers 322 of the insulating layer 204 has been described. However, depending on a condition of the likes of RIE, it is conceivable that recessed surfaces are formed in the part corresponding to the structure including, for example, the hard mask layers 501 of the insulating layer 204, and the recessed surfaces are formed in the part corresponding to the insulating layer 322 of the insulating layer 204. The same applies to the process that has been described with reference to FIG. 41 to FIG. 43, the process that has been described with reference to FIG. 57 to FIG. 59, the process that has been described with reference to FIG. 73 to FIG. 75, and the like.

In the first embodiment and the second embodiment, the variable resistance elements VR are disposed above the nonlinear elements NO in both of the lower memory mat LMM and the upper memory mat UMM. However, for example, the variable resistance element VR may be disposed downward of the nonlinear element NO in at least one of the lower memory mat LMM and the upper memory mat UMM.

In the first embodiment and the second embodiment, the chalcogen layer 307 and the chalcogen layer 407 are employed as the variable resistance elements VR and the chalcogen layer 304 and the chalcogen layer 404 are employed as the nonlinear elements NO. However, for example, the variable resistance element VR may contain a metal oxide, such as a hafnium oxide (HfO), may contain a pair of magnetic layers and tunnel insulating films disposed between these layers, or may have another configuration. For example, the nonlinear elements NO may be a diode, may be a MIM junction or a MIS junction, or may be other nonlinear elements.

Additionally, in the first embodiment and the second embodiment, the word line contacts WLC are disposed in the area 102 but are not disposed in the area 103. However, the word line contacts WLC may be disposed in both of the area 102 and the area 103. Similarly, in the first embodiment and the second embodiment, the bit line contacts BLC are disposed in the area 104 but are not disposed in the area 105. However, the bit line contacts BLC may be disposed in both of the area 104 and the area 105.

OTHERS

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate that includes a first area, a second area, and a third area, the second area being adjacent to the first area in a first direction, the third area being adjacent to the first area in the first direction;
   a first insulating layer disposed in the first area, the second area, and the third area;
   a first wiring disposed on a surface of the first insulating layer in the first area;
   a first memory cell disposed on the first wiring;
   a second wiring disposed on the first memory cell and extending in the first direction; and
   a contact connected to the second wiring in the second area, the contact extending in a second direction intersecting with the substrate, wherein
   the surface of the first insulating layer includes:
      a plurality of first surfaces that are disposed in at least one of the second area and the third area and arranged in the first direction; and
      a plurality of second surfaces disposed between the plurality of first surfaces, wherein
   the plurality of second surfaces are close to the substrate compared with the plurality of first surfaces or far from the substrate compared with the plurality of first surfaces.

2. The semiconductor memory device according to claim 1, comprising:
   a plurality of the first wirings arranged in the first direction at a first pitch; and
   a plurality of the first memory cells arranged in the first direction at the first pitch, wherein
   the plurality of first surfaces include a plurality of third surfaces arranged in the first direction at the first pitch.

3. The semiconductor memory device according to claim 2, wherein
   the plurality of first surfaces include a plurality of fourth surfaces arranged at a second pitch in the first direction, and the second pitch is larger than the first pitch.

4. The semiconductor memory device according to claim 3, wherein
   the plurality of third surfaces are disposed between the plurality of first wirings and the plurality of fourth surfaces.

5. The semiconductor memory device according to claim 2, wherein
   the plurality of third surfaces are disposed between the plurality of first wirings and the contact.

6. The semiconductor memory device according to claim 1, comprising:
   a plurality of the first wirings arranged in the first direction at a first pitch; and
   a plurality of the first memory cells arranged in the first direction at the first pitch, wherein
   the plurality of first surfaces include a plurality of fourth surfaces arranged in the first direction at a second pitch, and the second pitch is larger than the first pitch.

7. The semiconductor memory device according to claim 1, wherein
   the plurality of first surfaces and the plurality of second surfaces are close to the substrate compared with the first wiring.

8. The semiconductor memory device according to claim 1, wherein
   the substrate includes a fourth area and a fifth area, the fourth area being adjacent to the first area in a third direction, the third direction intersecting with the first direction and the second direction, the fifth area being adjacent to the first area in the third direction; and
   the semiconductor memory device including a second insulating layer disposed in the fourth area and the fifth area, wherein
   a surface on a side, opposite to the substrate, of the second insulating layer includes:
      a plurality of fifth surfaces that are disposed in at least one of the fourth area and the fifth area and arranged in the first direction; and
      a plurality of sixth surfaces disposed between the plurality of fifth surfaces, wherein
   the plurality of sixth surfaces are close to the substrate compared with the plurality of fifth surfaces or far from the substrate compared with the plurality of fifth surfaces.

9. The semiconductor memory device according to claim 8, comprising:
   a plurality of the first memory cells arranged in the third direction at a third pitch; and
   a plurality of the second wirings arranged in the third direction at the third pitch, wherein
   the plurality of fifth surfaces include a plurality of seventh surfaces arranged in the third direction at the third pitch.

10. The semiconductor memory device according to claim 9, wherein
    the plurality of fifth surfaces include a plurality of eighth surfaces arranged in the third direction at a fourth pitch, and the fourth pitch is larger than the third pitch.

11. The semiconductor memory device according to claim 10, wherein
    the plurality of seventh surfaces are disposed between the plurality of second wirings and the plurality of eighth surfaces.

12. The semiconductor memory device according to claim 8, comprising:
    a plurality of the first memory cells arranged in the third direction at a third pitch; and
    a plurality of the second wirings arranged in the third direction at the third pitch, wherein
    the plurality of fifth surfaces include a plurality of eighth surfaces arranged in the third direction at a fourth pitch, and the fourth pitch is larger than the third pitch.

13. The semiconductor memory device according to claim 8, wherein
    the plurality of fifth surfaces and the plurality of sixth surfaces are close to the substrate compared with the second wiring.

14. The semiconductor memory device according to claim 1, comprising
    a third insulating layer disposed in the third area, wherein
    a surface on a side, opposite to the substrate, of the third insulating layer includes:
       a plurality of ninth surfaces arranged in the first direction; and
       a plurality of tenth surfaces disposed between the plurality of ninth surfaces, wherein
    the plurality of tenth surfaces are close to the substrate compared with the plurality of ninth surfaces or far from the substrate compared with the plurality of ninth surfaces.

15. The semiconductor memory device according to claim 14, comprising:

a third wiring disposed on the second wiring and extending in the first direction;

a second memory cell disposed on the third wiring; and a fourth wiring disposed on the second memory cell.

16. The semiconductor memory device according to claim 15, comprising:

a plurality of the second memory cells arranged in the first direction at a fifth pitch; and a plurality of the fourth wirings arranged in the first direction at the fifth pitch, wherein the plurality of ninth surfaces include a plurality of eleventh surfaces arranged in the first direction at the fifth pitch.

17. The semiconductor memory device according to claim 15, wherein the plurality of ninth surfaces and the plurality of tenth surfaces are close to the substrate compared with the surface on the side, opposite to the substrate, of the third wiring.

* * * * *